US006940582B1

(12) United States Patent
Tanaka

(10) Patent No.: US 6,940,582 B1
(45) Date of Patent: Sep. 6, 2005

(54) PARALLEL LINK MECHANISM, EXPOSURE SYSTEM AND METHOD OF MANUFACTURING THE SAME, AND METHOD OF MANUFACTURING DEVICES

(75) Inventor: Keiichi Tanaka, Funabashi (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/850,749

(22) PCT Filed: Sep. 20, 1999

(86) PCT No.: PCT/JP99/05102

§ 371 (c)(1),
(2), (4) Date: May 21, 2001

(87) PCT Pub. No.: WO01/22480

PCT Pub. Date: Mar. 29, 2001

(51) Int. Cl.[7] .................. G03B 27/42; G03B 27/58; G03B 27/62
(52) U.S. Cl. .................. 355/53; 355/72; 355/75
(58) Field of Search .................. 355/30, 53, 72–76; 310/10, 12; 378/34, 35; 414/935

(56) References Cited

U.S. PATENT DOCUMENTS

| | | | |
|---|---|---|---|
| 5,005,492 A | * 4/1991 | Ogino et al. | 108/145 |
| 5,203,199 A | 4/1993 | Henderson et al. | |
| 5,241,188 A | * 8/1993 | Mizutani | 250/548 |
| 5,545,962 A | 8/1996 | Wakui | 318/677 |
| 5,559,584 A | * 9/1996 | Miyaji et al. | 355/73 |
| 5,677,824 A | 10/1997 | Harashima et al. | |
| 5,746,138 A | * 5/1998 | Hirose | 108/145 |
| 5,969,876 A | * 10/1999 | Kreitzer et al. | 359/651 |
| 6,048,750 A | * 4/2000 | Hembree | 438/107 |
| 6,255,796 B1 | 7/2001 | Ebihara et al. | |
| 6,283,361 B1 | * 9/2001 | Maki et al. | 228/212 |
| 6,327,026 B1 | * 12/2001 | Wakui | 355/72 |
| 6,359,688 B2 | * 3/2002 | Akimoto et al. | 356/401 |
| 6,400,444 B2 | * 6/2002 | Suzuki | 355/68 |

FOREIGN PATENT DOCUMENTS

| | | |
|---|---|---|
| AT | 391 773 | 11/1990 |
| EP | 0 760 272 | 3/1997 |
| JP | 62226435 | 10/1987 |
| JP | 04250988 | 9/1992 |
| JP | 10-260277 | 9/1998 |
| JP | 11-274031 | 10/1999 |

* cited by examiner

*Primary Examiner*—Henry Hung Nguyen
(74) *Attorney, Agent, or Firm*—Oblon, Spivak, McClelland, Maier & Neustadt, P.C.

(57) ABSTRACT

A reticle base level block to support a reticle stage for holding a reticle, a wafer base level block to support a wafer stage for holding a wafer, and the like are supported to be independent of other portions and be controllable in their attitudes by parallel link mechanisms each including at least three expandable rods. Therefore, the portions supported by the parallel link mechanism can be made lightweight using the advantages of the parallel link mechanism, and the attitudes of those can be precisely controlled with excellent operational-characteristics and high rigidity. In addition, transmission of vibrations and the like between the reticle base level block, the wafer base level block and other portions, e.g. an optical projection system, can be prevented. Therefore, a fine pattern formed on the reticle can be precisely transferred onto the wafer.

53 Claims, 19 Drawing Sheets

PARALLEL LINK MECHANISM, EXPOSURE SYSTEM AND METHOD OF MANUFACTURING THE SAME, AND METHOD OF MANUFACTURING DEVICES

TECHNICAL FIELD

The present invention relates to a parallel link mechanism, an exposure apparatus and its making method, and a method of manufacturing a device and, more specifically, to a parallel link mechanism, a kind of mechanism, to employ at least three expandable rods and control the position/attitude of a movable object, an exposure apparatus employing the parallel link mechanism to control the attitude of at least one of a mask and a substrate and its making method, and a method of manufacturing a micro device (electronic device) by using the exposure apparatus.

BACKGROUND ART

In a lithography process for manufacturing a semiconductor element, liquid crystal display element, or the like, an exposure apparatus has been used. A reduction projection exposure apparatus (stepper), of a step-and-repeat method, which transfers a pattern formed on a mask or reticle (to be generically referred to as a "reticle" hereinafter) through a projection optical system onto a plurality of shot areas on a substrate such as a wafer or glass plate (to be referred to as a "wafer" hereinafter) in turn, and a moving-one-by-one type projection exposure apparatus (to be referred to as a "stepper" hereinafter as needed) such as a scanning projection exposure apparatus (scanning-stepper), of a step-and-scan method, which is obtained by improving the reduction projection exposure apparatus are mainly employed.

Important ones of the basic factors to determine the performance of the stepper are the resolution ability (resolution) and focus depth of the projection optical system (projection lens). It is because the resolution determines the finest pattern size that can be projected and imaged, i.e. the narrowest line width in practice (device rule). And its focus depth has to be as wide as possible because a processed wafer has steps formed thereon by forming and etching thin layers of oxide, metal, etc., and may be slightly deformed.

The resolution R and focus depth DOF of a projection lens is given by the following two equations as a general measure:

$$R = k1 \cdot \lambda / N.A. \quad (1)$$

$$DOF = k2 \cdot \lambda / (N.A.)^2 \quad (2)$$

Note that $\lambda$, N.A. and k1, k2 respectively represent the wavelength of light used for exposure, the numerical aperture of the projection optical system, and parameters determined by resist, etc.

An early stepper used a g-line ($\lambda$=436 nm) of an ultra-high pressure mercury lamp as exposure illumination light; its N.A. was about 0.3, and its resolution was about 1.2 um. As obvious in the above equation (1), the larger the N.A. is, the better the resolution is. With a larger N.A., however, the focus depth is decreased as obvious in the above equation (2).

Therefore, apparatuses for production of 16 Mbit DRAM and apparatuses for the later have achieved high resolution by using i-line ($\lambda$=365 nm) and a projection optical system of which N.A. is about 0.5, and also have achieved a practical focus depth. Because the i-line can be obtained from an ultra-high pressure mercury lamp like the g-line and can be used in the same way as earlier steppers in semiconductor manufacturing factories, the i-line steppers have been introduced as a production unit more smoothly than expected.

After that, in the period from the third generation of 64 Mbit DRAM to 245 Mbit DRAM where their device rules are equal to or less than 0.3 um, instead of the mercury lamp as a light source, the use of KrF excimer laser was examined, and the application of a phase shift reticle and modified illumination that can be applied by improving then current units was suggested.

While a KrF excimer laser ($\lambda$=248 nm) stepper uses a common basic body with a previous stepper using g-line or i-line, its optical system from the source to the projection optical system is different. That is, because using light of a shorter wavelength, usable optical materials are limited to quartz, fluorite, etc. In addition, because excimer laser light is pulse emission light and coherent unlike that of a mercury lamp, a special technology for the illumination system is necessary.

Because interference fringe induced by the coherency of the excimer laser affects the precision of line width of an exposure pattern, it is necessary to suppress the effects of the interference fringe by providing a vibrating mirror in the illumination optical system and making a light beam fluctuate finely. In a stepper with a lamp as its light source, accumulated exposure amount can be controlled by the open/close time of its shutter. Meanwhile, in a laser-light-source stepper using pulse emission, it is necessary to set the number of pulses per an exposure to be equal to or more than a certain number (referred to as a minimum exposure-pulse number) to compensate for energy fluctuation.

For 1 Gbit DRAM of the future where device rules will be equal to or less than 0.2 um, the use of ArF excimer laser ($\lambda$=193 nm), phase shift reticle and modified illumination technology is suggested. An ArF excimer laser stepper needs to have the optical path of its exposure light filled with nitrogen or the like because the exposure light is absorbed by oxygen.

To obtain even higher resolution and wider focus depth, light source of a shorter wavelength can be used leaving N.A. of the projection optical system as it is. Recently, reduction projection lithography using $F_2$ ($\lambda$= 157 nm) laser having a shorter wavelength than ArF excimer laser as its light source is presented by MIT Lincoln Lab., and is attracting a lot of attention. Because $F_2$ laser light is absorbed by oxygen like ArF excimer laser light, exposure needs to be performed in the atmosphere of $N_2$ or He.

Furthermore, to improve the precision of an exposure apparatus using light source of such a short wavelength, the precision of positioning of a reticle stage and wafer stage needs to be improved, and it is also necessary to suppress vibrations of units due to reaction caused by the drive of the stages as movable objects as much as possible and insulate floor vibrations.

Therefore, to realize highly precise exposure using such a short-wavelength light source as $F_2$ laser, it is necessary to control positioning, and suppressing or insulating vibrations more precisely than ever.

For example, as factors required of a scanning stepper that transfers the reticle pattern onto a plurality of shot areas on the wafer in turn according to a step-and-scan method by repeating a scanning exposure operation, in which a reticle pattern is transferred onto the wafer synchronously moving the reticle stage holding the reticle and the wafer stage holding the wafer in one dimensional direction, and a stepping-between-shots operation of the wafer stage, there are the following things: [1] The driving reactions of the stages do not transmit to the frame supporting the projection optical system; [2] It is easy to adjust relative position and attitude between each of the stages and the projection optical system; [3] The driving thrust and driving reaction are reduced by making the stages lightweight; [4] It is so structured that floor vibrations are prevented from transmitting to the stages and the projection optical system; [5] It is so structured that the stages and the projection optical system can be easily separated. [1] to [4] are required to realize precise exposure of a fine pattern, and [5] is required to improve easiness of its maintenance and reduce its down-time so that the productivity of a micro device is improved.

Also, there is a double wafer-stage scheme for realizing the high throughput where two wafer stages are mounted on the level block; while a wafer stage is performing exposure, the other performs alignment or the like and the two operations are alternately and continuously performed. Furthermore, a multi-exposure method such as a double exposure method where using two reticle stages each holding a reticle having a pattern different from the other formed thereon, those patterns are transferred in turn is effective for higher integration of semiconductor devices because it is possible to improve the resolution and focus depth. Note that to achieve a desirable effect in the double wafer-stage scheme and the multi-exposure method, the above factors [1] to [4] have to be satisfied as a premise, and that it is preferable to satisfy the above factor [5].

In addition, when performing exposure using light of a wave length shorter than or equal to $F_2$ laser light, [6] it is required that the stages, the projection optical system, and the like should be contained by a chamber so as to be enclosed in the atmosphere of $N_2$ or He.

Also, in a step-and-repeat type stepper, it is preferable to satisfy the above factors [1] to [6], not to mention.

Of the above factors [1] to [6], the factor [3] can be satisfied by adopting a planar motor or a cylinder-like linear motor as driving sources of the stages. Especially, when adopting the planar motor as a driving source of the wafer stage, the planar motor can drive the movable object in three degrees of freedom X, Y, θz by one motor, and therefore, X guide and Y guide of X-Y two dimensional arrangement that were previously indispensable are unnecessary. And when driving the stage holding the wafer in one direction of X-axis and Y-axis directions, a motor and a guide for driving the stage in the other direction need not be driven along with the stage, and therefore, the weight of the movable portion can be remarkably reduced. Therefore, it is attracting a lot of attention as a promising driving source of the wafer stage of an exposure apparatus in the future.

However, it is very difficult to satisfy the rest, [1], [2], [4], [5], [6], at the same time even if the planar motor is adopted as a driving source of the stage.

Meanwhile, as means of moving the movable portion in the six degrees of freedom regarding translation and rotation, a mechanism referred to as a steward-platform, a kind of parallel mechanism (also referred to as a parallel link mechanism) where a base portion and end-effecter are connected by a plurality of link chains each having more than two joints, is used in training and simulation of flying an air plane, and is attracting attention in the field of industrial robots.

The present invention is invented under such a circumstance and a first purpose of the present invention is to provide a parallel link mechanism that can realize the miniaturization/lightening and the improvement of the output at the same time.

Furthermore, a second purpose of the present invention is to provide an exposure apparatus that can precisely transfer a fine pattern onto a substrate and a method of making the exposure apparatus.

In addition, a third purpose of the present invention is to provide a method of manufacturing a highly integrated micro-device with high productivity.

DISCLOSURE OF INVENTION

Under the above circumstance, the inventors of the present invention have conducted studies to realize such an exposure apparatus as satisfies as many of the above factors ([1] to [6] as possible at the same time regardless of whether a planar motor is adopted as a stage driving source or not. And as a result, they have reached a conclusion that the objective can be achieved by leaving out a body (central column) that has been used in the previous exposure apparatuses, supporting respectively the reticle stage, the wafer stage, etc., to be dependent, and making it possible to control their positions/attitudes in six degrees of freedom to meet any requirement. With such a conclusion and further studies, they have thought of applying the above mechanism to the exposure apparatuses.

Then by elaborately examining the parallel mechanism (hereafter, referred to as a "parallel link mechanism"), it is found that although it can satisfy most of the factors, which the inventors intend, such as the movable portion being lightweight and having desirable operational-characteristics, high rigidity, and precision of positioning, there are some points to be improved because an oil cylinder is used as an active contrapostion in a steward-platform, representative of parallel mechanisms.

According to the first aspect of the present invention, there is provided a parallel link mechanism comprising a base member; at least three expandable rods each including a first axis member and a second axis member that can relatively move in their axis direction; expansion mechanisms that are arranged in the respective rods and expand/contract the respective rods each by relatively driving the first axis member and the second axis member in the axis direction, each of which comprises a shaft motor that comprises a cylindrical mover integrally arranged in one of the first axis member and the second axis member, and a columnar stator integrally arranged in the other of the first axis member and the second axis member, and that relatively drives the first axis member and the second axis member in the axis direction by using thrust generated by electromagnetic interaction between the first axis member and the second axis member.

With this shaft motor, because a columnar or cylindrical magnet is used in its mover side or stator side, magnetic flux (magnetic field) is generated radially and in all directions, and the exposure apparatus can have the whole magnetic flux in all directions contribute to the generation of a driving force by an electromagnetic or magnetic interaction. And then much larger thrust can be generated compared with an usual linear motor, etc. and it is possible to make it smaller than a hydraulic cylinder, etc. In this case, either stator can be used, a hollow column or a solid column.

Therefore, by using the parallel link mechanism according to the present invention that comprises expansion mechanisms that are arranged in the respective rods and each comprise the shaft motor, which comprises a cylindrical mover integrally arranged in one of the first axis member and the second axis member, and a columnar stator integrally arranged in the other of the first axis member and the second axis member, and relatively drives the first axis member and the second axis member in the axis direction by using thrust generated by electromagnetic interaction between the first axis member and the second axis member, the miniaturization and lightening, and the improvement of the output can be realized at the same time. The parallel link mechanism according to the present invention is preferably applied to exposure apparatuses.

In the parallel link mechanism according to the present invention, the expansion mechanism can comprise an air cylinder arranged in parallel or in series with the shaft motor. In such a case, the movable body can be driven coarsely and by larger distances by controlling the air pressure of the air cylinder, and also finely by the shaft motor. Also, in this case, it is possible to use the air cylinder to expand/contract each rod for controlling the position/attitude of the movable body, to use the shaft motor to suppress vibrations, and to use the air cylinder for suppressing low-frequency vibrations and the shaft motor for insulating high-frequency vibrations.

According to the second aspect of the present invention, there is provided an exposure apparatus, which transfers a predetermined pattern onto a substrate, comprising a exposure main portion for transferring the pattern; and a parallel link mechanism that supports at least a part of the exposure main portion in such a way that its attitude is controllable.

By using this, because a part of the exposure main portion that transfers a predetermined pattern onto a substrate is supported by the parallel link mechanism in such a way that its attitude is controllable, the part of the exposure main portion supported by the parallel link mechanism can be made lightweight by using the advantages of the parallel link mechanism and its attitude can be precisely controlled with desirable operational-characteristics and high rigidity. In addition, because the part of the exposure main portion can be supported to be independent of other portions by the parallel link mechanism, the transmission of vibrations, etc., can be prevented. Especially, in a case where a movable portion of a substrate stage or the like composing the exposure main portion is supported by the parallel link mechanism, such effects to others as vibrations due to the drive of the movable portion can be reduced. Therefore, by using the exposure main portion according to the present invention, a fine pattern can be precisely transferred onto a substrate.

In an exposure apparatus according to the present invention, the exposure main portion comprises a substrate stage to hold the substrate and it is possible to have the parallel link mechanism control the position/attitude in at least three degrees of freedom of the substrate stage. In such a case, because the parallel link mechanism controls the position/attitude in at least three degrees of freedom of the substrate stage, the substrate stage driven by the parallel link mechanism can be made lightweight and the position/attitude in at least three degrees of freedom of the substrate can be precisely controlled with desirable operational-characteristics and high rigidity.

In this case, the parallel link mechanism may comprise a first base member, at least three expandable first rods that link the first base member and the substrate stage, and first expansion mechanisms that are arranged in the respective first rods and expand/contract the respective first rods. In such a case, by expanding and contracting the respective rods by the first expansion mechanisms that are arranged in the respective first rods, the position/attitude, in at least three degrees of freedom (e.g. X, Y, $\theta z$), of the substrate stage can be precisely controlled with desirable operational-characteristics and high rigidity. In this case, because the substrate stage is driven by the parallel link mechanism, such a driver to drive the substrate stage as a linear motor, a stage base (wafer base level block) to support the wafer stage, and the like are unnecessary. Note that for controlling the position/attitude in six degrees of freedom of the substrate, it is necessary to provide a driving mechanism (e.g. Z-tilt mechanism), which drives the substrate in the other degrees of freedom (e.g. Z, $\theta x$, $\theta y$), and the like on the substrate stage.

In this case, it is preferable that the parallel link mechanism comprises six of the first rods and controls position/attitude, in six degrees of freedom, of the substrate stage by expansion/contraction of each first rod. In such a case, because the position/attitude, in the six degrees of freedom, of the substrate stage can be controlled by individual expansions/contractions of the six first rods of the parallel link mechanism, the above Z-tilt mechanism, etc., are unnecessary and therefore, it is possible to make the substrate stage, as the movable portion, more lightweight.

In an exposure apparatus according to the present invention, the first expansion mechanism may comprise an air cylinder and an electromagnetic linear motor that are arranged in parallel or in series with each other. In such a case, the substrate stage can be driven coarsely and by larger distances by controlling the air pressure of the air cylinder, and also finely by the electromagnetic linear motor, and it is possible to precisely control the position/attitude, in at least three degrees of freedom, of the substrate stage for a short time.

In an exposure apparatus according to the present invention, the exposure main portion may comprise a projection optical system that projects the pattern onto the substrate as well as the substrate stage the position/attitude of which, in at least three degrees of freedom, is controlled by at least three first rods. In this case, by individually expanding and contracting the first rods by the respective first expansion mechanisms and controlling the position/attitude, in at least three degrees of freedom, of the substrate stage, the relative position, in at least three degrees of freedom, between the projection optical system and the substrate stage can be precisely adjusted with desirable operational-characteristics and high rigidity.

In this case, the exposure main portion may further comprise a mask stage to hold the mask on which the pattern is formed and the parallel link mechanism may control the position/attitude in at least three degrees of freedom of the mask stage. In such a case, because the parallel link mechanism controls the position/attitude in at least three degrees of freedom of the mask stage, the mask stage driven by the parallel link mechanism can be made lightweight and the position/attitude in at least three degrees of freedom of the mask stage can be precisely controlled with desirable operational-characteristics and high rigidity and it is possible to adjust the relative position, in at least three degrees of freedom (e.g. X, Y, $\theta z$ or Z, $\theta x$, $\theta y$), between the mask stage and the projection optical system.

In this case, the parallel link mechanism may comprise a second base member, at least three expandable second rods that link the second base member and the mask stage, and second expansion mechanisms that are arranged in the respective second rods and expand/contract the respective second rods. In such a case, by expanding and contracting the respective rods by the second expansion mechanisms that are arranged in the respective second rods, the control of the position/attitude, in at least three degrees of freedom (e.g. X, Y, θz), of the mask stage and the adjustment of the relative position, in at least three degrees of freedom (e.g. X, Y, θz or Z, θx, θy), between the mask stage and the projection optical system can be precisely performed with desirable operational-characteristics and high rigidity. In this case, because the mask stage is driven by the parallel link mechanism, such a driver to drive the mask stage as a linear motor, a stage base to support the mask stage, and the like are unnecessary. Note that for controlling the position/attitude in six degrees of freedom of the mask, it is necessary to provide a driving mechanism (e.g. a Z-tilt mechanism or a planar motor) or the like which drives the mask in the other degrees of freedom (e.g. Z, θx, θy or Z, θx, θy), on the mask stage.

In this case, it is preferable that the parallel link mechanism comprises six of the second rods and controls the position/attitude, in six degrees of freedom, of the mask stage by expansion/contraction of each second rod. In such a case, because the position/attitude, in the six degrees of freedom, of the mask stage can be controlled by individual expansions/contractions of the six second rods of the parallel link mechanism, the above Z-tilt mechanism, planar motor, etc., are unnecessary, and therefore, it is possible to make the mask stage, as the movable portion, more lightweight.

In an exposure apparatus according to the present invention, in a case where the parallel link mechanism comprises at least three of the first rods expanded and contracted by the first expansion mechanisms to control the position/attitude of the substrate stage and at least three of the second rods expanded and contracted by the second expansion mechanisms to control the position/attitude of the mask stage, at least one of the first and second expansion mechanisms may comprise an air cylinder and an electromagnetic linear motor that are arranged in parallel or in series with each other. In such a case, at least one of the substrate stage and the mask stage can be driven coarsely and by larger distances by controlling the air pressure of the air cylinder, and also finely by the electromagnetic linear motor, and it is possible to precisely control the position/attitude, in at least three degrees of freedom, of at least one of the substrate stage and the mask stage and precisely adjust the relative position of at least one stage with respect to the projection optical system for a short time.

In this case, it is preferable that at least one of the first and second rods further comprises a bearing unit to support the mover of the electromagnetic linear motor with respect to its stator in a non-contact manner. In such a case, because friction that works as a non-linear component upon controlling the expansion/contraction of the rod having the bearing unit by the expansion mechanism can be avoided, the position/attitude, in three degrees of freedom, of at least one of the wafer stage and the mask stage can be more precisely controlled.

Note that in this case, either of a gas static pressure bearing unit and a magnetic bearing unit can be used as the bearing unit.

When a gas static pressure bearing unit is used as the bearing unit, it is preferable that a differential exhaust mechanism is arranged in its neighbor so that a gas supplied to the gas static pressure bearing unit does not contaminate the gas purity of the atmosphere inside the exposure apparatus.

In an exposure apparatus according to the present invention, the relative position between at least one of both the stages and the projection optical system may be statically adjusted by using the air cylinder, and also a controller to suppress vibrations by using the electromagnetic linear motor may be provided. In such a case, it is possible to adjust the relative position between at least one of both the stages and the projection optical system and suppress vibrations due to expansion/contraction of each rod.

An exposure apparatus according to the present invention may further comprise a controller that insulates high-frequency vibrations by controlling the current of the electromagnetic linear motor. In such a case, fine vibrations from the floor surface, high-frequency vibrations, can be insulated.

An exposure apparatus according to the present invention may further comprise a supporting mechanism that supports the projection optical system to be in a fixed state on the floor surface on which the exposure main portion is mounted. In such a case, by having the supporting mechanism support it to be fixed immediately after the initial adjustment of the projection optical system to take a desirable position and attitude, the relative positions, in at least three degrees of freedom, of both the stages with respect to the projection optical system can be adjusted because it is possible to control the positions/attitudes, in at least three degrees of freedom, of the substrate stage and the mask stage.

In an exposure apparatus according to the present invention, in a case where the parallel link mechanism comprises the first and second base members, at least three of the first rods expanded and contracted by the first expansion mechanisms, and at least three of the second rods expanded and contracted by the second expansion mechanisms, the parallel link mechanism may further comprise a third base member, at least three expandable third rods that link the third base member and the projection optical system, and third expansion mechanisms that are arranged in the respective third rods and expand/contract the respective third rods. In such a case, by individually controlling expansion mechanisms arranged in the respective third rods upon the initial adjustment of the projection optical system, the initial adjustment can be easily performed. After the initial adjustment, by keeping the lengths of the respective third rods by the third expansion mechanisms, the projection optical system can be supported and fixed to be in a desirable position and attitude. After that, the relative position, in at least three degrees of freedom, between each stage and the projection optical system is adjusted by controlling the position/attitude of each stage.

In this case, the third expansion mechanism may comprise an air cylinder. In such a case, the initial adjustment of the position/attitude of the projection optical system can be easily performed by adjusting the inside pressure of the air cylinder.

In an exposure apparatus according to the present invention, the first, second, and third base members may each be an individual member, or at least two of the first, second, and third base members may be one common member. That is, the first, second, and third base members may be one common member, or the first and second base members, the second and third base members, or the first and third base members may be one common member.

In an exposure apparatus according to the present invention, it is possible to have the exposure main portion comprise a mask stage to hold a mask on which the pattern is formed and to make the parallel link mechanism control the relative position, in three degrees of freedom, of the mask stage. In such a case, because the parallel link mechanism controls the position/attitude, in at least three degrees of freedom, of the mask stage, it is possible to make the mask stage driven by the parallel link mechanism lightweight and the position/attitude, in at least three degrees of freedom (e.g. X, Y, θz or Z, θx, θy), of the mask stage can be precisely controlled with desirable operational-characteristics and high rigidity. Note that when the exposure main portion comprises the projection optical system, it is possible to adjust the relative position, in at least three degrees of freedom, between the mask stage and the projection optical system.

In this case, the parallel link mechanism may comprise a base member, at least three expandable rods that link the base member and the mask stage, and expansion mechanisms that are arranged in the respective second rods and expand/contract the respective rods. In such a case, by expanding and contracting the respective rods by the expansion mechanisms that are arranged in the respective rods, the control of the position/attitude, in at least three degrees of freedom (e.g. X, Y, θz), of the mask stage can be precisely performed with desirable operational-characteristics and high rigidity. In this case, because the mask stage is driven by the parallel link mechanism, such a driver to drive the mask stage as a linear motor, a stage base to support the mask stage, and the like are unnecessary. Note that for controlling the position/attitude in six degrees of freedom of the mask, it is necessary to provide a driving mechanism (e.g. a Z-tilt mechanism), which drives the mask in the other degrees of freedom (e.g. Z, θx, θy), and the like on the mask stage.

In this case, it is preferable that the parallel link mechanism comprises six of the rods and controls the position/attitude, in six degrees of freedom, of the mask stage by expansion/contraction of each rod. In such a case, because the position/attitude, in the six degrees of freedom, of the mask stage can be controlled by individual expansions/contractions of the six rods of the parallel link mechanism, the above Z-tilt mechanism, planar motor, etc., are unnecessary, and therefore, it is possible to make the mask stage, as the movable portion, more lightweight.

In an exposure apparatus according to the present invention, it is possible to have the exposure main portion comprise a substrate stage to hold the substrate and a stage base to support the substrate stage in such a way that the substrate stage is movable, and to make the parallel link mechanism control relative position, in three degrees of freedom, of the first stage base. In such a case, by controlling the relative position, in three degrees of freedom, of the first stage base by the parallel link mechanism, the relative position, in three degrees of freedom (e.g. Z, θx, θy), of the substrate stage supported by the first stage base can be controlled. That is, without the Z-tilt mechanism mounted on the substrate stage, it is possible to perform a Z-tilt drive of the substrate, and therefore it is possible to make the substrate stage lightweight. In addition, it is possible to reduce driving force and driving reaction when driving the substrate stage on the first stage base by, e.g., a planar motor.

In this case, the parallel link mechanism may comprise a first base member, at least three expandable first rods that link the first base member and the first stage base, and first expansion mechanisms that are arranged in the respective first rods and expand/contract the respective first rods. In such a case, by individually expanding and contracting the respective first rods by the first expansion mechanisms that are arranged in the respective first rods, the position/attitude, in at least three degrees of freedom (e.g. Z, θx, θy), of the first stage base is controlled. As a result, the position/attitude, in at least three degrees of freedom, of the substrate stage can be precisely adjusted with desirable operational-characteristics and high rigidity.

In this case, the first expansion mechanism may comprise an air cylinder and an electromagnetic linear motor that are arranged in parallel or in series with each other. In such a case, the first stage base can be driven coarsely and by larger distances by controlling the air pressure of the air cylinder, and also finely by the electromagnetic linear motor, and as a result, it is possible to precisely control the position/attitude, in three degrees of freedom (e.g. Z, θx, θy), of the substrate stage for a short time.

In this case, in a case where the parallel link mechanism comprises a first base member, at least three expandable first rods that link the first base member and the first stage base, and first expansion mechanisms that are arranged in the respective first rods and expand/contract the respective first rods, the exposure main portion may further comprise the projection optical system that is supported independent from the first stage base and projects the pattern onto the substrate.

In such a case, as mentioned above, by individually expanding and contracting the respective first rods by the first expansion mechanisms, the position/attitude, in at least three degrees of freedom, of the substrate stage can be precisely controlled via the first stage base with desirable operational-characteristics and high rigidity. Therefore, as a result, the adjustment of the relative position, in at least three degrees of freedom (e.g. Z, θx, θy), between the projection optical system and the substrate, i.e. focus leveling control, can be precisely performed with desirable operational-characteristics and high rigidity. By making the substrate stage lightweight, it is possible to reduce driving force and driving reaction when driving the substrate stage on the first stage base by, e.g., a linear motor, and because the projection optical system is supported independent from the first stage base, the reaction to the drive of the substrate stage can be prevented from transmitting to the projection optical system. Also, it is easy to separate the substrate stage and the projection optical system.

In this case, the exposure apparatus may further comprise a position detector that is fixed on the projection optical system and detects the relative positional relation, in six degrees of freedom, between the substrate and the projection optical system. In such a case, because, as mentioned above, the reaction to the drive of the substrate stage can be prevented from transmitting to the projection optical system, it is possible to precisely detect the positional relationship, in six degrees of freedom, between the substrate and the projection optical system by the position detector fixed on the projection optical system.

When its exposure main portion comprises the substrate stage, the first stage base to support the substrate stage, and the projection optical system, an exposure apparatus according to the present invention may further comprise a supporting mechanism that supports the projection optical system to be in a fixed state on the floor surface on which the exposure main portion is mounted. In such a case, because the positions/attitudes, in three degrees of freedom, of the substrate stage is controllable, by initially adjusting the projection optical system to take a desirable position and attitude and having the supporting mechanism support it to be fixed after the initial adjustment, the positional relationship, in three degrees of freedom, between the substrate and the projection optical system can be adjusted.

In an exposure apparatus according to the present invention, the exposure main portion may comprise a mask stage to hold a mask on which the pattern is formed and a second stage base to support the mask stage to be movable as well as the substrate stage, the first stage base to support this, and the projection optical system, and the parallel link mechanism may also control the position/attitude, in three degrees of freedom, of the second stage base. In such a case, the reaction to the drive of the substrate stage can be prevented from transmitting to the projection optical system, and by the parallel link mechanism controlling the position/attitude, in three degrees of freedom, of the second stage base, it is possible to precisely adjust the relative position and attitude, in three degrees of freedom (e.g. Z, θx, θy), between the mask and the projection optical system with desirable operational-characteristics and high rigidity. That is, without the Z-tilt mechanism mounted between the mask stage and the second stage base or on the substrate stage, it is possible to perform a focus-leveling of the mask stage by using the parallel link mechanism, and therefore, the degradation of the pattern image due to the defocus of the mask can be prevented. Especially, when the object side of the projection optical system is non-telecentric, the positional deviation of the pattern image and the like due to the defocus of the mask can be prevented, too. By making the mask lightweight, it is possible to reduce driving force and driving reaction when driving it on the second stage base by, e.g., a linear motor and prevent the reaction from transmitting to the projection optical system. Also, it is easy to separate the mask stage and the projection optical system.

In the exposure apparatus according to the present invention, in a case where the parallel link mechanism controls the relative position, in three degrees of freedom, between the mask stage and the projection optical system by controlling the position/attitude, in three degrees of freedom, of the second stage base, a position detector that is fixed on the projection optical system and detects the relative positional relation, in six degrees of freedom, between the mask stage and the projection optical system may be arranged. In such a case, because, as mentioned above, the reactions to the drives of the substrate stage and mask stage are prevented from transmitting to the projection optical system, it is possible to precisely detect the relative positional relation, in six degrees of freedom, between the mask stage and the projection optical system by the position detector fixed on the projection optical system.

In this case, the position detector may be an interferometer and a mirror, for detecting relative position in degrees of freedom X, Y, θz, on which a measurement beam from the interferometer is made incident may be arranged on the mask stage, and a mirror, for detecting relative position in degrees of freedom Z, θx, θy, on which another measurement beam from the interferometer is made incident may be fixed on the second stage base.

In this case, in a case where the parallel link mechanism also controls the position/attitude, in three degrees of freedom, of the second stage base, the parallel link mechanism may comprise a second base member, at least three expandable second rods that link the second base member and the second stage base, and second expansion mechanisms that are arranged in the respective second rods and expand/contract the respective second rods. In such a case, as mentioned above, it is possible to precisely adjust the relative position between the substrate and the projection optical system with desirable operational-characteristics and high rigidity, and the reaction to the drive of the substrate stage can be prevented from transmitting to the projection optical system. In addition, by individually expanding and contracting the respective second rods by the second expansion mechanisms that are arranged in the respective second rods, the position/attitude, in at least three degrees of freedom, of the second stage base is controlled. As a result, the relative position, in at least three degrees of freedom (e.g. Z, θx, θy), between the mask and the projection optical system can be precisely adjusted with desirable operational-characteristics and high rigidity. By making the substrate stage and the mask stage lightweight, it is possible to reduce driving force and driving reaction and to structure the substrate stage, the mask stage, and the projection optical system such that they can be easily separated.

In this case, the parallel link mechanism may comprise a third base member, at least three expandable third rods that link the third base member and the projection optical system, and third expansion mechanisms that are arranged in the respective third rods and expand/contract the respective third rods. In such a case, upon the initial adjustment of the projection optical system, by individually controlling the expansion mechanisms that are arranged in the respective third rods, the initial adjustment can be easily performed. After the initial adjustment, by keeping the lengths of the respective third rods by the third expansion mechanisms, the projection optical system can be supported and fixed to be in a desirable position and attitude. After that, the relative position, in at least three degrees of freedom, between each stage and the projection optical system can be adjusted by controlling the position/attitude of each stage.

In this case, the third expansion mechanism may comprise an air cylinder. In such a case, the initial adjustment of the position/attitude of the projection optical system can be easily performed by adjusting the inside pressure of the air cylinder.

In an exposure apparatus according to the present invention, the first, second, and third base members, which are respectively connected to the first stage base, the second stage base, and the projection optical system respectively via the first, second, and third rods, may each be an individual member, or at least two of the first, second, and third base members may be one common member. That is, the first, second, and third base members may be one common member, or the first and second base members, the second and third base members, or the first and third base members may be one common member.

In an exposure apparatus according to the present invention, at least one of the first and second expansion mechanisms, which are respectively arranged in the first and second rods that respectively link the first and second stage bases with the first and second base members, may comprise an air cylinder and an electromagnetic linear motor that are arranged in parallel or in series with each other. In such a case, at least one of the first and second stage bases can be driven coarsely and by larger distances by controlling the air pressure of the air cylinder, and also finely by the electromagnetic linear motor, and as a result, it is possible to precisely control the position/attitude, in three degrees of freedom (e.g. Z, θx, θy), of at least one of the substrate stage and mask stage, and then precisely adjust the relative position and attitude, in three degrees of freedom (e.g. Z, θx, θy), of at least one of the substrate and mask with respect to the projection optical system, for a short time. That adjustment is a so-called focus-leveling.

In this case, it is preferable that at least one of the first and second rods further comprises a bearing unit that supports the mover of the electromagnetic linear motor with respect to its stator in non-contact manner. In such a case, because friction that works as a non-linear component upon controlling the expansion/contraction of the rod having the bearing unit by the expansion mechanism can be avoided, the position/attitude, in three degrees of freedom, of at least one of the wafer stage and the mask stage can be more precisely controlled via at least one of the first and second stage bases.

Note that in this case, either of a gas static pressure bearing unit and a magnetic bearing unit can be used as the bearing unit.

When a gas static pressure bearing unit is used as the bearing unit, it is preferable that a differential exhaust mechanism is arranged in its neighbor so that a gas supplied to the gas static pressure bearing unit does not contaminate the gas purity of the atmosphere inside the exposure apparatus.

In an exposure apparatus according to the present invention, the relative position between at least one of both the stages and the projection optical system may be statically adjusted by using the air cylinder, and also a controller to suppress vibrations by using the electromagnetic linear motor may be provided. In such a case, it is possible to adjust the relative position between at least one of both the stages and the projection optical system via at least one of the first and second stage bases and suppress vibrations due to expansion/contraction of each rod.

An exposure apparatus according to the present invention may further comprise a controller that insulates high-frequency vibrations by controlling the current of the electromagnetic linear motor while low-frequency vibrations are suppressed by the control of the air pressure of the air cylinder. In such a case, low-frequency vibrations generated in each stage base due to the reaction to its drive are suppressed, and besides, fine vibrations from the floor surface, high-frequency vibrations, can be insulated.

In an exposure apparatus according to the present invention, a plurality of stages may be mounted on at least one of the first and second stage bases. For example, in a case where a plurality of stages, i.e. substrate stages, are mounted on the first stage base, because exchange of substrates, detection of alignment marks of a substrate, or the like on another substrate stage can be performed during exposure for a substrate on one substrate stage, the throughput can be improved compared with the case of a single substrate stage. Furthermore, for example, in a case where a plurality of stages, i.e. mask stages, are mounted on the second stage base, because the exchange of masks is performed by exchanging the positions of the mask stages, it is possible to perform multi-exposure such as double exposure using a plurality of masks with a higher throughput. Especially, in a case where a plurality of the substrate stages and mask stages are provided, because exchange of substrates, detection of alignment marks of a substrate or the like on another substrate stage can be performed during multi-exposure for a substrate on one substrate stage, multi-exposure such as double exposure using a plurality of masks can be performed with a higher throughput.

In an exposure apparatus according to the present invention, the exposure main portion may comprise a mask stage to hold the mask on which the pattern is formed and a stage base to support the mask stage in such a way that the mask stage is movable, and the parallel link mechanism may control the position/attitude, in three degrees of freedom, of the stage base. In such a case, by the parallel link mechanism controlling the position/attitude, in three degrees of freedom, of the stage base, the position/attitude, in three degrees of freedom, of the mask can be precisely adjusted with desirable operational-characteristics and high rigidity. By making the mask stage lightweight, it is possible to reduce driving force and driving reaction when driving it on the stage base by, e.g., a linear motor.

In this case, the parallel link mechanism may comprise a base member, at least three expandable rods that link the base member and the stage base, and expansion mechanisms that are arranged in the respective rods and expand/contract the respective rods. In such a case, it is possible to precisely adjust the relative position, in at least three degrees of freedom (e.g. Z, θx, θy), of the mask stage with desirable operational-characteristics and high rigidity by individually expanding and contracting the respective rods by the expansion mechanisms that are arranged in the respective rods and controlling the position/attitude, in at least three degrees of freedom, of the stage base. Also, by making the mask stage lightweight, it is possible to reduce driving force and driving reaction of each stage.

An exposure apparatus according to the present invention may comprise a chamber to contain at least one part of the exposure main portion in a state where it is sealed from the outside atmosphere and its attitude is allowed to change. In such a case, it is possible to make a part of the exposure main portion, which is supported by the parallel link mechanism, lightweight by using the advantages of the parallel link mechanism, and its attitude can be precisely controlled with desirable operational-characteristics and high rigidity. Furthermore, because the chamber contains at least one part of the exposure main portion in a state where it is sealed from the outside atmosphere and its attitude is allowed to change, by filling the chamber with nitrogen gas ($N_2$), helium gas (He) or the like it is possible to transfer a fine pattern onto a substrate with high resolution using ArF excimer laser light or vacuum ultraviolet light such as $F_2$ laser light, whose wavelength is shorter than ArF light.

In this case, it is preferable that a vacuum exhaust system and a gas supply system to purge non-active gas into the chamber are arranged in the exposure apparatus. In such a case, by having a gas inside the chamber exhausted by a vacuum exhaust system and having a non-active gas such as nitrogen gas ($N_2$) and helium gas (He) supplied by a gas supply system, the gas inside the chamber is replaced by the non-active gas at once and the inside pressure is set to be at a desirable value.

In a case where the exposure main portion comprises the substrate stage and the first stage base to support it, the projection optical system, the mask stage and the second stage to support it, and the parallel link mechanism to adjust the positions/attitudes, in three degrees of freedom, of the first and second stage bases, an exposure apparatus according to the present invention may further comprise a chamber that comprises a first room to contain the mask stage and include the second stage base as a part, a second room to contain the projection optical system, a third room to contain the substrate stag and include the first stage base as a part, and expandable, bellows-members, which respectively link the first room and the second room, and the second room and the third room, and seals the substrate stage, the optical projection system, and the mask stage from the outside atmosphere. In such a case, the third room, which includes the first stage base as a part, contains the substrate stag; a second room contains the projection optical system; a first room, which includes the second stage base as a part, contains the mask stage; and expandable, bellows-members link the first room, the second room, and the third room. Therefore, it is possible to adjust the positions/attitudes, in three degrees of freedom, of the first and second stage bases by the parallel link mechanism without any problem. Also, the substrate stage, the optical projection system, and the mask stage are sealed from the outside atmosphere. Therefore, by filling the inside of the chamber with nitrogen gas ($N_2$), helium gas (He) or the like, it is possible to transfer a fine pattern onto a substrate with high resolution using ArF excimer laser light or vacuum ultraviolet light such as $F_2$ laser light, whose wavelength is shorter than ArF light.

In this case, it is preferable that a vacuum exhaust system and a gas supply system to purge non-active gas into the chamber are arranged in the exposure apparatus. In such a case, by having a gas inside the chamber exhausted by a vacuum exhaust system and having a non-active gas such as nitrogen gas ($N_2$) and helium gas (He) supplied by a gas supply system, the gas inside the chamber is replaced by the non-active gas at once and the inside pressure is set to be at a desirable value.

According to the third aspect of the present invention, there is provided a first method of making an exposure apparatus to transfer a pattern of a mask onto a substrate, comprising a first step of providing an mask stage to hold the mask; a second step of providing an optical projection system to transfer a pattern of the mask onto a substrate; a third step of providing a substrate stage to hold the substrate; and a fourth step of providing a parallel link mechanism to support at least one of the mask stage and the substrate stage in such a way that relative position, at least three degrees of freedom, of at least one of the mask stage and the substrate stage with respect to the optical projection system.

According to this, by assembling and adjusting the illumination optical system, the projection optical system, the mask stage and substrate stage, the parallel link mechanism to support at least one of the mask stage and the substrate stage in such a way that relative position, at least three degrees of freedom, of at least one of the mask stage and the substrate stage with respect to the optical projection system are controllable, and other various elements mechanically, optically, and electrically, an exposure apparatus according to the present invention can be made.

According to the fourth aspect of the present invention, there is provided a second method of making an exposure apparatus to transfer a pattern of a mask onto a substrate, comprising a first step of providing an mask stage to hold the mask; a second step of providing an optical projection system to transfer a pattern of the mask onto a substrate; a third step of providing a substrate stage to hold the substrate; a fourth step of providing a first stage base to support the mask stage to be movable; a fifth step of providing a second stage base to support the substrate stage to be movable; and a sixth step of providing a parallel link mechanism to support at least one of the first and second stage bases in such a way that relative position, at least three degrees of freedom, of at least one of the first and second stage bases with respect to the optical projection system is controllable.

According to this, by assembling and adjusting the illumination optical system, the projection optical system, the mask stage and substrate stage, the first stage base to support the substrate stage to be movable, the second stage base to support the mask stage to be movable, the parallel link mechanism to support at least one of the first and second stage bases in such a way that relative position, at least three degrees of freedom, of at least one of the first and second stage bases with respect to the optical projection system is controllable, and other various elements mechanically, optically, and electrically, an exposure apparatus according to the present invention can be made.

In addition, in the lithography process, by performing exposure using an exposure apparatus according to the present invention, it is possible to form a multi-layer pattern on the substrate with high precision of superposition, and therefore it is possible to manufacture a more highly integrated micro device with high yield. Therefore, another aspect of the present invention is a method of manufacturing a device using an exposure apparatus according to the present invention.

BEST MODE FOR CARRYING OUT THE INVENTION

A First Embodiment

A first embodiment of the present invention will be described below with referring to FIGS. 1 to 8.

Figure 1:
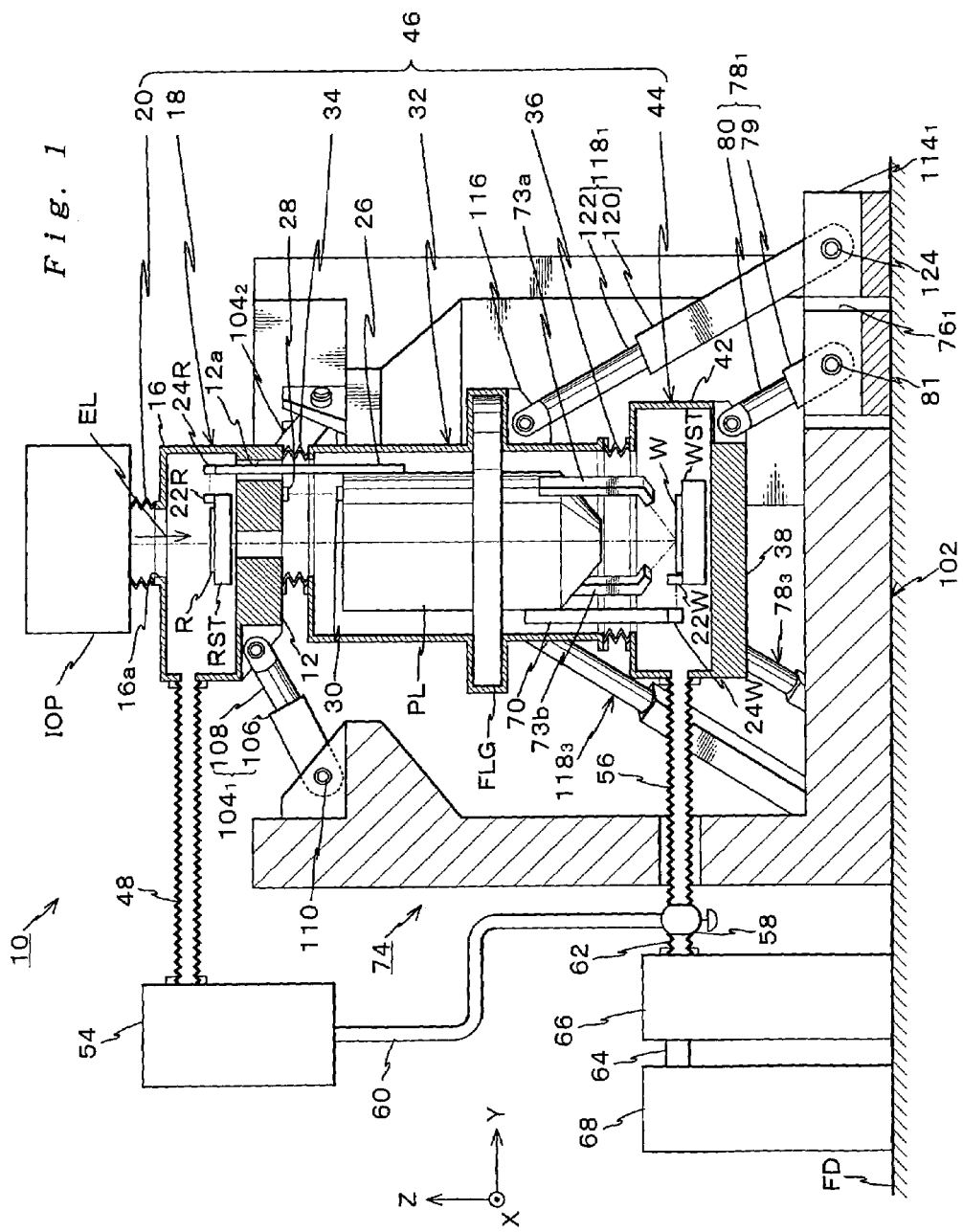
FIG. 1 is a schematic view showing the arrangement of an exposure apparatus according to the first embodiment.

FIG. 1 shows the schematic arrangement of an exposure apparatus 10 according to an embodiment. The exposure apparatus 10 is a so-called step-and-scan type scanning exposure apparatus that while illuminating the reticle R as a mask with exposure illumination light EL that is vacuum-ultraviolet, synchronously moves reticle R and wafer W as a substrate in a scanning direction (hereafter, defined to be Y-direction that is the lateral direction in FIG. 1) and transfers a pattern on the reticle R onto a plurality of shot areas on the wafer W through a projection optical system PL. This exposure apparatus 10 is a so-called scanning stepper.

This exposure apparatus 10 includes an illumination optical system IOP that illuminates the reticle R with the exposure illumination light EL from a light source (not shown), a reticle stage RST serving as a mask stage for holding the reticle, a projection optical system PL for projecting the exposure illumination light EL sent out from the reticle R onto a wafer W, and a wafer stage WST serving as a substrate stage for holding and moving the wafer W in X-Y two dimensional direction.

The above illumination optical system IOP is supported by an illumination-system supporting member (not shown). This illumination optical system IOP includes an illumination-system housing that makes the inside airtight from the atmosphere and is filled with a low-absorbing gas, which is so clean and non-active as to include a few or less than a few percent concentration of air (oxygen), or desirably less than one percent, and low in the absorption of light having the wavelength of vacuum ultraviolet, such as dry nitrogen ($N_2$), helium (He), argon (Ar), neon (Ne), and krypton (Kr) or a gas in which those gases are mixed. This is because, in the case of using light having the wavelength of vacuum ultraviolet as exposure illumination light, a gas (hereafter, referred to as an "absorptive gas" as the need arises) such as oxygen, steam, and hydrocarbon or related gas, which greatly absorbs light having such a wavelength, has to be removed from the optical path. The inside of the illumination system housing is filled with the non-active gas mentioned above (hereafter, referred to as a "low absorptive gas" as the need arises) and kept to have a one to ten percent higher pressure than the air.

The illumination system housing houses, as disclosed in, for example, Japanese Patent Laid-Open No. 7-142354 and U.S. Pat. No. 5,534,970 corresponding thereto, etc., a beam reshaping system, a fly-eye lens as an optical integrator, a vibration mirror, a collective lens system, a relay lens, a reticle blind mechanism, a main condenser-lens system, etc. in a predetermined arrangement. The above disclosures are incorporated herein by this reference as long as the national laws in designated states or elected states, to which this international application is applied, permit.

At the backside of the FIG. 1 of the illumination optical system IOP, a fret optical system including an optical system for optical axis adjustment that is called a beam matching unit is connected with at least one portion of the illumination optical system IOP, and via the fret optical system a light source (not shown) arranged on a floor surface FD is connected. As this light source, for example, a light source to emit light, of which the wavelength is in the rang of about 120 nm to about 180 nm and belongs to vacuum ultraviolet region, such as fluorine laser of 157 nm as the oscillation wavelength ($F_2$ laser), krypton dimer laser of 146 nm ($Kr_2$ laser) and argon dimer laser of 126 nm ($Ar_2$ laser) is employed. Note that ArF excimer laser, etc., can also be used as the light source. A light source controller (not shown) is connected with this light source and controls the oscillation center wavelength of a pulse ultraviolet light emitted from the source, the trigger of the pulse oscillation, a gas inside the laser chamber, etc.

A slit-like illumination area on the reticle R that is defined by a fixed reticle blind (fixed field stop) is illuminated with uniform illuminance by the illumination optical system IOP. In this case, the slit-like illumination area is set to be in the center of a circular projection field of the projection optical system PL shown in FIG. 1 and extend in the X-direction (non-scanning direction) with the width in Y-direction (scanning direction) being almost constant.

Incidentally, this light source could be installed in a utility space provided on the floor of a room (service room), having lower cleanness than a clean room, or the clean room.

The above reticle stage RST is levitated above the upper surface of a reticle base level block 12, having a triangle shape in a planar view and serving as a second stage-base, with a predetermined clearance, for example, of about 5 um via a non-contact bearing (not shown; for example an air-pad). This reticle stage RST is scanned in the Y-direction, the scanning direction, within a predetermined stroke range and can be finely moved on a horizontal plane (X-Y plane) by a reticle driver 14 (not shown in FIG. 1; refer to FIG. 8) including a linear motor, etc. The reticle R is fixed on this reticle stage RST by vacuum chucking or electrostatic chucking.

On the upper surface of the reticle base level block 12, a bulkhead 16 having a rectangular opening 16a, which is reduced in size from the reticle R, formed thereon is provided. And this bulkhead 16 and the reticle stage base 12 compose a reticle room 18 as a first room to house the reticle stage. The bulkhead 16 is made of a material, which does not emit a large amount of gas, such as stainless (SUS). The upper end of the bulkhead 16 is connected to the emitting end of the illumination system housing by bellows-like member 20 such that its inside is sealed from the outside air, the member 20 being expandable and being made of fluorine rubber that is a chemically clean material.

On the emitting end of the illumination system housing, a transmission window (not shown) is arranged such that it seals the inside space of the illumination system housing from that of the reticle room 18. This transmission window is arranged in the optical path of exposure illumination light EL that is incident on reticle R from the illumination optical system IOP, thereby being made of a crystal material, which has high transmittance against vacuum ultraviolet as exposure illumination light, such as fluorite.

On the reticle base level block 12, a rectangular opening, in the cross-sectional view, that is the path of the exposure illumination light EL having passed the reticle R is formed. On the reticle base level block 12, an opening 12a, which is vertically penetrating and has a supporting member for a reticle laser interferometer (described later) inserted therein, is also formed. Incidentally, the supporting mechanism and the like of the reticle base level block 12 will be described later.

The position of the reticle stage RST in the X-Y plane (X position, Y position, and rotation around Z-axis (θz rotation)) is measured with a predetermined resolution, for example about 0.5 to 1 nm, via a movable mirror 22R fixed on the reticle stage RST by the reticle laser interferometer 24R. In practice, on the reticle stage RST, a X-movable-mirror having a reflection surface perpendicular to the X-direction and a Y-movable-mirror having a reflection surface perpendicular to the Y-direction are arranged, and two reticle interferometers $24Ry_1$, $24Ry_2$ for measuring the position in the Y-direction and a interferometer 24Rx for measuring the position in the X-direction are arranged (refer to FIG. 8). In FIG. 1, those are representatively shown by the movable mirror 22R and the reticle laser interferometer 24R.

The bottom ends of the reticle laser interferometer 24R, that is, interferometers $24Ry_1$, $24Ry_2$, 24Rx are fixed on the upper portion of the lens-barrel of the projection optical system PL, and the upper ends of those are respectively fixed via the opening 12a and similar openings (not shown) to the upper ends of three supporting members 26 that are exposed on the reticle base level block 12.

Figure 8:
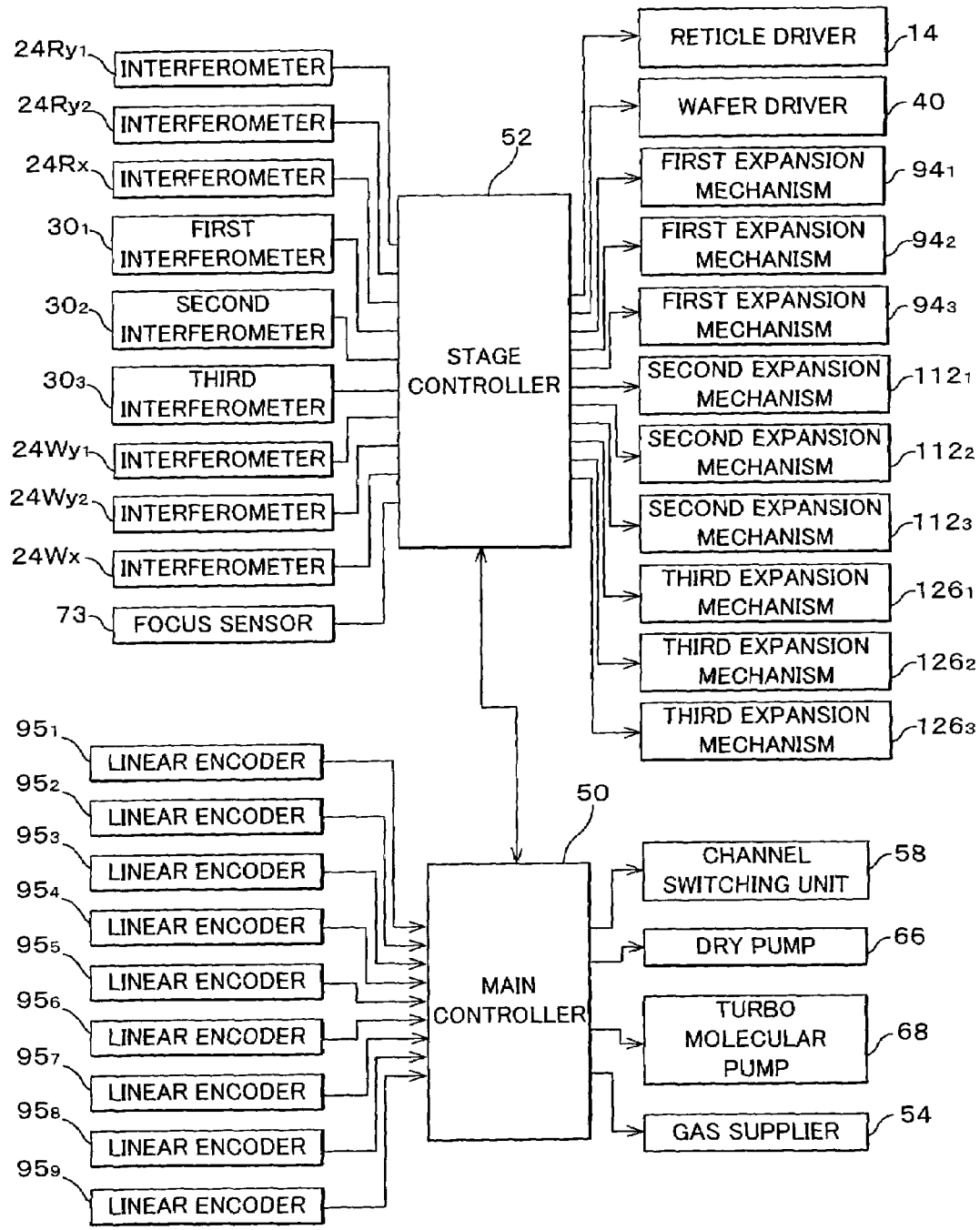
FIG. 8 is a block diagram showing the structure of a control system of an exposure apparatus according to the first embodiment.

The measurement values of the reticle laser interferometer 24R, that is, interferometers $24Ry_1$, $24Ry_2$, 24Rx are supplied to the stage controller 52 and then to the main controller 50 (refer to FIG. 8). In the stage controller 52, according to the average of the measurement values of the interferometers $24Ry_1$, $24Ry_2$ the Y position of the reticle stage RST is calculated, according to the difference of those measurement values and the distances between the axes of the interferometers the θz rotation is calculated, and according to the average of the measurement values of the interferometers 24Rx the X position of the reticle stage RST is calculated. The stage controller 52 reports those results of the calculations to the main controller 50 in real time.

Furthermore, a reflection mirror 28 is fixed to the bottom surface of the reticle base level block 12 and a reticle base interferometer 30 to measure the Z position of the reflection mirror 28 is disposed on a predetermined position around the periphery of the upper end of the projection optical system PL. Incidentally, in practice, on the bottom surface of the reticle base level block 12, reflection mirrors are fixed to three different position, and a first interferometer $30_1$, a second interferometer $30_2$, and a third interferometer $30_3$ are respectively arranged on three positions around the periphery of the upper end of the projection optical system corresponding to the three mirrors (refer to FIG. 8). In FIG. 1, those are representatively shown by a reflection mirror 28 and a reticle base interferometer 30. The first interferometer $30_1$, the second interferometer $30_2$, and the third interferometer $30_3$ respectively measure the Z positions of three reflection mirrors. The measurement values of these three interferometer $30_1$, $30_2$, and $30_3$ are supplied to the stage controller 52 and then the main controller. The stage controller 52 calculates the Z position, θx rotation (pitching), and θy rotation (rolling) by performing a predetermined computing on the basis of the measurement values of the three interferometer $30_1$, $30_2$, and $30_3$. These results are reported from the stage controller 52 to the main control 50 in real time.

In the projection optical system PL, an optical system comprising a lens and a reflection mirror made of fluoride crystal such as fluorite and lithium fluoride is supported by the lens-barrel. In this embodiment, as this projection optical system PL, a reduction system is employed which has, for example, a circular image field and of which the object plane side and image plane side are both telecentric and the reduction magnification β is, e.g. ¼ or ⅕. As this projection optical system, although a refraction optical system may be used which is composed of only lenses made of fluoride crystal, in this embodiment a reflection/refraction-type projection optical system (catadioptric system) is employed. By using an scanning exposure apparatus comprising such a reflection/refraction-type projection optical system, it is possible to precisely transfer a fine pattern of about 100 nm L/S pattern onto wafers even with $F_2$ laser light having, for example, the wavelength of 157 nm as exposure light. Note that an optical system composed of only reflection optical elements may be used as the projection optical system.

As the reflection/refraction-type projection optical system, a reflection/refraction system comprising a beam splitter and a concave mirror as reflection optical elements, which is disclosed in, for example, Japanese Patent Laid-Open No. 8-171054 and U.S. Pat. No. 5,668,672 corresponding thereto, and Japanese Patent Laid-Open No. 10-20195 and U.S. Pat. No. 5,835,275 corresponding thereto, can be used, or a reflection/refraction system comprising not a beam splitter but a concave mirror, etc., as reflection optical elements, which is disclosed in Japanese Patent Laid-Open No. 8-334695 and U.S. Pat. No. 5,689,377 corresponding thereto, and Japanese Patent Laid-Open No. 10-3039 and U.S. Pat. No. 873,605 (application date: Jun. 12, 1997) corresponding thereto, can be employed. The disclosures in the above Japanese Patent Laid-Opens, U.S. patent, and U.S. patent application are incorporated herein by this reference as long as the national laws in designated states or elected states, to which this international application is applied, permit.

As the reflection/refraction-type projection optical system, also a reflection/refraction system can be employed which comprises a plurality of refraction optical elements and two mirrors (a main mirror being a concave mirror and a sub-mirror that is a back surface mirror of which the reflection surface is formed on the opposite side to the incident surface of a refraction element or plane parallel plate) that are disposed along one axis and has the intermediate image of a reticle pattern again imaged on a wafer using the main mirror and sub-mirror, and is disclosed in Japanese Patent Laid-Open No. 10-104513 and U.S. Pat. No. 5,488,229 corresponding thereto. In this reflection/refraction system, the main mirror and sub-mirror are disposed in series with the plurality of refraction optical elements, and an illumination light passes through a portion of the main mirror, is reflected by the sub-mirror and the main mirror in turn, passes through a portion of the sub-mirror and reaches the wafer. The disclosures in the above Japanese Patent Laid-Opens and U.S. patent are incorporated herein by this reference as long as the national laws in designated states or elected states, to which this international application is applied, permit.

In this embodiment, as described above, as a projection optical system, because the reduction optical system of the reduction magnification β, e.g. ¼ or ⅕, is employed, when the reticle R is illuminated with the exposure illumination light EL from the illumination optical system IOP, the reduced image (partially inverted image) of a circuit pattern in the slit-like illumination area on the reticle is formed on the exposure area, conjugate with the slit-like illumination area, on the wafer.

Like the present embodiment, in a exposure apparatus using a exposure wavelength of vacuum ultraviolet, also a gas inside the lens-barrel of the projection optical system PL has to be replaced by the above non-active gas (low absorptive gas) to avoid the absorption of the exposure illumination light by a absorptive gas such as oxygen. Therefore, in the present embodiment, the inside of the lens-barrel of the projection optical system PL is filled with the above non-active gas, and the pressure of the inside is set to be at the predetermined value. The method in which the gas inside the lens-barrel of this projection optical system PL is replaced with the above non-active gas will be described later.

On a position somewhat below the center, in the vertical direction, of the lens-barrel of the projection optical system PL, a flange FLG is provided. The whole lens-barrel including the flange FLG is covered by a bulkhead made of a material, which does not emit a large amount of gas, such as stainless (SUS), and a lens room 32 serving as a second room to accommodate the projection optical system PL is formed by this bulkhead. In a portion of the ceiling of the bulkhead forming the lens room 32, an opening is formed, and the outside of the opening is connected to the reticle base level block 12 through an expandable bellows-like member 34, which is made of fluorine-contained rubber, in the state where the inside is sealed from the atmosphere. Moreover, in the bottom wall of the bulkhead forming the lens room 32, an opening, which is the path for the exposure illumination light EL projected from the projection optical system PL to the wafer W, is formed. The outside of the opening is connected to a bulkhead forming a wafer room (described later) through an expandable bellows-like member 36, which is made of fluorine-contained rubber, in the state where the inside is sealed from the atmosphere.

On a wafer base level block 38 that is triangle, in a planar view, and serves as a first stage base, the above wafer stage WST is freely driven in the X-Y plane by a wafer driver 40 (not shown in FIG. 1; refer to FIG. 8) composed of a magnetic-levitation-type two-dimensional linear actuator (planar motor) that is disclosed in, for example, U.S. Pat. No. 519,745, etc. The disclosure in the above U.S. patent is incorporated herein by this reference as long as the national laws in designated states or elected states, to which this international application is applied, permit.

The wafer W is fixed on this wafer stage WST by vacuum chucking or electrostatic chucking (both are not shown).

A bulkhead 42 on which an opening of a predetermined shape is formed is arranged on the wafer base level block 38 and a wafer room 44 serving as a third room to accommodate the wafer stage WST is formed by the bulkhead 42 and the wafer base level block 38. The bulkhead 42 is made of a material, which does not emit a large amount of gas, such as stainless (SUS). Furthermore, as described above, the upper end of the bulkhead 42 is connected to the bottom end of the lens room 32a through the expandable bellows-like member 36 in the state where the inside is sealed from the atmosphere. The supporting mechanism, etc., of the wafer base level block will be described later.

In the present embodiment, a chamber 46 isolating the wafer stage WST, the projection optical system PL, and the reticle stage RST from the atmosphere is composed of the reticle base level block 12 and the bulkhead 18 that compose the reticle room 18, a bulkhead composing the lens room 32, the wafer base level block 38 and the bulkhead 42 that compose the wafer room 44, the bellows-like member 36 connecting the lens room 32 and the reticle room 18, and the bellows-like member 20 connecting the reticle room 18 and the illumination optical system IOP (refer to FIG. 1). Like the present embodiment, in the case of employing light having a wavelength in ultraviolet region as the exposure illumination light, the above absorptive gas such as oxygen has to be removed from the optical path. Therefore, the inside of the chamber 46, that is, the reticle room 18, the lens room 32, and the wafer room 44 is filled with a low absorptive gas, for example helium, to set the inside pressure at a predetermined value.

This will be elaborated below. One end of a first pipe 48 made of a flexible tube is connected to the bulkhead 16 of the reticle room 18 composing the chamber 46 and the other end of the first pipe 48 is connected to the discharge opening of a helium gas supplier (hereafter, referred to as a "gas supplier") 54, and the one end of a second pipe 56 made of a flexible tube is connected to the bulkhead of the wafer room 44 composing the chamber 46, and the other end of the second pipe 56 is connected to the inflow opening of a channel switching unit 58 comprising the channel switching valve (three way valve) composed of an electromagnetic valve. The first outflow opening of this channel switching unit 58 is connected with the return opening of the gas supplier 54 via a third pipe 60. Furthermore, the second outflow opening of this channel switching unit 58 is connected with a turbo molecular pump 66 and then a dry pump 68 via pipes 62, 64.

The above gas supplier 54 has a gas container containing helium gas that is so clean as to contain less than one percent concentration of oxygen. First and second pumps are provided respectively on the discharge opening side (exit side) and return opening side (entrance side) of the gas container. A temperature adjustment unit (not shown) controls the helium gas inside the gas container to be kept at a predetermined target temperature. Moreover, a chemical filter, air filter, etc., are arranged around the return opening.

The method of replacing the gas (air) inside the chamber 46 with helium will be briefly described below. Note that the operation described below is performed while the main controller 50 (refer to FIG. 8) described later is monitoring the output, etc., of a pressure sensor (not shown).

First, the channel switching valve inside the channel switching unit 58 is switched to the side of the turbo molecular pump 66, and then the dry pump 68 is turned on to vacuum the inside of the chamber 46. Next, after the inside of the chamber gets to be at a predetermined first vacuum state, the turbo molecular pump 66 is turned on and simultaneously the dry pump 68 is turned off to further vacuum the inside of the chamber 46. After the inside of the chamber 46 gets to be at a predetermined second vacuum state of, e.g., less than 0.1 hPa, the channel switching valve inside the channel switching unit 58 is switched to the side of the gas supplier 54 and simultaneously the turbo molecular pump 66 is turned off. By the above lowering of the pressure, the absorptive gas such as oxygen is removed from the inside of the chamber 46.

Next, a charging valve (not shown) in the gas supplier is opened and simultaneously the first pump is turned on to start the supply of helium gas from the gas supplier 54 to the chamber 46. Then after the pressure inside the chamber 46 reaches the predetermined value after a predetermined time since the start of the supply, the charging valve is closed and simultaneously the first valve is turned off.

In such a way, the replacement of gases inside the chamber 46 is performed, and the inside of the chamber 46, more specifically, the reticle room 18, the lens room 32, the wafer room 44, and the inside of the lens-barrel of the projection optical system PL is filled with helium.

Note that in the present embodiment, as is obvious seeing FIG. 1, the supply system of helium gas is a circulation system having the circulating path for helium gas and is economical. In this case, there is a high possibility of helium gas, which returns to the returning opening of the gas supplier 54, containing particles or chemical impurities, but as described above, the chemical filter, air filter, etc., arranged around the returning opening remove them, and highly clean helium gas, which is chemically clean and has almost no particles, returns to the inside of the gas container.

The position of the wafer stage WST in the X-Y plane (X position, Y position, and θz rotation) is measured with a predetermined resolution, for example about 0.5 to 1 nm, via a movable mirror 22W fixed on the wafer stage WST by the wafer laser interferometer 24W that is suspended from and supported by a supporting member 70 below the lens-barrel of the projection optical system PL.

Incidentally, a reflection surface may be formed on a predetermined portion of the upper surface of the wafer base level block 38 by performing mirror-process and a wafer base interferometer for measuring the Z position of the reflection surface may be fixed on the lower side of the wafer laser interferometer 24W.

In this case, in practice, on the wafer stage WST, a X movable mirror having a reflection surface perpendicular to the X-axis and a Y movable mirror having a reflection surface perpendicular to the Y-axis are arranged, and two wafer interferometers $24Wy_1$, $24Wy_2$ for measuring the position in the Y-direction and a interferometer 24Wx for measuring the position in the X-direction are arranged (refer to FIG. 8). The measurement values of the wafer laser interferometer 24W, that is, interferometers $24Wy_1$, $24Wy_2$, 24Wx are supplied to the stage controller 52 and then to the main control 50 (refer to FIG. 8). In the stage controller 52, according to the average of the measurement values of the interferometers $24Wy_1$, $24Wy_2$ the Y position of the wafer stage WST is calculated; according to the difference of those measurement values and the distances between the axes of the interferometers the $\theta z$ rotation is calculated; and according to the average of the measurement values of the interferometers 24Wx the X position of the wafer stage WST is calculated. The stage controller 52 reports those results of the calculations to the main controller 50 in real time.

Meanwhile, the z direction position of the wafer with respect to the projection optical system as a reference is measured by a focus sensor 73 that is fixed on the lens-barrel of the projection optical system PL and uses an oblique incident-light method. This focus sensor 73 is, as shown in FIG. 1, composed of a sending light system 73a, which is fixed on the periphery of the lens-barrel of the projection optical system and illuminates the surface of the wafer W with a detection beam in a oblique direction, and a receiving light system 73b, which is fixed on the periphery of the lens-barrel of the projection optical system and receives the detection beam reflected by the surface of the wafer W. In this case, the sending light system 73a and the receiving light system 73b are both so disposed that they form an angle of 45 degrees with respect to the X-axis and Y-axis. As this focus sensor, a multiple focal position detection system is employed which is disclosed in, for example, Japanese Patent Laid-Open No. 6-283403 and its corresponding U.S. Pat. No. 5,448,332. The disclosures in the above Japanese Patent Laid-Opens and U.S. patent are incorporated herein by this reference as long as the national laws in designated states or elected states, to which this international application is applied, permit. Note that this focus sensor 73 (73a, 73b) are integrally fixed on the projection optical system PL.

The output of this focus sensor 73 is supplied to the stage controller 52 and the stage controller 52 calculates the relative position, in Z, $\theta x$, and $\theta y$ directions, of the wafer W with respect to the projection optical system, more specifically, the z position (the amount of defocus), and $\theta x$ rotation (the amount of pitching) and $\theta y$ rotation (the amount of rolling) of a target in the exposure area of the wafer's surface on the basis of the output of this focus sensor 73. These calculation results, which are focus-leveling measurement results of the target in the wafer W's exposure area are reported from the stage controller 52 to the main control 50 in real time.

Figure 2:
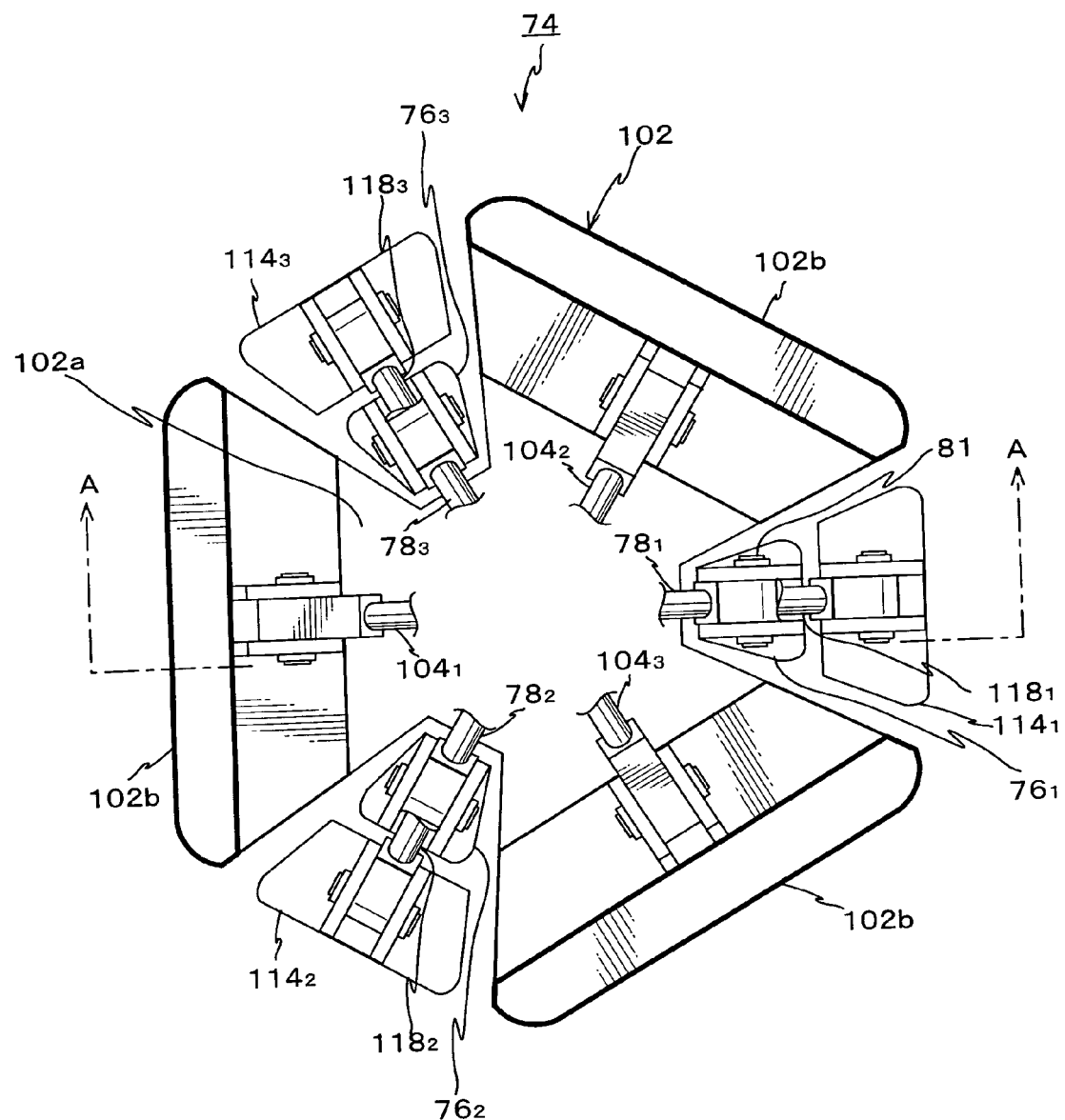
FIG. 2 is a planar view showing the structure, some parts of which are not shown, of the parallel link mechanism of FIG. 1.

Next, the respective supporting mechanisms of the above reticle base level block 12, the projection optical system PL, and the wafer base level block 38 will be described below. As this supporting mechanism, in the present embodiment, a parallel link mechanism 74 is employed. FIG. 2 is a planar view that shows some of its elements composing the parallel link mechanism 74. Incidentally, FIG. 1 is a cross-sectional view along A—A line in FIG. 2.

The parallel link mechanism 74 comprises a first mechanism that controls the position and attitude, in three degrees of freedom Z, $\theta x$, $\theta y$, of the wafer base level block 38, a second mechanism that controls the position and attitude, in three degrees of freedom Z, $\theta x$, $\theta y$, of the reticle base level block 12, and a third mechanism that controls the position and attitude, in three degrees of freedom Z, $\theta x$, $\theta y$, of the projection optical system PL.

Out of these mechanisms, the first mechanism has three first base members 761, 762, 763 (refer to FIG. 2) placed around respective vertices of an equilateral triangle and three expandable first rods 781, 782, 783 that respectively link the first base members 761, 762, 763 with the wafer base level block 38.

These first rods 781, 782, 783, as shown in FIG. 1, each have a first axis member 79 and a second axis member 80 that can relatively move along their axis-direction, and the one end (lower end) of the first axis member 79 is attached to the corresponding first base member 76 so as to be rotatable around a supporting spindle 81 composed of a bolt or pin, and then the other end (upper end) of the second axis member 80 is attached to the wafer bas level block 38 so as to be rotatable in the same way as the above.

Figure 3:
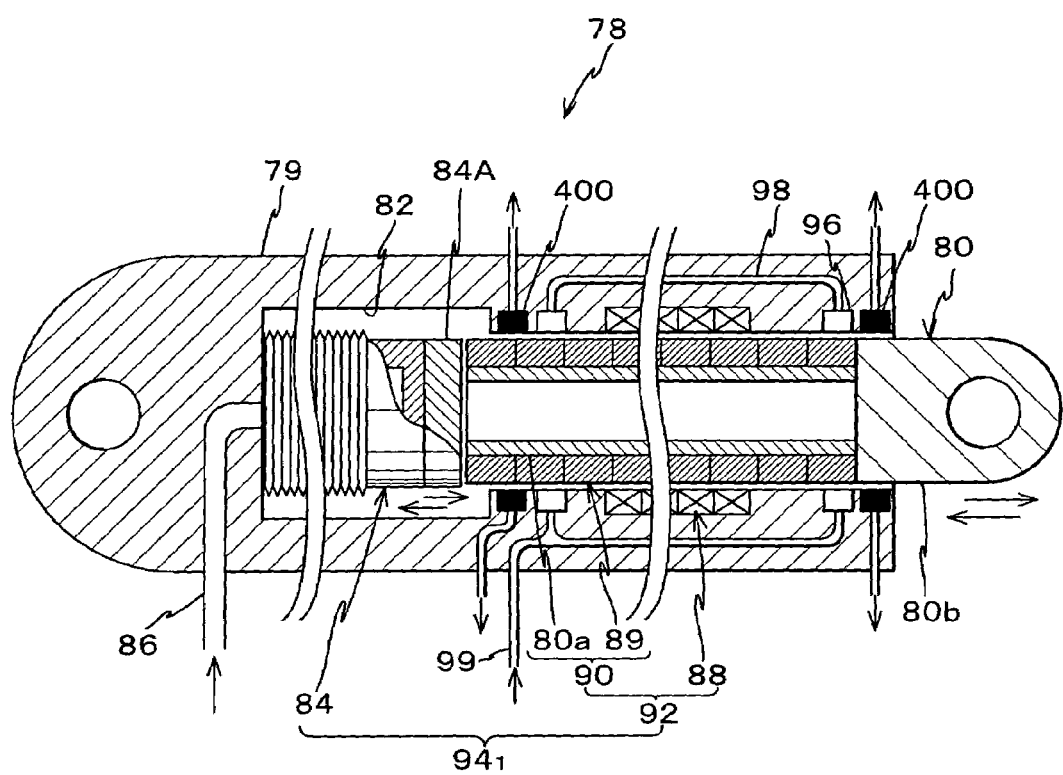
FIG. 3 is a cross-sectional view showing the first rod 78, of FIG. 1, some part of which is not shown.

FIG. 3 shows the cross section (partially omitted) of the first rod 781. As shown in FIG. 3, inside the first axis member 79, a cavity 82 that is shaped like a cylinder with steps is formed, and in one end (left side in FIG. 1) of the inside of this cavity 82 a bellows-type air cylinder 84 is contained. This air cylinder 84 has an end of a pipe 86, which is one portion of an air pressure circuit (not shown), connected thereto, and the other end of a pipe 86 is connected to an air pressure source. And by controlling the air pressure of compressed air supplied from the air pressure source via the air pressure circuit, the inside pressure of the air cylinder 84 is controlled. By this, a piston 84A is moved back and forth along the axis direction. In the air cylinder 84 in FIG. 3, the return process uses the gravity exerted on the piston 84A in the state of being embedded in the parallel link mechanism 84.

Moreover, on the other end inside the cavity 82 of the first axis member 79, an armature unit 88 composing the stator in a shaft motor 92, which is a kind of electromagnetic force linear motor and composed of a plurality of armature coils arranged in the axis-direction, is disposed. As the shaft motor 92, a three-phase motor is employed. Therefore, the armature unit 88 is constituted of a plurality of coil units connected in series each of which has three coils connected in series each of which is for one phase and has a coil-axis-direction length of L/3, a third of a pitch L (described later).

Meanwhile, the second axis member 80 has a tube-like mover-yoke 80a, which is composed of magnetic members, and an attachment member 80b provided on the other end (right end in FIG. 3), in the axis-direction (longitudinal direction), of this mover-yoke 80a. On the periphery of the mover-yoke 80a, a hollow, columnar, that is cylindrical, magnetic body 89 composed of a plurality of permanent magnets having the same size as one another is arranged. In this case, a hollow, columnar magnetic pole unit 90 as a mover of the shaft motor 92 is composed of the mover-yoke 80a and the magnetic body 89. The magnetic body 89 comprises a plurality of first-magnets, which are arranged at a predetermined distance along the axis-direction and each are a cylindrical permanent magnet magnetized in the axis-direction, and a plurality of second-magnets each of which is arranged between the neighboring two first-magnets and is a permanent magnet magnetized in the radius direction. Two poles of mutually neighboring two first-magnets, which are opposite with each other, have the same polarity as each other. Also, second-magnets are so arranged that their magnetization directions are alternatively opposite and that their poles having the same polarity as their neighboring first-magnets' poles are facing outwards.

Therefore, in the neighbor of the stator, an open magnetic circuit (or close magnetic circuit) having a pitch (L) of 2L1 is formed omni directionally (radially) as the length of the first-magnet and second-magnet is represented by L1.

In the shaft motor 92 composed in this way, when supplying a driving current of sine wave having a predetermined period and amplitude to each coil of the armature unit 88 as the stator, the second axis member 80 is relatively driven in the axis-direction with respect to the first axis member 79 by Lorentz force (thrust), a kind of electromagnetic reaction, between the magnetic pole unit 90 and the armature unit 88.

That is, in the present embodiment, the above air cylinder 84 and shaft motor 92 relatively drive the first axis member 79 and the second axis member 80 in the axis-direction, and constitute a first expansion mechanism 94, that expand the first rod 781.

Furthermore, on the inside surface of the first axis member 79 constituting the first rod 781, a plurality of air pads (air static pressure bearing unit) 96's serving as gas static pressure bearing units are arranged. The gas static pressure bearing unit is a bearing unit that supports the magnetic pole unit 90 serving as a mover of the above shaft motor 92 in non-contact manner with respect to the armature unit 88 as a stator. Each air pad 96 has an air pressure circuit (not shown), which is connected to an air pressure source (not shown) via an air supply path 98 and air supply tube 99, connected thereto. And via the air pressure circuit, the pressure of a compressed air supplied from the air pressure source is controlled, and the compressed air having a predetermined pressure is blown out from each air pad 96 toward the periphery of the magnetic pole unit 90. Then by the static pressure of the compressed air, so-called gap-inside pressure, the magnetic pole unit 90 is supported in non-contact manner with respect to the armature unit 88.

Therefore, a friction that is non-linear component is avoided when controlling the expansion/contraction of the first rod 781, where the air pad 96 is arranged, by the first expansion mechanism 941.

Furthermore, in the neighbor of this air pad 96, a differential exhaust mechanism (vacuum exhaust mechanism) 400, which is connected to a vacuum pump (not shown), is arranged. This differential exhaust mechanism 400 prevents an gas blown out of the air pad 96 from contaminating the gas purity of the atmosphere inside the exposure apparatus (e.g. helium gas atmosphere) by differentially exhausting the air blown from the air pad 96.

Incidentally, the above shaft motor 92 also functions as a kind of magnetic bearing by controlling the phase of the driving current. However, considering the effect of the gravity exerted on the second axis member 80, the above air pad 96 is arranged. Therefore, instead of the above air pad, a magnetic bearing unit may be employed as the bearing unit.

Note that although not shown in FIG. 3, a linear encoder $95_1$ is arranged which uses a Hall device to detect the amount of movement of the magnetic unit 90 with respect to the armature unit 88 and that the output of the linear encoder is supplied to the main controller 50 (refer to FIG. 8).

The other first rods 782, 783 are constituted in the same way as the first rod 78, and have first expansion mechanisms $94_2$, $94_3$ and linear encoders $95_2$, $95_3$ that are respectively the same as those of the first rod $78_1$ (refer to FIG. 8).

Moreover, the second mechanism comprises a second base member 102 provided on the floor surface FD of a clean room and three expandable second rods $104_1$, $104_2$, $104_3$ that each connect the second base member 102 and the reticle base level block 12. As shown in FIG. 2, the second base member 102 comprises a basis 102a and three extended portions 102b that extend upward from the three positions of the basis 102a and have the same height.

The second rods $104_1$, $104_2$, $104_3$ each have a first axis member 106 and a second axis member 108 that are relatively movable along their axis, and one end (lower end) of the first axis member 106 is attached to a position of a predetermined height near the upper end of the corresponding extended portions 102b so as to be rotatable around a supporting axis 110, being a bolt or pin, as a center. And in the same way, one end (upper end) of the second axis member 108 is attached to the reticle base level block 12 so as to be rotatable. These three second rods $104_1$, $104_2$, $104_3$ are so arranged that they are respectively opposite with the first rods $78_1$, $78_2$, $78_3$ in the planar view as shown in FIG. 2.

Furthermore, the second rods $104_1$, $104_2$, $104_3$ respectively comprise second expansion mechanisms $112_1$, $112_2$, $112_3$, which are composed in the same way as the first expansion mechanisms 94, of the first rod $78_1$, and linear encoders $95_4$, $95_5$, $95_6$ (refer to FIG. 8). Also, in the second rods $104_1$, $104_2$, $104_3$, air pads are arranged in the same way and for the same purpose as the first rod.

The third mechanism comprises three third base members $114_1$, $114_2$, $114_3$ (refer to FIG. 2) that are respectively arranged outwards next to the three first base members $76_1$, $76_2$, $76_3$ on the floor surface FD of a clean room and three expandable third rods $118_1$, $118_2$, $118_3$ that respectively connect three third base members $114_1$, $114_2$, $114_3$ with an attachment stage 116 provided on the outside of the bulkhead containing the projection optical system PL.

The respective third rods $118_1$, $118_2$, $118_3$ have a first axis member 120 and a second axis member 122 that are relatively movable along their axis, and one end (lower end) of the first axis member 120 is attached to the corresponding third base member 114 so as to be rotatable around a supporting axis 124, being a bolt or pin, as a center. And in the same way, one end (upper end) of the second axis member 122 is attached to the attachment stage 116 so as to be rotatable.

The third rods $118_1$, $118_2$, $118_3$ respectively comprise third expansion mechanisms $126_1$, $126_2$, $126_3$, which are composed in the same way as the first expansion mechanisms 94, of the first rod $78_1$, and linear encoders $95_7$, $95_8$, $95_9$ (refer to FIG. 8). Also, in the third rods $118_1$, $118_2$, $118_3$, air pads are arranged in the same way as the first rod.

Expansion mechanisms of rods $94_1$ to $94_3$, $112_1$ to $112_3$, $126_1$ to $126_3$ that constitute the parallel link mechanism in the way described above are controlled by the main controller 50 via the stage controller 52 (refer to FIG. 8).

In the present embodiment, the above third mechanism composing the parallel link mechanism 74 is, for example, employed to initially set the position and attitude of the projection optical system when starting up the exposure apparatus 10 after the completion of its assembly in a factory. That is, an operator inputs necessary information for initial setting via an input/output unit, and the main controller 50 controls the third expansion mechanisms $126_1$, $126_2$, $126_3$ via the stage controller 52 on the basis of the input information. Then the third rods $118_1$, $118_2$, $118_3$ are expanded and the projection optical system PL is set to be in a predetermined position and attitude. After the completion of the initial setting, the third rods $118_1$, $118_2$, $118_3$ are kept in the after-adjustment state.

Note that because there is some possibility that the Z position and attitude of the projection optical system PL changes from the initial state due to fine deformation of the clean room floor surface over time, the above initial setting may be repeated at a predetermined time interval or performed as the need arises.

Next, the principle of controlling the position and attitude in three degrees of freedom, that is θx, θy, Z, of a body (controlled object) to be driven by a driving system having three of the same rods as the above first, second and third mechanisms have will be described below.

Figure 4:
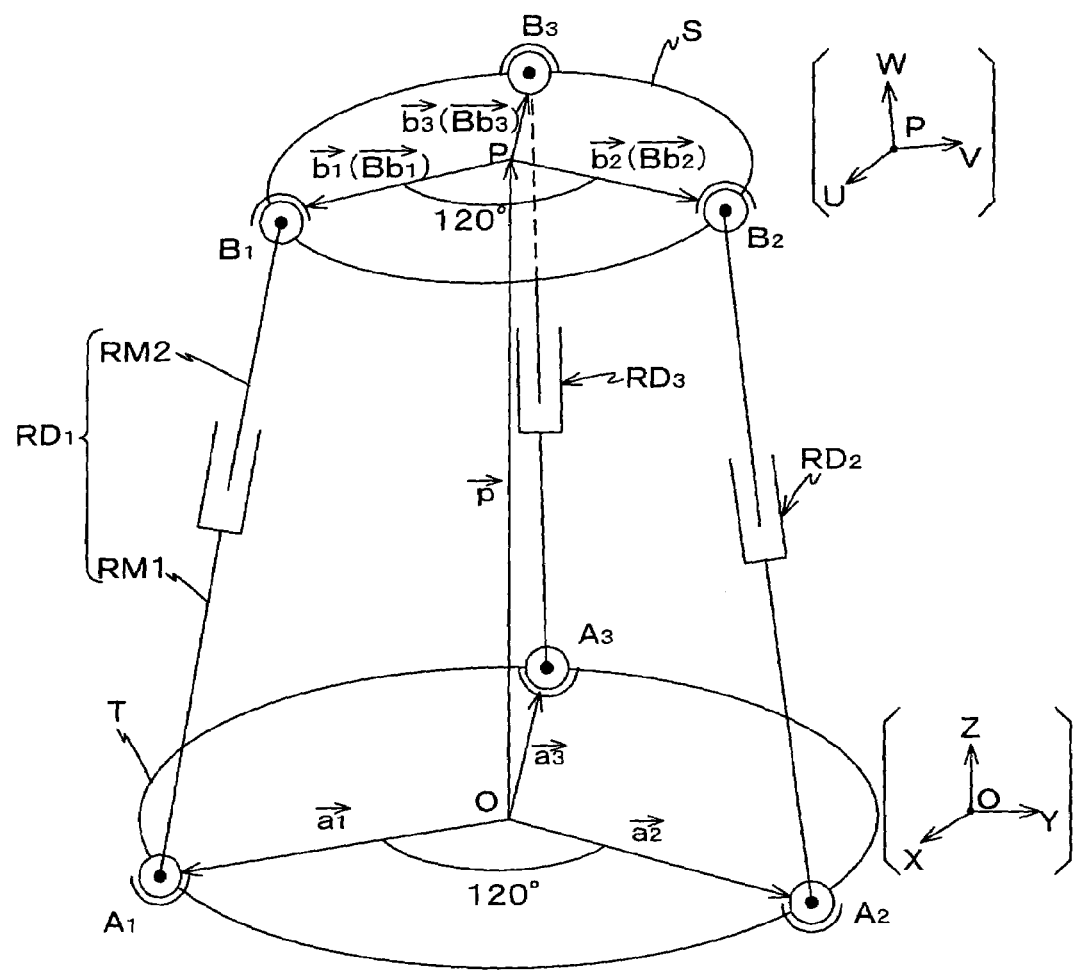
FIG. 4 is a schematic view showing the structural model of a driving system so as to explain the principle of the control of a parallel link mechanism in an exposure apparatus according to the first embodiment.

As such a driving system, consider one, as shown schematically in FIG. 4, including a stationary member T, a driven body S, and expandable rods $RD_i$ (i=one to three), each of which includes a stator side member RM1 and a mover side member RM2 and links three points $A_i$ (i=one to three) of the stationary member T and three points $B_i$ (i= one to three) of the driven body S. Note that in the plane defined by three points $A_i$ (i=one to three) these points are placed at vertices of an equilateral triangle and that as setting the center of the equilateral triangle to be an origin O, a stationary coordinate system XYZ is so defined that the plane including the equilateral triangle is its X-Y plane. Furthermore, in the plane defined by three points $B_i$ (i=one to three) these points are placed at vertices of an equilateral triangle and as setting the center of the equilateral triangle to be an origin P, a driven-body coordinate system UVW is so defined that the plane including the equilateral triangle is its U-V plane. Incidentally, in each of the rods, the expansion/contraction of the rod $RD_i$ is caused by the movement, along the line between $A_i$ and $B_i$, of the mover side member RM2 of the rod $RD_i$.

In the present embodiment, a control system shown in FIG. 5, a block diagram, controls the position and attitude in three degrees of freedom θx, θy, Z, which is shown in FIG. 4, in the manner described below.

First, initial values of a position/attitude-setting portion 306 and a velocity-setting portion 304 are set to current values of the position and attitude (θx, θy, Z), in three degrees of freedom θx, θy, Z, and the velocities (dθx/dt, dθy/dt, dZ/dt) of a driven body S, and initial values of an acceleration-setting portion 302 are set to acceleration values ($d^2θx/dt^2$, $d^2θy/dt^2$, $d^2Z/dt^2$) for the control of a desirable position/attitude. After that, until a new initial setting, only the acceleration-setting portion 302 is updated time after time. Meanwhile, in the velocity-setting portion 304, its setting values are each set to the sum of their initial value and the integration of acceleration values from the acceleration-setting portion 302, and in the position/attitude-setting portion 306, its setting values are each set to the sum of their initial value and the integration of velocity values from the velocity-setting portion 304.

At each time, a reverse-dynamics analyzing portion 308 analyzes the acceleration-setting values of the acceleration-setting portion 302, the velocity-setting values of the velocity-setting portion 304, and the position/attitude-setting values of the position/attitude-setting portion 306 that are set in this way and inputted thereto, and based on the results of this analysis, the reverse-dynamics analyzing portion 308 determines instructing values of thrusts for the respective rods $RD_i$.

The reverse-dynamics analyzing portion 308 performs kinematical analyses regarding the position/attitude, velocity, and acceleration. These will be described below in turn.

In the below description, for the sake of convenience, each vector is represented by an expression, vector XX, in sentences, and a vector-symbol "→" is attached on the XX in mathematical expressions.

The Analysis of Position/Attitude

In the analysis of position/attitude, the length and the expansion/contraction direction of each rod $RD_i$ are obtained based on the position/attitude setting values (θx, θy, Z).

Therefore, first, from the respective position vectors $Bb_i$ (known constant vectors) of the points $B_i$ (i= one to three) in the UVW coordinate system, a vector $b_i$ in the XYZ coordinate system is calculated by the following equation (3).

$$\vec{b_i} = ARB \cdot \vec{Bb_i} \tag{3}$$

Note that ARB is a rotational transform matrix from the UVW coordinate system to the XYZ coordinate system and is determined by the attitude setting values θx, θy and known θz (constant; e.g. zero) in the position/attitude-setting portion 306. Such a rotational transform matrix is publicly known and can be easily calculated. Incidentally, instead of the position/attitude setting values θx, θy, Z, Eulerian angles may be used and in such a case, the expression for equations of motion described later becomes simple.

Then using a vector $b_i$ obtained from equation (3), a vector $r_i$ from $A_i$ to $B_i$ is calculated by the following equation (4).

$$\vec{r_i} = \vec{p} + \vec{b_i} - \vec{a_i} \tag{4}$$

Note that the vector p is, as shown in FIG. 4, a vector from the origin O of the XYZ coordinate system to the origin P of the UVW coordinate system, that in the XYZ coordinate the Z component of the vector p is determined by a position setting value Z in the position/attitude-setting portion 306, and that its X component and Y component are known (constant; e.g. both are zero in the case of the point p being just on the point O). Also, a vector $a_i$ is the position vector of the point $A_i$ in the XYZ coordinate system and a known constant vector.

Next, by the following equations (5) and (6), the length $D_i$ of each rod $RD_i$ and a unit vector $s_i$ in the expansion/contraction direction of each rod $RD_i$ in the XYZ coordinate system are obtained.

$$D_i = |\vec{r_i}| \tag{5}$$

$$\vec{s_i} = \vec{r_i}/D_i \tag{6}$$

Figure 6:
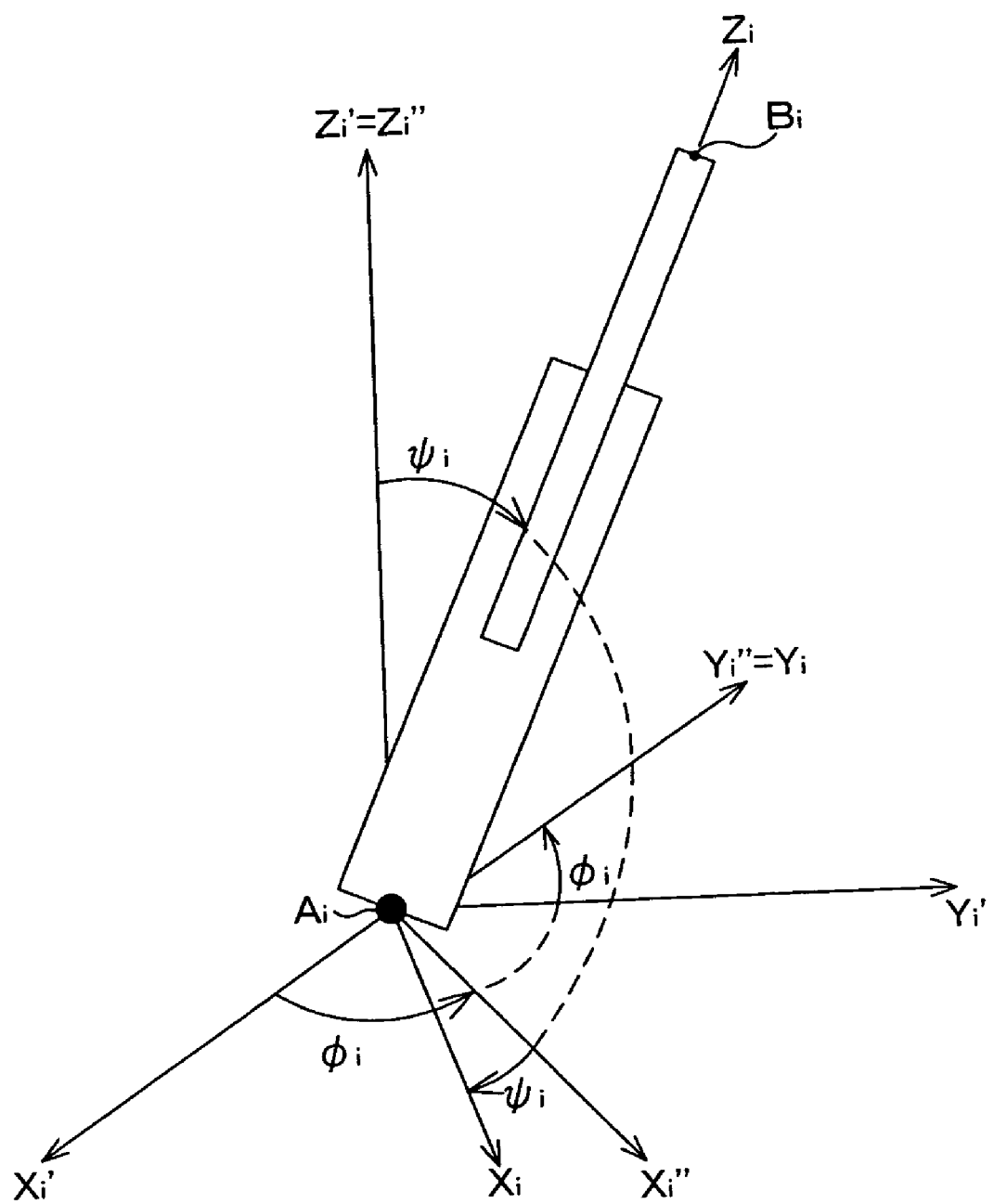
FIG. 6 is a view showing a relation between a stationary coordinate and a rod coordinate.

Incidentally, the reverse-dynamics analyzing portion 308 finally determines the thrust in the expansion/contraction direction of each rod $RD_i$ and because the rotation of the rod $RD_i$ is generated by the expansion/contraction of the rod $RD_i$, it is convenient to employ a rod coordinate system, for each rod $RD_i$, having the expansion/contraction direction of the rod $RD_i$ to be its one-axis so as to easily express the rotation of the rod $RD_i$. Therefore, in the present embodiment, as having a $X_iY_iZ_i$ coordinate system shown in FIG. 6 represent the rod coordinate system for each rod $RD_i$, the following definitions are made.

That is, definitions are made that a $X_i'Y_i'Z_i'$ coordinate system is a coordinate system where its axes are respectively parallel to those of the XYZ coordinate system and its origin is a point $A_i$, that the $Z_i'$ direction and the expansion/contraction direction of the rod $RD_i$ form an angle $\Psi_i$, and that the $X_i'$ axis and an intersection line between the $X_i'Y_i'$ plane and a plane, which is formed by the $Z_i'$ axis and the expansion/contraction direction axis of the rod $RD_i$, form an angle $\phi_i$. Moreover, definitions are made that a $X_i''Y_i''Z_i''$ coordinate system is a coordinate system obtained by rotating the $X_i'Y_i'Z_i'$ coordinate system around the $Z_i'$ axis through the angle $\phi_i$ and that a $X_iY_iZ_i$ coordinate system obtained by rotating the $X_i''Y_i''Z_i''$ coordinate system around the $Y_i''$ axis through the angle $\Psi_i$ is an individual rod coordinate system for the rod $RD_i$.

Between the angles $\Psi_i$, $\phi_i$ and the components $(S_{iX}, S_{iY}, S_{iZ})$ of the unit vector $s_i$ in the XYZ coordinate system, the following equations exist.

$$\cos \phi_i = S_{iZ} \tag{7}$$

$$\sin \phi_i = (s_{iX}^2 + s_{iY}^2)^{1/2} \tag{8}$$

$$\sin \phi_i = s_{iY}/\sin \phi_1 \tag{9}$$

$$\cos \phi_i = S_{iX}/\sin \phi_i \tag{10}$$

Moreover, a rotational transform matrix $AR_i$ from the $X_iY_iZ_i$ coordinate system to the XYZ coordinate system is given by $$AR_i = \begin{pmatrix} \cos\phi_i \cdot \cos\psi_i & -\sin\phi_i\cos\phi_i \cdot \sin\psi_i \\ \sin\phi_i \cdot \cos\psi_i & -\cos\phi_i\sin\phi_i \cdot \sin\psi_i \\ -\sin\psi_i & 0 & \cos\psi_i \end{pmatrix} \tag{11}$$

Incidentally, the rotational transform matrix $AR_i$ is an Hermitean matrix, and the rotational transform matrix $_iRA$ from the XYZ coordinate system to the $X_iY_iZ_i$ coordinate system, which is the reverse transform of the rotational transform by the rotational transform matrix $AR_i$, is a transposed matrix.

The Analysis of Velocities

In the analysis of velocities, based on the above analysis results of the position and attitude and the velocity setting values, the velocity-vectors, in the driven body connection point $B_i$, of each rod $RD_i$ viewed in the XYZ coordinate system and the $X_iY_iZ_i$ coordinate system and the angular-velocity-vector of each rod $RD_i$ viewed in the $X_iY_iZ_i$ coordinate system are obtained.

First, the velocity-vector $vb_i$ in the point $B_i$ viewed in the XYZ coordinate system is obtained by $$\overline{vb_i} = \overline{v_P} + \overline{\Omega_P} \times \overline{b_i} \tag{12}$$

Note that the vector $V_P$ is the velocity vector of the gravity center of the driven body S in the XYZ coordinate system, that X component and Y component of the vector $V_P$ are both zero because the driven body S does not move in the X direction and Y direction, and that its Z component is the velocity setting value $dZ/dt$ in the velocity setting portion 304. Also, $\Omega_P$ represents the angular velocity vector of the driven body S in the XYZ coordinate system, and its X component and Y component respectively represent angular-velocity setting values $d\theta x/dt$, $d\theta y/dt$ in the velocity-setting portion 304. Also, because the driven body S does not rotate about the Z-axis, its Z component is zero. In equation (12) and below equations, "x" represents an outer product operation and "·"an inner product operation.

Next, a velocity vector $_ivb_i$ of the point $B_i$ viewed in the $X_iY_iZ_i$ coordinate system is obtained by $$_i\overline{vb_i} = {_iRA} \cdot \overline{vb_i} \tag{13}$$

Note that the $Z_i$ component of vector $_ivb_i$ represents the expansion/contraction velocity $VR_i$ of the rod $RD_i$.

Next, by the following equation (14), the above unit vector $s_i$ is transformed into a vector $_is_i$ that is its expression in the $X_iY_iZ_i$ coordinate system.

$$_i\overline{s_i} = {_iRA} \cdot \overline{s_i} \tag{14}$$

And a angular velocity vector $_i\Omega_i$ of the rod $RD_i$ viewed in the $X_iY_iZ_i$ coordinate system is obtained by $$_i\overline{\Omega_i} = (_i\overline{s_i} \times {_i\overline{vb_i}})/D_i \tag{15}$$

The Analysis of Acceleration

In the analysis of acceleration, based on the above analysis results of the position/attitude and the velocity, and the acceleration setting values, the acceleration-vectors and angular-acceleration-vectors, in the driven body connection point $B_i$, of each rod $RD_i$ are obtained.

Next, the acceleration-vector in the point $B_i$ viewed in the XYZ coordinate system is obtained by $$\overline{ab_i} = \overline{\alpha_p} + \overline{\beta_p} \times \overline{b_i} + \overline{\Omega_p} \times (\overline{\Omega_p} \times \overline{b_i}) \tag{16}$$

Note that the vector $\alpha_p$ is the acceleration vector of the gravity center of the driven body S in the XYZ coordinate system, that X component and Y component of the vector $\alpha_p$ are both zero because the driven body S is not driven in the X direction and Y direction, and that its Z component is the acceleration setting value $d^2Z/dt^2$ in the acceleration setting portion 302. Also, $\beta_P$ represents the angular velocity vector of the driven body S in the XYZ coordinate system, and its X component and Y component respectively represent angular-acceleration setting values $d^2\theta x/dt^2$, $d^2\theta y/dt^2$ in the acceleration-setting portion 302. Also, because the driven body S is not driven about the Z-axis, its Z component is zero.

Next, a velocity vector $_iab_i$ of the point $B_i$ viewed in the $X_iY_iZ_i$ coordinate system is obtained by $$_i\overline{ab_i} = {_iRA} \cdot \overline{ab_i} \tag{17}$$

Note that the $Z_i$ component of vector $_iab_i$ represents the expansion/contraction acceleration $\alpha R_i$ of the rod $RD_i$.

Next, an angular-acceleration vector $_i\beta_i$ of the point $B_i$ viewed in the $X_iY_iZ_i$ coordinate system is obtained by $$_i\overline{\beta_i} = (_i\overline{s_i} \times {_i\overline{ab_i}})/D_i - 2VR_i \cdot {_i\overline{\Omega_i}}/D_i \tag{18}$$

Incidentally, each rod $RD_i$ is composed of the stator side member RM1 and the mover side member RM2. Assume that the structure of the stator side member RM1 and the mover side member RM2 is the one shown in FIG. 7. That is, the mass of the stator side member RM1 and the mass of the mover side member RM2 are respectively represented by m1 and m2. Also, assume that the gravity center of the stator side member RM1 is located at the position of distance L1 from the point $A_i$ in the direction from the point $A_i$ to $B_i$ and that the gravity center of the mover side member RM2 is located at the position of distance L2 from the point $B_i$ in the direction from the point $B_i$ to $A_i$.

In this case, an acceleration vector $_i\alpha 1_i$, in the gravity center, of the stator side member RM1 and an acceleration vector $_i\alpha 2_i$, in the gravity center, of the mover side member RM2 viewed in the $X_iY_iZ_i$ coordinate system are obtained by the following equations (19), (20).

$$_i\overline{\alpha 1_i} = L1 \cdot {_i\overline{\beta_i}} + L1 \cdot {_i\overline{\Omega_i}} \times ({_i\overline{\Omega_i}} \times {_i\overline{s_i}}) \tag{19}$$

$$_i\overline{\alpha 2_i} = \alpha R_i \cdot {_i\overline{s_i}} + (D_i - L2) \cdot {_i\overline{\beta_i}} \times {_i\overline{s_i}} + (D_i - L2) \cdot {_i\overline{\Omega_i}} \times ({_i\overline{\Omega_i}} \times {_i\overline{s_i}}) + 2VR_i \cdot {_i\overline{\Omega_i}} \times {_i\overline{s_i}} \tag{20}$$

After the completion of the analyses of the position/attitude, the velocity/angular-velocity, and the acceleration/ angular-acceleration as described above, as shown in FIG. 7, by virtually dividing the driven body S and the rod $RD_i$ at the point $B_i$, the system is decomposed into a driven body system and open loop rod system.

And considering each rod $RD_i$ as a sub-system, an equation of motion about $A_i$ for the rod $RD_i$ is given by $$\overrightarrow{_in_iA} = d(\overrightarrow{_ih_iA})/dt \tag{21}$$

Note that the vector $_in_iA_i$ is a moment vector about the point $A_i$ of the rod $RD_i$ and that the vector $_ih_iA_i$ is a angular moment vector about the point $A_i$ of the rod $RD_i$.

Figure 7:
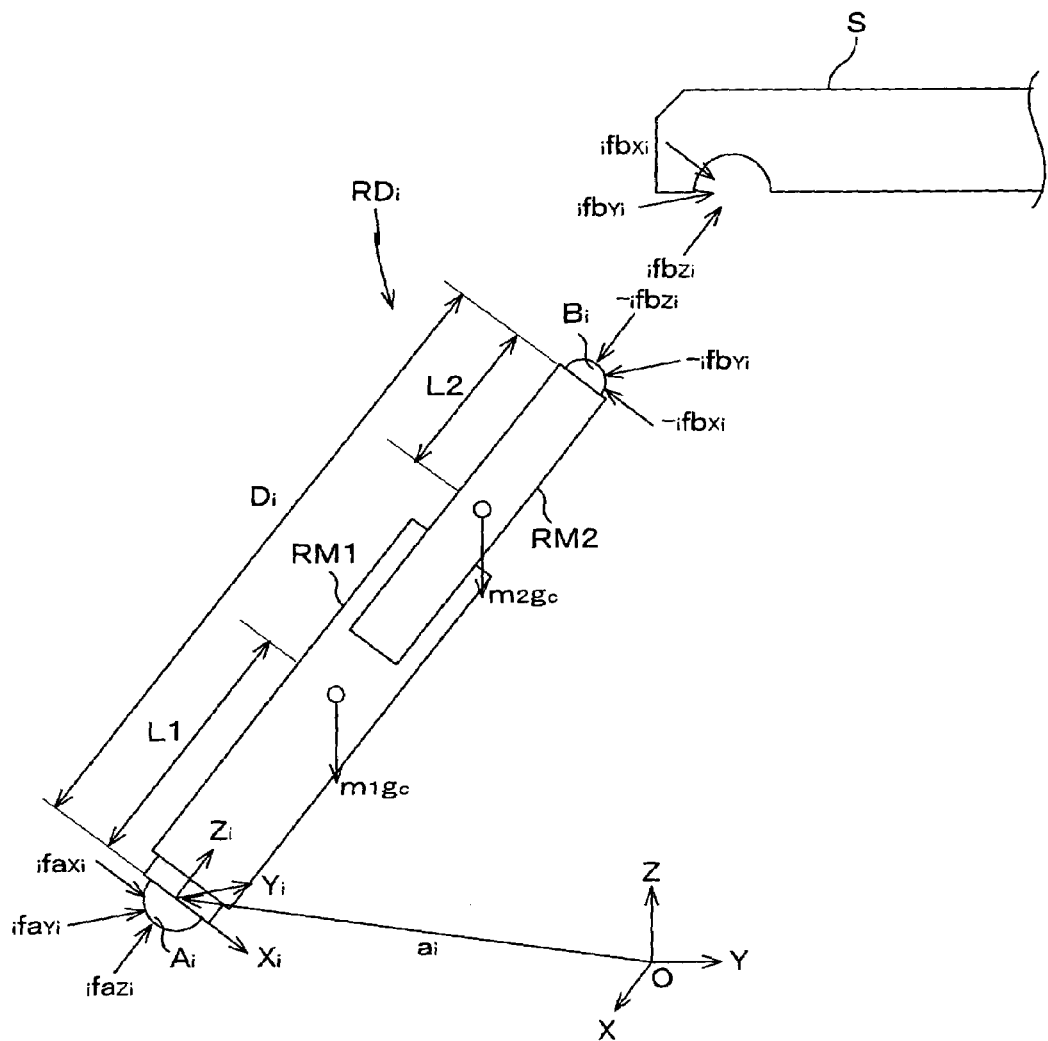
FIG. 7 is a view for explaining the rod's structural model of FIG. 4 and reactions exerted on the rod and a driven body.

Incidentally, as shown in FIG. 7, viewing in the $_iY_iZ_i$ coordinate system, a reaction $_ifa_i$ ($_ifa_{Xi}$, $_ifa_{Yi}$, $_ifa_{Zi}$) acting on the rod $RD_i$ is generated at the point $A_i$ and a reaction $\{-_ifb_i$ ($-_ifb_{Xi}$, $-_ifb_{Yi}$, $-_ifb_{Zi}$) acting on the rod $RD_i$ is generated at the point $B_i$. And a reaction $_ifb_i$ is generated at a point of the driven body S corresponding to the point $B_i$.

The values $_ifb_{Xi}$, $_ifb_{Yi}$ that are respectively $X_i$ axis component and $Y_i$ axis component of the reaction acting on the point $B_i$ and the point of the driven body S corresponding to the point $B_i$ are obtained on the basis of the results of the above reverse-dynamics analysis of the position/attitude, the velocity/angular velocity, the acceleration/angular acceleration, the mass m1 of the stator side member RM1, the mass m2 of the mover side member RM2, and a gravity acceleration regardless of the mass of the driven body S. Also, the value $_ifb_{Zi}$ that is $Z_i$ axis component is obtained by resolving a translation motion equation of the driven body S viewed in the XYZ coordinate system (22) and a rotatory equation (23).

$$\sum_{i=1}^{3} \overrightarrow{(Afb_i)} + m_p \cdot \vec{g} = mp \cdot \vec{\alpha_p} \tag{22}$$

$$Bn_p = \sum_{i=1}^{3} \left( \overrightarrow{Bb_i} \cdot \overrightarrow{Bfb_i} \right) \tag{23}$$

The vector $Afb_i$ is a reaction-vector acting on the point of the driven body S corresponding to the point $B_i$ in the XYZ coordinate system and given by the following equation (24).

$$\overrightarrow{Afb_i} = AR_i \cdot \overrightarrow{_ifb_i} \tag{24}$$

Also, $m_p$ represents the mass of the driven body S and a vector g represents a gravity acceleration vector.

Furthermore, the vector $Bn_p$ represents the moment of the driven body S viewed in the UVW coordinate system and the vector $Bfb_i$ is a reaction-vector acting on the point of the driven body S corresponding to the point $B_i$ in the UVW coordinate system and given by the following equation (25).

$$\overrightarrow{Bfb_i} = (ARB)^{-1} \cdot \overrightarrow{Afb_i} \tag{25}$$
$$= (ARB)^{-1} \cdot AR_i \cdot \overrightarrow{_ifb_i}$$

Incidentally, although equations (22) and (23) include six equations, considering that the driven body is driven in three degrees of freedom $\theta x$, $\theta y$, Z, an equation regarding Z component of equation (24) and two equations regarding components $\theta x$, $\theta y$ of equation (25) are used on calculating three values $_ifb_{Zi}$ (i=one to three).

And the reverse-dynamics analyzing portion 308 finally calculates the instructing value $\tau_i$ of thrust for each of the rods $RD_i$ according to $$\tau_i = _ifb_{Zi} + m2 \cdot gc \cdot \cos \phi_i + m2 \cdot _1\alpha 2_{Zi} \tag{26}$$

Note that $_ifb_{Zi}$ is the Z component of vector $_ifb_i$ and that gc is the magnitude (9.8 m/S$^2$) of the gravity acceleration.

Although, in the above, the calculation of the instructing value of thrust for each rod $RD_i$ according to Newton/Euler method is described, the instructing value of thrust for each ros $RD_i$ may be calculated according to d'Alembert method. In the d'Alembert method, the equations of Newton/Euler method are put together into Jacobian matrices, and forces of constraint and moments of Newton/Euler method are removed from the equations of motion. Therefore, it is more efficient than Newton/Euler method, practical, and preferable d'Alembert method will be briefly described below. Note that symbols represent the same things as those of Newton/Euler method.

First, in the same way as Newton/Euler method, the position/attitude, velocity/angular velocity, and acceleration/angular acceleration are analyzed by reverse-dynamics analysis. The rotational transform matrix from the UVW coordinate system to the XYZ coordinate, and the angular velocity vector $\Omega_P$ and angular acceleration vector $\beta_P$ in the expression of Eulerian angles are obtained.

Next, Jacobian matrix $Jb_i$ of each rod $RD_i$ regarding the XYZ coordinate system that satisfy the following equation (27) is calculated.

$$\overrightarrow{vb_i} = Jb_i \cdot \overrightarrow{va_p} \tag{27}$$

Note that $va_p$ is a velocity vector in six degrees of freedom in the XYZ coordinate system and the resultant of the above velocity vector $v_P$ of the gravity center of the driven body S and the angular velocity vector $\Omega_P$ of the driven body S.

Jacobian matrix $Jb_i$ is obtained from the results of reverse-dynamics analyses of the position/attitude and velocity/angular velocity by using an equation equivalent to the equation (12).

Next, Jacobian matrix $_iJb_i$ of each rod $RD_i$ regarding the $X_iY_iZ_i$ coordinate system is calculated by the following equation (28).

$$_iJb_i = _iRA \cdot Jb_i \tag{28}$$

By using Jacobian matrix $_iJb_i$, from the velocity vector $va$ in six degrees of freedom in the XYZ coordinate system, velocity vector $_ivb_i$ of the point $B_i$ viewed in the $X_iY_iZ_i$ coordinate system is obtained from the following equation (29).

$$\overrightarrow{_ivb_i} = _iJb_i \cdot \overrightarrow{va_p} \tag{29}$$

Next, a driven body's Jacobian matrix JP is obtained from the following equation (30).

$$\overrightarrow{VR_i} = JP \cdot \overrightarrow{v_p} \tag{30}$$

The driven-body's Jacobian matrix JP is obtained on the basis that $Z_i$ component of vector $_ivb_i$ is the expansion/contraction velocity vector $VR_i$ of the rod $RD_i$.

Incidentally, considering that the gravity acts on the driven body S, a applied-force vector $fS_p$ and an inertia torque $tS_p$ exerted on the gravity of the driven body S are obtained from the following equations (31) and (32) as representing an inertia matrix around the gravity of the driven body S in the XYZ coordinate system by $AI_p$.

$$\overrightarrow{fS_p} = m_p \cdot \vec{g} - m_p \cdot \overrightarrow{\alpha_p} \tag{31}$$

$$\overrightarrow{tS_p} = -AI_p \cdot \overrightarrow{\beta_p} - \overrightarrow{\Omega_p} \times (AI_p \cdot \overrightarrow{\Omega_p}) \tag{32}$$

The resultant of the applied-force vector $fS_p$ and inertia torque $tS_p$ is represented by vector $T_p$ in the below.

In the same way as the driven body S, the resultant $_iT1_j$, in the $X_iY_iZ_i$ coordinate system, of the applied-force vector and the inertia torque that act on the gravity of the stator side member RM1 composing the rod $RD_i$ and the resultant $_iT2_j$, in the $X_iY_iZ_i$ coordinate system, of the applied-force vector and the inertia torque that act on the gravity of the mover side member RM2 composing the rod $RD_i$ are obtained.

Next, using the instructing value $\tau_i$ of thrust for each rod $RD_i$ as a parameter and employing driven-body's Jacobian matrix, an equation of motion is established. And by solving that equation, the instructing value $\tau_i$ of thrust for each rod $RD_i$ is obtained. Note that the instructing value $\tau_i$ of thrust can be calculated by applying Gauss elimination to the equation of motion.

That is, the instructing value $\tau_i$ of thrust depends on the reverse transform of the driven-body's Jacobian matrix. Therefore, because, when the driven body comes close to a singular point of the reverse transform, a value calculated as the instructing value $\tau_i$ of thrust becomes unstable, it is necessary to monitor the amount of the expansion/contraction, and velocity and acceleration of each rod $RD_i$ all the time.

As described above, a voltage conversion portion 310 converts the instructing value $\tau_i$ of thrust for each rod $RD_i$ obtained by the reverse-dynamics analyzing portion 308 into a voltage supplied to each rod $RD_i$. The voltage is supplied to the electromagnetic actuator (corresponding to the shaft motor 92 in FIG. 3) of each rod $RD_i$ via a voltage adder 322 and first-order delay portion 312. And by the rod $RD_i$ expanding or contracting according to the voltage, the driven body 316 (i.e. the above driven body S (corresponding to the wafer base level block 38, etc.)) is driven in three degrees of freedom θx, θy, Z.

Note that taking into account time delay in the delay portion 312 and the driven body 316, a controller 318 generates and supplies a voltage according to the difference between the position/attitude setting values in the position/attitude setting portion 306 and the position/attitude values measured by a stage system sensor 320 (corresponding to the focus sensor 73 in FIG. 1) to the voltage adder 322. Furthermore, taking the above time delay into account, a controller 324 generates and supplies a voltage according to the difference between the length of each rod $RD_i$ calculated by the reverse-dynamics analyzing portion 308 and the length of each rod $RD_i$ measured by a rod system sensor 326 (corresponding to the linear encoder 95) to the voltage adder 322. By this compensated voltage for each rod generated by the controller 318, 324, the delay in control by the delay portion 312 or the driven body 316 is compensated for.

In FIG. 8, the structure of the control system of the exposure apparatus 10 is schematically shown. The control system of FIG. 8 comprises the main controller 50 and the stage controller 52, each of which is composed of a microcomputer or a workstation, as a main portion. Note that the main controller 50 and the stage controller 52 comprise the acceleration-setting portion 302, the velocity-setting portion 304, the position/attitude-setting portion 306, the reverse-dynamics analyzing portion 308, the voltage conversion portion 310, and the controllers 318, 324 and control the reticle base level block 12 and the wafer base level block 38 using the principle of the driving control by the above parallel link mechanism on the basis of the detection results by the reticle interferometer 24R, the wafer interferometer 24W, the focus sensor 73, and the linear encoder 95.

Next, the exposure operation by the exposure apparatus 10 of the present embodiment, which is constituted in the manner described above, will be described below with referring to FIG. 8 and the like.

Assume that, as a premise, the above initial setting of the projection optical system PL is completed using the third mechanism composing the parallel link mechanism 74.

First, after preparation such as reticle alignment and base line measurement using a reticle microscope (not shown), an off-axis alignment sensor (not shown), and the like, a fine alignment (EGA (enhanced global alignment), etc.) of a wafer W using the alignment sensor is completed, and then the arrangement coordinates of a plurality of shot areas on the wafer are obtained. Incidentally, the details of the above preparation of such as reticle alignment and base line measurement are disclosed in Japanese Patent Laid-Open No. 4-324923, U.S. Pat. No. 5,243,195 corresponding thereto, and the like, and the details of the EGA are disclosed in Japanese Patent Laid-Open No. 61-44429, U.S. Pat. No. 4,780,617 corresponding thereto, and the like. The disclosures in the above Japanese Patent Laid-Opens and U.S. patents are incorporated herein by this reference as long as the national laws in designated states or elected states, to which this international application is applied, permit.

Next, according to the instructions from the main controller 50, the stage controller 52 moves the reticle stage RST via the reticle driver 14 while monitoring the measurement values of the reticle laser interferometer $24Ry_1$, $24Ry_2$, 24Rx, and the reticle is positioned at a scanning start position in the Y direction. In the same manner as this, according to the instructions from the main controller 50, the stage controller 52 moves the wafer stage WST via the wafer driver 40 while monitoring the measurement values of wafer laser interferometer $24Wy_1$, $24Wy_2$, 24Wx, and a corresponding shot area on the wafer is positioned at a scanning start position in the Y direction.

Then the stage controller 52 moves the reticle stage RST and the wafer stage WST respectively via the reticle driver 14 and the wafer driver 40 in mutually opposite directions at a velocity ratio corresponding to the projection magnification, and scanning exposure is performed.

By the above operation, one-scan exposure (one shot exposure) of the reticle R is completed.

Next, according to the instructions from the main controller 50, the stage controller 52 steps the wafer stage WST by one row of shot areas in the X direction and scans the wafer stage WST and the reticle stage RST each in an opposite direction to their previous direction, and performs scanning exposure onto other shot areas on the wafer.

During the above scanning exposure, using the above driving control principle, on the basis of the measurement results of focus and leveling in the exposure area on the wafer, the main controller 50 controls the expansions/contractions of the first rods $78_1$ to $78_3$ via the stage controller 52 and respectively via the first expansion mechanisms $94_1$ to $94_3$ composing the parallel link mechanism 74 and controls the position/attitude in three degrees of freedom Z, θx, θy of the wafer stage WST via the wafer base level block 38 so that the exposure areas are kept within the range of the focus depth of the projection optical system. That is, in this manner, the main controller 50 adjusts the relative positions in three degrees of freedom Z, θx, θy of the projection optical system PL and the wafer W (the wafer stage WST), in other words, precisely performs a focus leveling control to prevent the deterioration of pattern transferred images due to defocus as much as possible.

Furthermore, during the above scanning exposure, using the above driving control principle, on the basis of the position/attitude detection information of the reticle base level block 12 reported from the stage unit 52 in real time, the main controller 50 feedback-controls the stage controller 52 and the second expansion mechanisms $112_1$ to $112_3$ composing the parallel link mechanism 74, and controls the expansions/contractions of the second rods $104_1$ to $104_3$ and the position/attitude, in three degrees of freedom Z, θx, θy, of the reticle base level block 12 to keep the position/attitude, in three degrees of freedom Z, θx, θy, of the reticle stage RST at a desirable state all the time. That is, in this way, the main controller 50 adjusts the relative position, in three degrees of freedom θx, θy, Z, of the reticle stage RST with respect to the projection optical system PL. Therefore, even when an offset load due to the movement of the reticle stage RST is exerted on the reticle base level block 12, the transfer position deviations, image blurs, etc., of the pattern-transferred image are effectively suppressed.

As described above, in the exposure apparatus 10 of the present embodiment, by the expandable first rods $78_1$ to $78_3$ composing the first mechanism of the parallel link mechanism 74 controlled by the main controller 50, the position/attitude, in three degrees of freedom θx, θy, Z, of the wafer base level block 38 can be controlled. Therefore, the position/attitude, in three degrees of freedom θx, θy, Z, of the wafer stage WST levitated above the wafer base level block 38 can be precisely controlled with desirable operational-characteristics and high rigidity. That is, in the exposure apparatus 10 without a Z-tilt driving mechanism on the wafer stage WST, by the expandable first rods $78_1$ to $78_3$, the Z-tilt driving of the wafer W held on the wafer stage WST and the relative position, in three degrees of freedom θx, θy, Z, of the wafer with respect to the projection optical system PL, i.e. focus leveling, can be precisely controlled with desirable operational-characteristics and high rigidity. In this case, the three first rods $78_1$ to $78_3$ support the wafer base level block 38 to be independent of the projection optical system PL. Therefore, even when the wafer base level block 38 vibrates due to the reaction to the driving force upon the drive of the wafer stage WST, the vibration hardly transmits to the projection optical system PL. Also, in this case, because the Z-tilt driving mechanism is unnecessary, it is possible to make the wafer stage WST more lightweight, and the driving force and driving reaction upon driving the wafer stage WST on the wafer base level block 38 by the wafer driver 40 comprising a planar motor can be reduced.

Furthermore, in the exposure apparatus 10 of the present embodiment, the exposure main portion controls the position/attitude, in three degrees of freedom Z, θx, θy, of the reticle base level block 12 by the expandable second rods $104_1$ to $104_3$ composing the second mechanism of the parallel link mechanism 74 controlled by the main controller 50. Therefore, the position/attitude, in three degrees of freedom θx, θy, Z, of the reticle stage RST levitated above the reticle base level block 12 can be precisely controlled with desirable operational-characteristics and high rigidity. That is, in the exposure apparatus 10, without a Z-tilt driving mechanism between the reticle stage RST and the reticle base level block 12, or on the reticle stage RST, the Z-tilt driving of the reticle R held on the reticle stage RST and the relative position, in three degrees of freedom θx, θy, Z, of the reticle with respect to the projection optical system PL, i.e. focus leveling, can be precisely controlled by the expandable second rods $104_1$ to $104_3$ with desirable operational-characteristics and high rigidity. Therefore, the deterioration of pattern images due to reticle R's defocus caused by an offset load, etc., exerted on the reticle base level block 12 upon the movement of the reticle stage RST can be prevented. In this case, the three second rods $104_1$ to $104_3$ support the reticle base level block 12 to be independent of the projection optical system PL. Therefore, even when the reticle base level block 12 vibrates due to the reaction to the driving force upon the drive of the reticle stage RST, the vibration hardly transmits to the projection optical system PL. Also, in this case, because the Z-tilt driving mechanism is unnecessary, it is possible to make the reticle stage RST more lightweight, and the driving force and driving reaction upon driving the reticle stage RST on the reticle base level block 12 by the reticle driver 14 comprising a linear motor can be reduced.

Also, in this case, the wafer stage WST, the reticle stage RST, and the projection optical system PL can be easily sealed from one another and easily maintained.

In the present embodiment, a focus sensor 73 and a wafer laser interferometer 24W fixed on the projection optical system PL constitute a position detector to detect the relative position, in six degrees of freedom, of the wafer W and the projection optical system. In the present embodiment, as described above, the driving reactions exerted on the wafer stage WST and the reticle stage RST are prevented from transmitting to the projection optical system PL. Therefore, with the position detector (the focus sensor 73 and the wafer laser interferometer 24W) fixed on the projection optical system PL, it is possible to precisely detect the positional relationship between the projection optical system PL and the wafer W.

Furthermore, a position detector to detect the relative position, in six degrees of freedom, between the reticle stage RST and the projection optical system PL comprises the reticle interferometers $24Ry_1$, $24Ry_2$, 24Rx that illuminate a movable mirror 22R provided on the reticle stage RST with a length measuring beam and detect the position, in three degrees of freedom θx, θy, Z, of the reticle stage RST, and the first to third interferometers $30_1$ to $30_3$ that illuminate a mirror 28 fixed on the reticle base level block 12 with a length measuring beam and detect the position, in three degrees of freedom θx, θy, Z, of the reticle base level block 12. In this case, the driving reactions exerted on the wafer stage WST and the reticle stage RST are prevented from transmitting to the projection optical system PL. Therefore, with the position detector (interferometers $24Ry_1$, $24Ry_2$, 24Rx, $30_1$ to $30_3$) fixed on the projection optical system PL, it is possible to precisely detect the positional relationship between the projection optical system PL and the reticle stage RST.

Furthermore, in the exposure apparatus 10 of the present embodiment, the first expansion mechanisms $94_1$ to $94_3$ and the second expansion mechanisms $112_1$ to $112_3$ that are respectively arranged in the first rods $78_1$ to $78_3$ and the second rods $104_1$ to $104_3$ each comprise the air cylinder 84 and the shaft motor 92, a kind of electromagnetic linear motor, that are arranged mutually in series (or in parallel). Therefore, the main controller 50 can drive the reticle base level block 12 coarsely and by larger distances by controlling the air pressure of the air cylinder 84, and also finely by the shaft motor 92. As a result, the main controller 50 can precisely adjust the positions/attitudes, in three degrees of freedom Z, θx, θy, of the wafer stage and the reticle stage, and then their relative positions with respect to the projection optical system PL in three degrees of freedom Z, θx, θy in a short time. That is, it is possible to perform a precise focus leveling operation in a short time.

Furthermore, because the first rods $78_1$ to $78_3$ and the second rods $104_1$ to $104_3$ each comprise the air pad 96 to support the magnetic pole unit 90 as the mover of the shaft motor 92 with respect to the armature unit 88 as its stator in a non-contact manner, in controlling the expansions and contractions of rods by the first and second expansion mechanisms, friction that works as a non-linear component can be avoided. Therefore, the positions/attitudes, in three degrees of freedom Z, θx, θy, of the wafer stage WST and the reticle stage RST can be more precisely controlled respectively via the wafer base level block 38 and the reticle base level block 12.

Moreover, in the exposure apparatus 10 of the present embodiment, the shaft motors 92's are employed as electromagnetic linear motors composing the first expansion mechanisms $94_1$ to $94_3$, the second expansion mechanisms $112_1$ to $112_3$, and the third expansion mechanisms $126_1$ to $126_3$, and in this shaft motor 92, the magnetic pole unit 90 including cylindrical magnets in its mover side is employed. Therefore, magnetic flux (magnetic field) is generated radially and in all directions, and this exposure apparatus can have the whole magnetic flux in all directions contribute to the generation of Lorentz force (driving force) by an electromagnetic interaction. And then, much larger thrust can be generated compared with a usual linear motor, etc., and it is possible to make it smaller than a hydraulic cylinder, etc.

Therefore, the parallel link mechanism 74 where rods each comprise the shaft motor 92 is preferably applied to the exposure apparatus 10 because its miniaturization and lightening, and the improvement of its output are realized at the same time.

Moreover, in the exposure apparatus 10 of the present embodiment, the main controller 50 can statically adjust the relative position, with respect to the projection optical system PL, of at least one of the wafer base level block 38 and the reticle base level block 12 by using the air cylinders 84's composing the first and second expansion mechanisms, and suppress vibrations by using the shaft motors 92's. Therefore, it is possible to adjust at least one of both stages WST, RST with respect to the projection optical system PL via at least one of the wafer base level block 38 and the reticle base level block and to suppress the vibrations of the wafer base level block 38 and the reticle base level block 12, which are caused by the expansions/contractions of the respective rods and the reactions due to the drives of the stages.

Furthermore, with the main controller 50, it is possible to suppress low-frequency vibrations by controlling the air pressures of the air cylinders 84's composing the first and second expansion mechanisms and to insulate high-frequency vibrations by controlling the currents of the shaft motors 92's. Therefore, it is possible to suppress the low-frequency vibrations of the wafer base level block 38 and the reticle base level block 12 due to the reactions to the drives of the stages and to insulate fine vibrations, high-frequency vibrations, from the floor surface.

Furthermore, the exposure apparatus 10 of the present embodiment comprises a reticle room 18 containing the reticle stage RST and partially including the reticle base level block 12, the lens room 32 containing the projection optical system PL, the wafer room 44 containing the wafer stage WST and partially including the wafer base level block 38, and the chamber 46 including expandable bellows-like members 34, 36 respectively linking the reticle room 18 and the lens room 32, and the lens room 32 and the wafer room 44 to isolate the wafer stage WST, the projection optical system PL, and the reticle stage RST from the outside atmosphere. Therefore, by the parallel link mechanism 74, the positions/attitudes, in three degrees of freedom Z, θx, θy, of the wafer base level block 38 and the reticle base level block 12 can be adjusted without any troubles. Moreover, because the wafer stage WST, the projection optical system PL, and the reticle stage RST are isolated from the outside atmosphere by the chamber 46, by filling the inside of the chamber 46 with a gas such as nitrogen ($N_2$) or helium (He), it is possible to transfer a fine pattern on the reticle onto the wafer using the ArF excimer laser or a vacuum ultraviolet having a shorter wavelength such as $F_2$ laser light.

With the exposure apparatus 10 of the present embodiment, with a number of schemes described above, it is possible to improve the lightening and the position controllability of the wafer stage WST and the reticle stage RST, and the exposure apparatus is excellent in the characteristics of suppressing vibrations of its units and isolating vibrations of the floor, has a large number of the degrees of freedom in adjusting the stages that can be separated from each other, and can perform exposure with high resolution with using $F_2$ laser light or an energy beam of a shorter wavelength in the atmosphere filled with a gas such as helium. And it is possible to manufacture highly integrated semiconductor devices, which have finer line widths, with high yield.

Incidentally, the above embodiment described the case where the projection optical system PL is supported by the three third rods $118_1$, $118_2$, $118_3$ composing the third mechanism of the parallel link mechanism. This is because the initial adjustment of the projection optical system PL can be easily done by individually controlling the third expansion mechanisms $126_1$, $126_2$, $126_3$ to respectively expand/contract the third rods $118_1$, $118_2$, $118_3$. However, because the projection optical system PL does not intrinsically need the change of its position/attitude afterward once its position/attitude is set at a desirable state, a supporting mechanism to support the projection optical system PL to be fixed on the floor surface FD may be provided instead of the third mechanism. Even in this case, because the positions/attitudes, in three degrees of freedom Z, θx, θy, of the wafer stage WST and the reticle stage RST, the positional relationships, in three degrees of freedom Z, θx, θy, of the wafer W and retcile R with respect to the projection optical system PL are adjustable.

Also, in the above embodiment, the third expansion mechanisms $126_1$ to $126_3$ each have the air cylinder and shaft motor, however, the third expansion mechanisms may each have only the air cylinder. Even in this case, the initial position/attitude of the projection optical system PL can be easily adjusted by adjusting the inside pressure of the air cylinder.

Furthermore, in the above embodiment, bilaterally telecentric optical-system is employed as the projection optical system PL. However, the present invention is not limited to this, not to mention. For example, as the projection optical system, an optical system that is non-telecentric in its object side may be employed. In such an optical system non-telecentric in its object side, although the defocus of the reticle R is one factor of the deviation of transfer position of the pattern image, the deviation of transfer position of the pattern image due to the defocus of the reticle R can be prevented because, in the above embodiment, the position, in three degrees of freedom Z, θx, θy, of the reticle R is controlled in the above manner.

Incidentally, in the above embodiment, the case where the first base members $76_1$, $76_2$, $76_3$, the second base member 102, and the third base members $114_1$, $114_2$, $114_3$ each are individual members was described. However, at least either the first base members or the third members may be one common member, or at least any two out of the first, second and third base members may be one common member. That is, all of the first, second and third base members may be one common member, or the first and second, the second and third, or the first and third base members may be one common member.

Moreover, in the above embodiment, the case was described where a stage is mounted both the wafer base level block 38 and the reticle base level block 12. However, a plurality of stages may be mounted at least either on the wafer base level block 38 or on the reticle base level block 12. For example, in a case where a plurality of wafer stages WST are mounted on the wafer base level block 38, during the exposure operation of one wafer on the wafer stage, change of wafers on another wafer stage, or other operations such as the detection of wafer alignment marks can be simultaneously performed. Therefore, the throughput can be improved compared with a case of having only one wafer stage. Also, for example, in a case where a plurality of reticle stages RST are mounted on the reticle base level block 12, because reticles can be changed by exchanging the positions of those plurality of reticle stages, it is possible to improve the throughput of such multi-exposure using a plurality of reticles as double exposure. Especially, in a case where a plurality of wafer stages WST and reticle stages RST are provided, during multi-exposure of a wafer on one wafer stage, such other operations as wafer change on another wafer stage and the detection of wafer alignment marks can be simultaneously performed. Therefore, such multi exposure using a plurality of reticles as double exposure can be performed with a high throughput.

Moreover, in the above embodiment, the case is described where the wafer base level block 38 and the reticle base level block 12 are respectively supported by the first mechanism and the second mechanism of the parallel link mechanism 74 so as to be controllable in their attitudes. However, the present invention is not limited to this, not to mention. That is, only one of the wafer base level block 38 and the reticle base level block 12 may be supported by the parallel link mechanism. Even in such a case, the position/attitude of a level block, which is supported by the parallel link mechanism and serves as an end-effector of the parallel link mechanism, can be controlled in the same manner as above, and as a result, the above effects are obtained.

Furthermore, the structure of the chamber 46 described in the above embodiment shows only one example, and the present invention is not limited to this, not to mention. That is, in the exposure apparatus of the present invention, any chamber can be used which contains at least one portion of the exposure apparatus's main portion (the reticle stage RST, the projection optical system PL, the wafer stage WST, etc.), which are supported by the parallel link mechanism, to be isolated from the outside atmosphere and allows the change of its attitude. In such a case, a portion of the exposure apparatus's main portion supported by the parallel link mechanism can be made lightweight by using the advantages of the parallel link mechanism, and its attitude can be precisely controlled with desirable operational-characteristics and high rigidity. Also, because the chamber houses at least one portion of the exposure apparatus's main portion to be isolated from the outside atmosphere and allowed to change its attitude, it is possible to transfer a fine pattern on the reticle onto the wafer using the ArF excimer laser or a vacuum ultraviolet having a shorter wavelength such as $F_2$ laser light by filling the inside of the chamber with a gas such as nitrogen ($N_2$) or helium (He).

Furthermore, in the above embodiment, at least a portion of the illumination optical system IOP may be supported by the parallel link mechanism.

A Second Embodiment

A second embodiment of the present invention will be described below with referring to FIGS. 9 to 17. Hereafter, the same or equivalent elements to those of the above first embodiment are represented by the same numbers, and for each of them, a brief or no description will be presented.

Moreover, the first and second embodiments can be employed in combination as the need arises.

Figure 9:
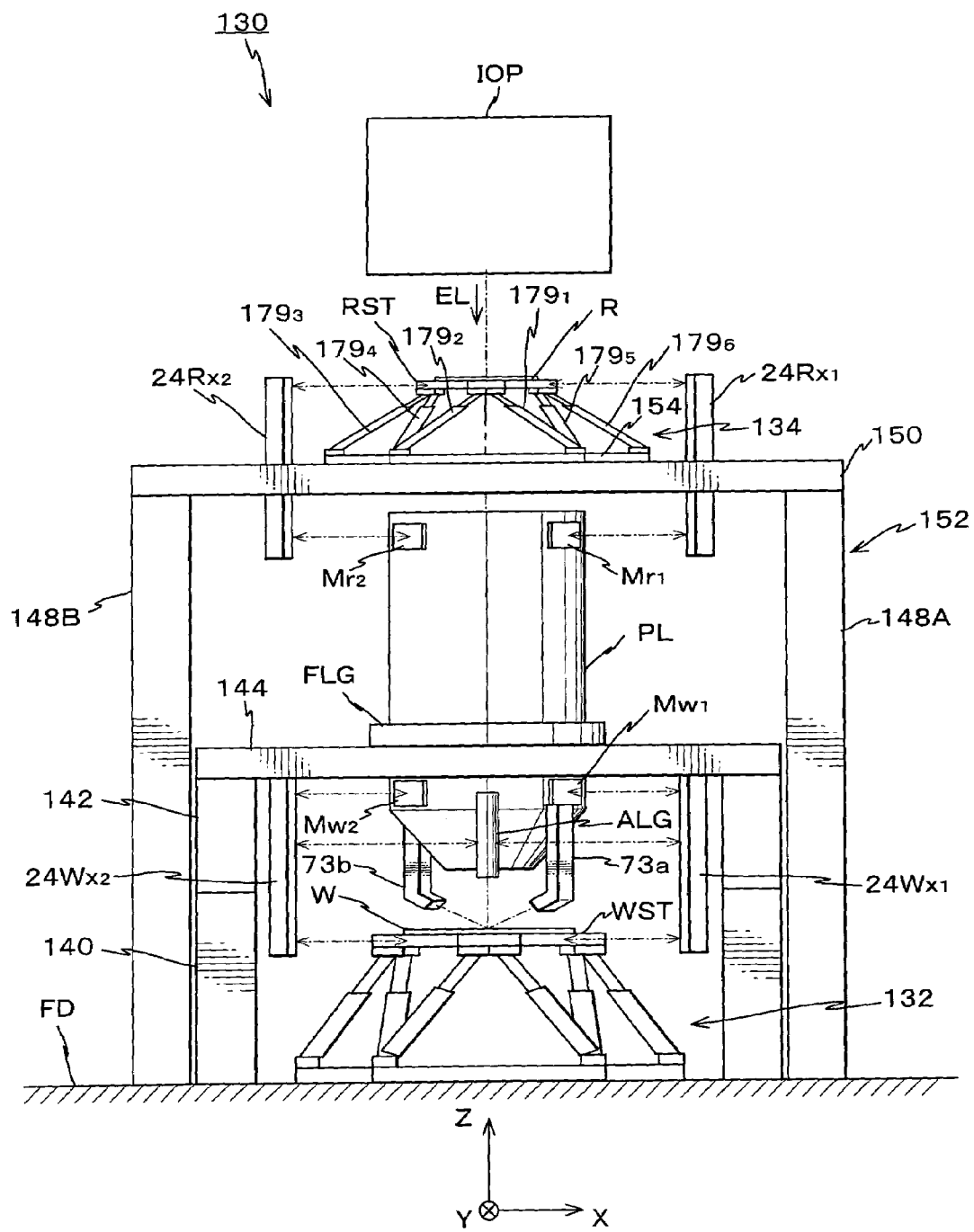
FIG. 9 is a schematic view showing the structure of an exposure apparatus according to the second embodiment.

FIG. 9 schematically shows an exposure apparatus 130 according to the second embodiment. This exposure apparatus is a scanning-type exposure apparatus based on a step-and-scan method, i.e. a scanning stepper, which transfers a pattern on a reticle onto a plurality of shot areas on a wafer while illuminating the reticle as a mask with an exposure illumination light EL and synchronously moving the reticle and the wafer as a substrate in a predetermined direction (hereafter, set to be Y axis direction perpendicular to the drawing of FIG. 9).

In this exposure apparatus 130, a reticle stage RST as a mask stage and a stage that is triangle in a planar view and serves as a substrate or wafer stage are employed, and its feature is that these stages are controlled in the six degrees of freedom X, Y, Z, θx, θy, θz by the parallel link mechanism.

This exposure apparatus 130 comprises an illumination optical system IOP, the reticle stage RST holding the reticle R, the wafer stage WST holding the wafer W, a first parallel link mechanism 132 including the wafer stage WST as an end-effector, a second parallel link mechanism 134 including the reticle stage RST as an end-effector, and the like.

Figure 10:
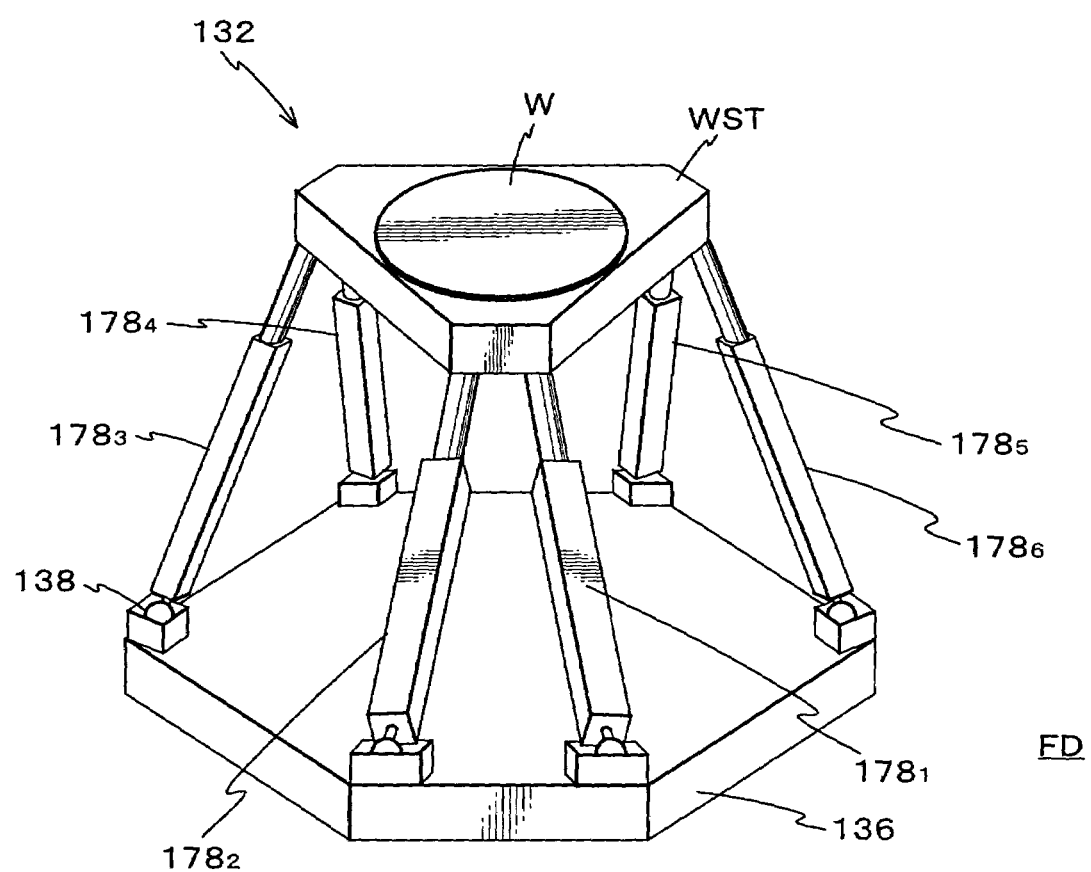
FIG. 10 is an oblique view showing the first parallel link mechanism of FIG. 9.

The first parallel link mechanism 132 comprises, as shown in FIG. 10, a first base member 136 that is almost horizontally arranged on the floor surface FD of a clean room and shaped in a regular hexagon; six expandable first rods $178_1$ to $178_6$ that each link the first base member 136 and the wafer stage; and first expansion mechanisms $194_1$ to $194_6$ (not shown in FIG. 9; refer to FIG. 17) that are mounted respectively in the first rods $178_1$ to $178_6$ and each expand/contract their first rod.

As the first rods $178_1$ to $178_6$, rods each comprising a first axis member and a second axis member that can relatively move in their axis direction in the same manner as the first rod $78_1$ in the above first embodiment are used. And the first axis member and second axis member composing each of the first rods $178_1$ to $178_6$ are relatively driven by respective one of first expansion mechanisms $194_1$ to $194_6$ that are the same as the first expansion mechanism $94_1$ consisting of the air cylinder and shaft motor. Also, linear encoders $95_1$ to $95_6$ (refer to FIG. 17), each of which employs a Hall device to detect the amount of movement of a magnetic pole unit with respect to an armature unit in a shaft motor composing respective one of the first expansion mechanisms $194_1$ to $194_6$, and air pads to levitate and support the magnetic ole unit with respect to the armature unit in a non-contact manner are mounted in the first rods $178_1$ to $178_6$.

In this case, as is obvious in FIG. 10, the both sides of each of the first rods $178_1$ to $178_6$ are connected respectively to the first base member 136 and the wafer stage WST via universal joints 138's. Also, the first rods $178_1$, $178_2$ are connected around a vertex of the triangle wafer stage WST, and the first base member 136 and the first rods $178_1$, $178_2$ form an almost triangle. In the same manner as this, the rods 1783, 1784 and the rods $178_5$, $178_6$ are respectively connected around the other vertices of the triangle wafer stage WST, and the first base member 136 and the rods $178_3$, $178_4$, and the first base member 136 and the rods $178_5$, $178_6$ each form an almost triangle.

Figure 17:
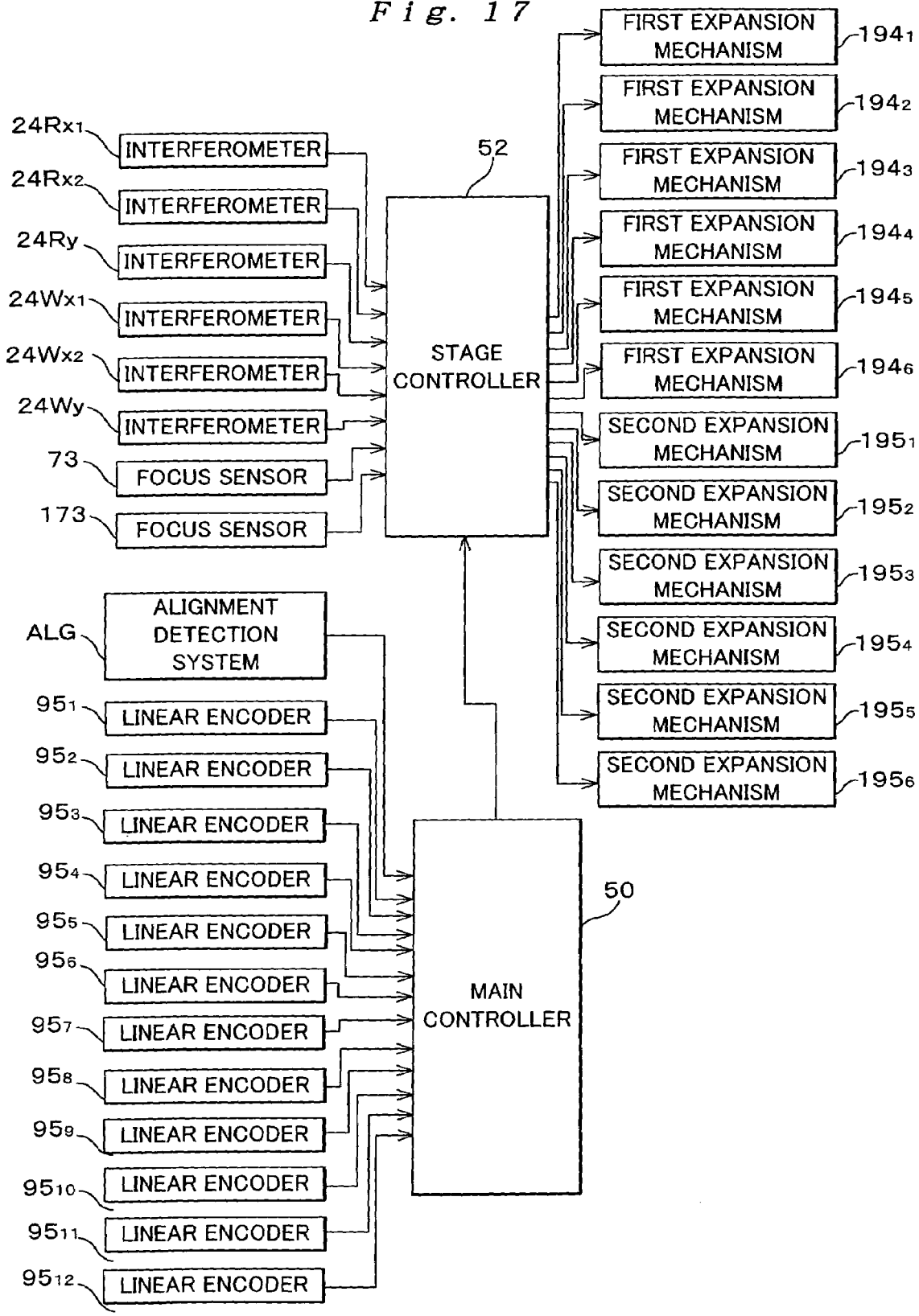
FIG. 17 is a block diagram showing the structure of a control system of an exposure apparatus according to the second embodiment.

The main controller 50 receives the outputs of the linear encoders $95_1$ to $95_6$ and controls the first expansion mechanisms $194_1$ to $194_6$ on the basis of the outputs of the linear encoders $95_1$ to $95_6$ via the stage controller 52 (refer to FIG. 17).

Referring back to FIG. 9, the projection optical system PL is held on a lens-barrel level block 144 almost horizontally supported via four columns 140 fixed on the floor surface FD and vibration preventing units 142 mounted on the columns 140.

The lens-barrel level block 144 is constituted of, e.g., castings, and an circular opening in a planar view is formed in its center and the projection optical system PL is inserted into the opening from above such that its optical axis coincides with the Z axis direction. On the periphery of the projection optical system PL, a flange FLG, which is integrated with the lens-barrel, is provided. As a material of this flange FLG, a material of low thermal expansion such as inver (an iron-alloy with nickel 36%, manganese 0.25%, and a small amount of carbon and other elements) is used, and this flange FLG composes a kinematic supporting mount supporting the projection optical system PL against the lens-barrel level block 144 at three points via points, surfaces, and V-shape grooves. By using such a kinetic supporting structure, it is easy to attach the projection optical system PL to the lens-barrel level block 144, and there is also an advantage that after the attachment, stress due to vibrations, the temperature changes, attitude changes, and the like of the lens-barrel level block 144 and the projection optical system PL can be reduced most effectively.

In this case, the vibration-preventing unit 142 insulates fine vibrations transmitted from the floor surface to the lens-barrel level block 144 at micro G level. In the present embodiment, the supporting column 140, the vibration-preventing unit 142, and the lens-barrel level block 144 compose a supporting mechanism to fix and support the projection optical system PL on the floor surface FD where the main portion of the exposure apparatus is arranged.

Figure 11:
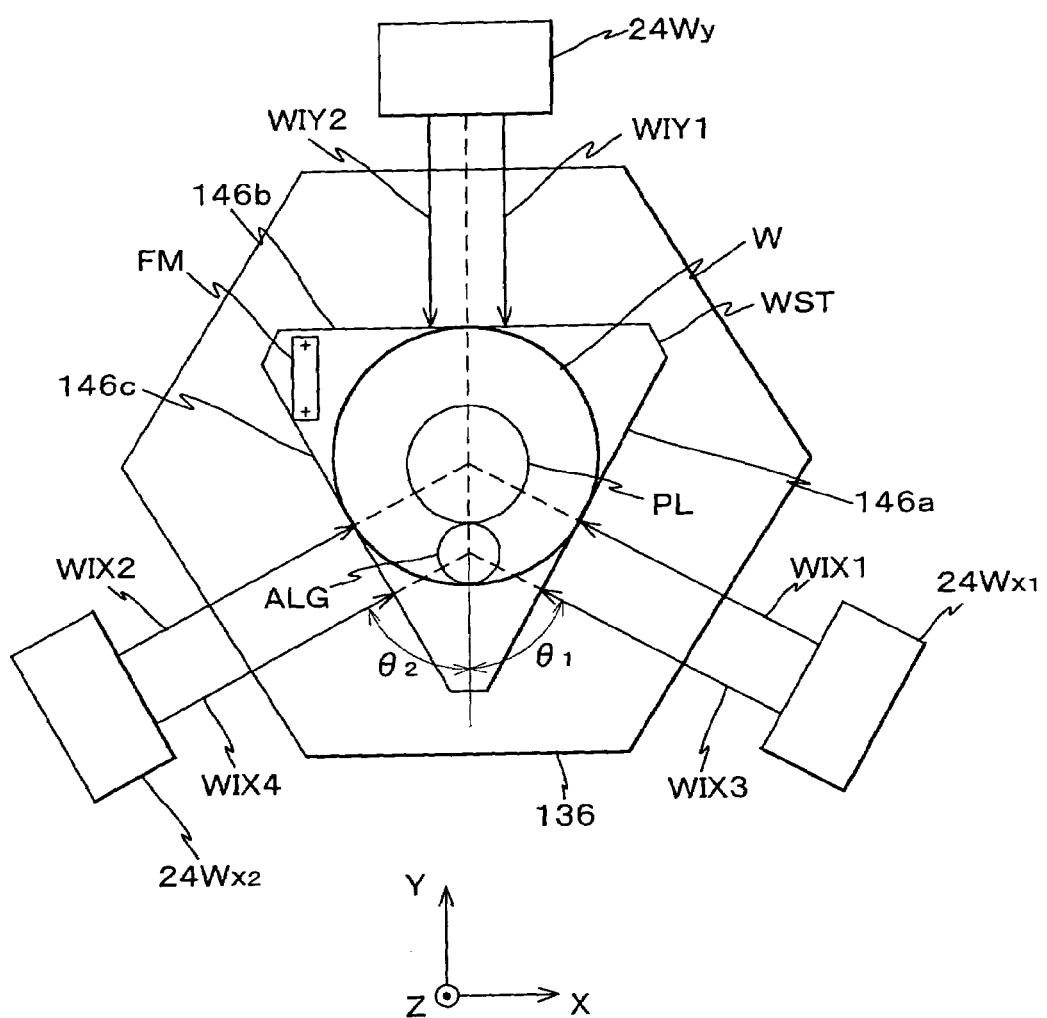
FIG. 11 is a planar view showing a wafer laser interferometer system to detect the position, in X-Y plane, of the wafer stage of FIG. 9.

On the wafer stage WST, the wafer W is held by chucking, and the position of the wafer stage in X-Y plane is detected with resolution of 0.5 to 1 nm by the wafer laser interferometer system consisting of the three interferometers $24Wx_1$, $24Wx_2$, 24Wy shown in FIG. 11.

To be more specific, the interferometer $24Wx_1$ is fixed on the lens-barrel level block 144 and hangs from it. And a first reflection surface 146a formed on the side surface of the wafer stage WST is vertically illuminated with measurement beams WIX1, WIX3 in a direction forming a predetermined angle $\theta_1$ (hereafter, +60°) with respect to the Y axis. The measurement beam WIX1 is shined toward the optical axis of the projection optical system PL. A fixed mirror Mw1, on which a reference beam corresponding to this measurement beam WIX1 is incident, is fixed on the side surface of the projection optical system PL (refer to FIG. 9), and the measurement beam WIX3 is shined toward the detection center of an off-axis-alignment detection system ALG. A fixed mirror (not shown) on which a reference beam corresponding to this measurement beam WIX3 is incident is fixed on the side surface of an off-axis-alignment detection system ALG.

Furthermore, the interferometer $24Wx_2$ is fixed on the lens-barrel level block 144 and hangs from it. And a third reflection surface 146c formed on the side surface of the wafer stage WST is vertically illuminated with measurement beams WIX2, WIX4 in a direction forming a predetermined angle $\theta_2$ (hereafter, −60°) with respect to the Y axis. The extension line of the optical path of the measurement beam WIX2 crosses the extension line of the exposure light of the measurement beam WIX1. A fixed mirror Mw2, on which a reference beam corresponding to this measurement beam WIX2 is incident, is fixed on the side surface of the projection optical system PL (refer to FIG. 9), and the extension line of the optical path of the measurement beam WIX4 crosses the extension line of the optical path of the measurement beam WIX3 at the center of the off-axis-alignment detection system ALG. A fixed mirror (not shown) on which a reference beam corresponding to this measurement beam WIX4 is incident is fixed on the side surface of an off-axis-alignment detection system ALG.

Moreover, the interferometer 24Wy is fixed on the lens-barrel level block 144 and hangs from it. And a second reflection surface 146b formed on the side surface of the wafer stage WST is vertically illuminated with measurement beams WIY1, WIY2 in the Y axis direction. These measurement beams WIY1, WIY2 pass along optical paths bilaterally symmetric with respect to the Y axis between the optical axis of the projection optical system PL and the detection center of the alignment detection system ALG. A fixed mirror (not shown) on which reference beams corresponding to these measurement beams WIY1, WIY2 are incident is fixed on the side surface of the projection optical system.

The measurement values of the above interferometers $24Wx_1$, $24Wx_2$, 24Wy are supplied to the stage controller 52 nd then the main controller 50 (refer to FIG. 17). The stage controller 52 calculates the Y position of the wafer stage WST on the basis of the average value of measurement values by the measurement beams WIY1, WIY2 of the interferometer 24Wy, and calculates the θz rotation (yawing) of the wafer stage WST on the basis of the difference of the above two measurement values and the distance between the measurement axes.

Furthermore, the stage controller 52 calculates the X position of the wafer stage WST on the basis of a measurement value X1 of the interferometer $24Wx_1$ and a measurement value X2 of the interferometer $24Wx_2$ using the following equation (33).

$$X=\{(X1/|\sin \theta_1|)-(X2/|\sin \theta_2|)\}/2 \quad (33)$$

Because $|\sin \theta_1|=|\sin \theta_2|=\sin \theta$, the X coordinate position of the wafer stage WST is given by $$X=(X1-X2)/(2 \sin \theta) \quad (33').$$

Note that because it is important to avoid a so-called Abbe error, upon exposure operation, the stage controller 52 calculates the X position of the wafer stage WST using the above equation (33') on the basis of the measurement values by the measurement beams WIX1, WIX2 shined from the interferometers $24Wx_1$, $24Wx_2$ toward the optical axis of the projection optical system PL, and upon alignment, calculates the X position of the wafer stage WST using the above equation (33') on the basis of the measurement values by the measurement beams WIX3, WIX4 shined from the interferometers $24Wx_1$, $24Wx_2$ toward the detection center of the alignment detection system ALG.

The positional information, in the degrees of freedom X, Y, θz, of the wafer stage WST obtained above is reported from the stage controller 52 to the main controller 50 in real time.

Incidentally, in the present embodiment, it is preferable to compose the interferometer having a measurement axis corresponding to each of measurement beams to have a so-called double-path structure so as to prevent fine yawing (θz rotation) of the wafer stage from affecting the accuracy of exposure, and it is also preferable to compensate for a so-called Abbe error due to the difference in height between the interferometer measurement axis and the surface of the wafer W. Specifically, it is preferable to make other measurement beams incident, for example, below or above the measurement beams WIX1, WIX2 and WIY1 (or WIY2), measure the pitching and rolling of the wafer stage WST, and correct X-Y position information of the wafer stage WST calculated above on the basis of these results.

On the upper surface of the wafer stage WST, as shown in FIG. 11, a reference mark plate FM where reference marks for base line measurement and other reference marks of the alignment detection system are formed is arranged.

Referring back to FIG. 9, the second parallel link mechanism 134 is mounted on a gate-shape frame 152 constituted of a pair of vertical members 148A, 148B and a horizontal plate 150 supported by these vertical members 148A, 148B. The horizontal plate 150 has an opening in a predetermined shape formed in its almost center.

The second parallel link mechanism 134 is structured in the same way as the first parallel link mechanism 132. That is, the second parallel link mechanism 134 comprises a second base member 154 that is arranged on the gate-shape frame 152, has an opening, which is almost equal to the opening of the horizontal plate 150 in shape and size, formed in its center, and is shaped in a regular hexagon; six expandable second rods $179_1$ to $179_6$ that each link the second base member 154 and the reticle stage RST via their universal joints; and second expansion mechanisms $195_1$ to $195_6$ (not shown in FIG. 9; refer to FIG. 17) that are mounted respectively in the second rods $179_1$ to $179_6$ and each expand/contract their second rod. As the second rods $179_1$ to $179_6$, rods having the same structure as the first rod $78_1$ are employed, and as the second expansion mechanisms $195_1$ to $195_6$, mechanisms having the same structure as the first expansion mechanism $94_1$ are employed. Linear encoders $95_7$ to $95_{12}$ each of which employs a Hall device to detect the amount of movement of a magnetic pole unit with respect to an armature unit in shaft motor composing respective one of the first expansion mechanisms $195_1$ to $195_6$, and air pads to levitate and support the magnetic pole unit with respect to the armature unit in a non-contact manner are mounted in the second rods $179_1$ to $179_6$.

The output of the linear encoders $95_7$ to $95_1$ are supplied to the main controller 50, and based on the output of the linear encoders $95_7$ to $95_{12}$, the main controller 50 controls the second expansion mechanisms $195_1$ to $195_6$ via the stage controller 52 (refer to FIG. 17).

The position of the reticle stage RST in the X-Y plane is detected by three interferometers $24Rx_1$, $24Rx_2$, $24Ry$ (the interferometer 24Ry located at the back of the drawing is not shown in FIG. 9; refer to FIG. 17) fixed on the horizontal plate 150 of the gate-shape frame 152, e.g., with resolution of 0.5 to 1 nm. This position is detected with fixed mirrors $Mr_1$, $Mr_2$, $Mr_3$ (the mirror $Mr_3$ located at the back of the drawing is not shown) as references fixed on the side surface of the lens-barrel of the projection optical system PL. In the same way as the above, the stage controller 52 calculates the position, in the degrees of freedom X, Y, θz, of the reticle stage RST, and the positional information, in the degrees of freedom X, Y, θz, of the reticle stage RST is reported from the stage controller 52 to the main controller 50 in real time.

As the alignment detection system ALG, for example, an imaging-type alignment sensor is employed which illuminates alignment marks (or the reference mark plate FM) on the wafer with a broad band light, receives its reflection light, and detects the marks by image processing. The details of such an imaging-type alignment sensor are disclosed in Japanese Patent Laid-Open No. 7-321030, U.S. Pat. No. 5,721,605 corresponding thereto, and the like. The disclosures in the above Japanese Patent Laid-Open and U.S. patent are incorporated herein by this reference as long as the national laws in designated states or elected states, to which this international application is applied, permit.

The measurement values of the alignment detection system ALG are supplied to the main controller 50 (refer to FIG. 17).

Incidentally, as the alignment detection system ALG, an alignment sensor of LIA (Laser Interferometric Alignment) method may be used which illuminates grating marks on a wafer with a laser light in two directions, has their diffracted lights interfere with each other, and detects the positions of the grating marks on the basis of the phase of the interfered light.

Furthermore, a focus sensor 73 (73a, 73b) is arranged on the side surface of the projection optical system PL; the outputs of the focus sensor 73 are supplied to the stage controller 52, and the stage controller 52 calculates the relative position, with respect to the projection optical system PL, of the wafer in the degrees of freedom Z, θx, θy, specifically, Z position (an amount of defocus), θx rotation (an amount of pitching), θy rotation (an amount of rolling), of the exposure area on the wafer surface on the basis of the outputs of the focus sensor 73. These results, i.e. focus leveling measurement results, of the exposure area of the wafer are reported to the main controller 50 in real time.

Moreover, a focus sensor 173 (not shown in FIG. 9; Refer to FIG. 17) that is a multi focal position detection system, being the same as the focus sensor 73, and detects Z position of the pattern surface of the reticle with respect to the projection optical system PL is arranged around the reticle stage RST, and the output of the focus sensor 173 is supplied to the stage controller 52. Then the stage controller 52 calculates the relative position, with respect to the projection optical system PL, of the reticle in the degrees of freedom Z, θx, θy, in other words, Z position (an amount of defocus), θx rotation (an amount of pitching), θy rotation (an amount of rolling), of the pattern surface of the reticle on the basis of the outputs of the focus sensor 173. These results, i.e. focus leveling measurement results, of the reticle are reported to the main controller 50 in real time.

Next, the principle of controlling the position/attitude of a driven body in the six degrees of freedom X, Y, Z, θx, θy, θz by a driving system that has six rods like the parallel link mechanism of the present embodiment will be described below.

Figure 12:
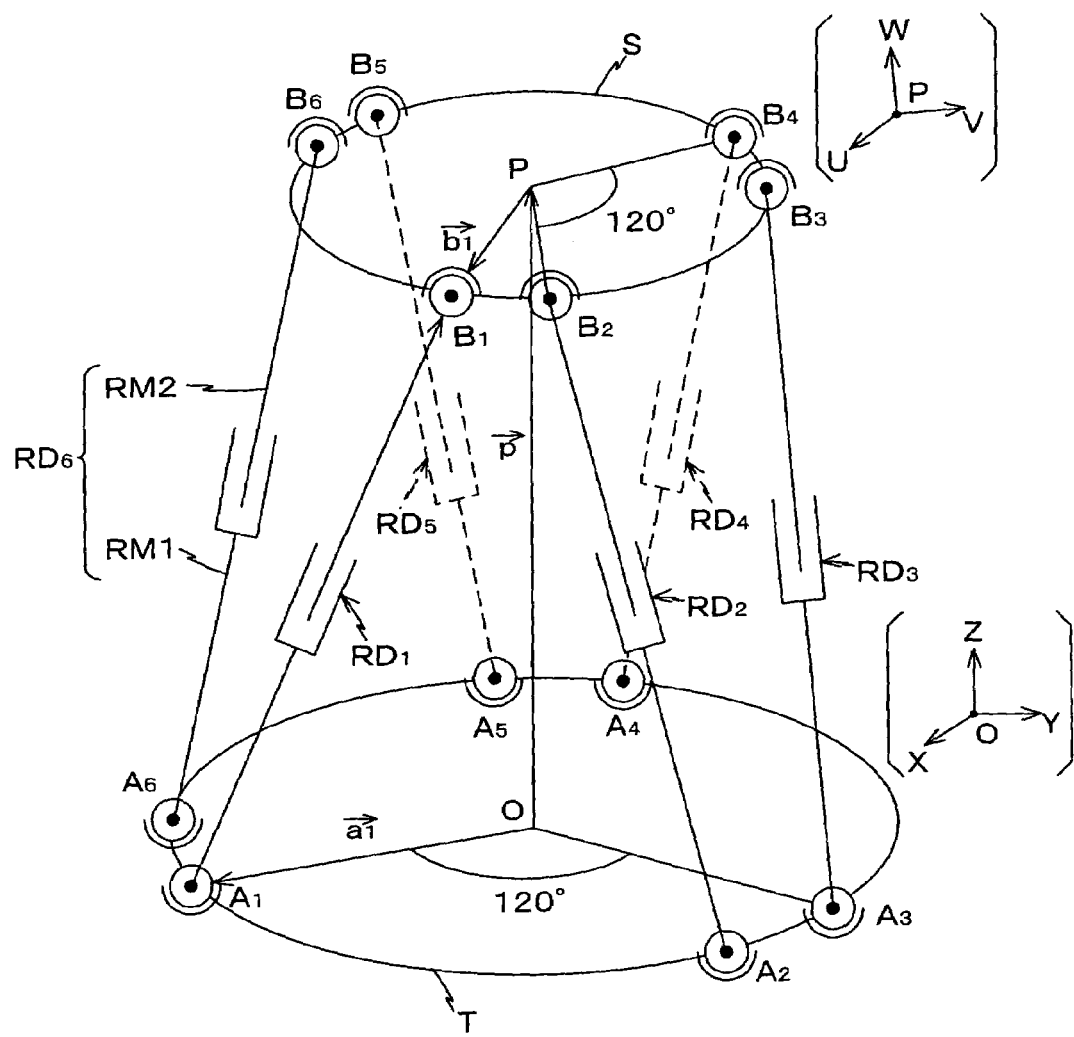
FIG. 12 is a schematic view showing the structural model of a driving system so as to explain the principle of the control of a parallel link mechanism in an exposure apparatus according to the second embodiment.

As such a driving system, consider a driving system, as schematically shown in FIG. 12, comprising a stationary member T, a driven body S, a stator side member RM1, a mover side member RM2 and expandable rods $RD_i$ (i=one to six) linking six points $A_i$ (i=one to six) of the stationary member T and six points $B_i$ (i=one to six) of the driven body S. Hereafter, six points $A_i$ (i= one to six) are located in one plane and a stationary coordinate XYZ is so defined that that plane is its X-Y plane and the center of those points is its origin O, and six points $B_i$ (i=one to six) are located in one plane and a stationary coordinate UYW is so defined that that plane is its U-V plane and the center of those points is its origin P. Note that the expansion/contraction of each rod $RD_i$ is generated by its mover side member RM2 moving along the straight line between the point $A_i$ and the point $B_i$.

Figure 5:
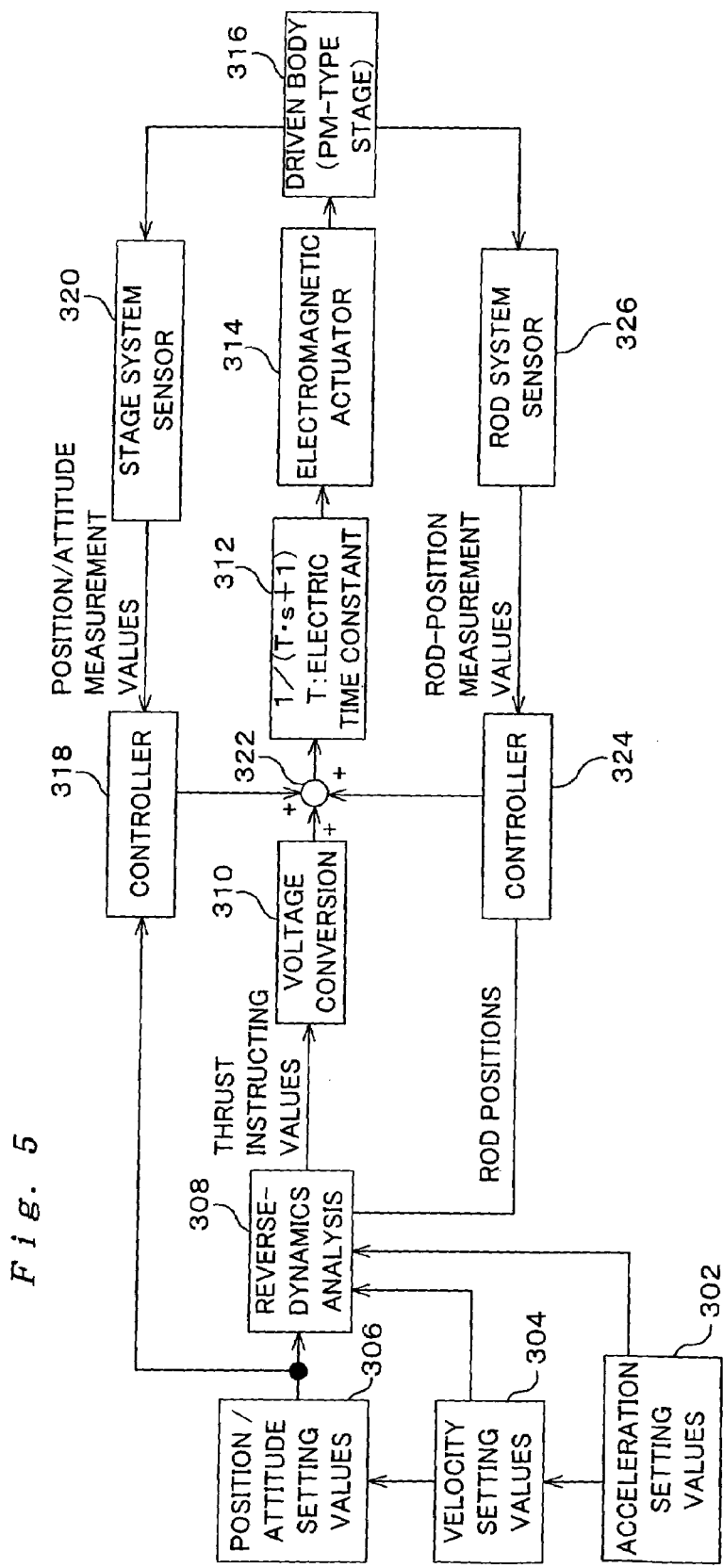
FIG. 5 is a block diagram showing a control model for the driving system of FIG. 4.

In the present embodiment, in the driving system of FIG. 12, a control system, the block diagram of which is obtained by extending that in FIG. 5 for the three degrees of freedom into the six degrees of freedom, controls the position/attitude in the six degrees of freedom X, Y, Z, θx, θy, θz.

That is, initial values of the velocity-setting portion 304 and the position/attitude-setting portion 306 are set to current values for the position/attitude (X, Y, Z, θx, θy, θz) of the driven body S in the six degrees of freedom X, Y, Z, θx, θy, θz and velocities (dX/dt, dY/dt, dZ/dt, dθx/dt, dθy/dt, dθz/dt), and initial values of the acceleration-setting portion 302 are set to desirable acceleration values for controlling the position/attitude ($d^2X/dt^2$, $d^2Y/dt^2$, $d^2Z/dt^2$, $d^{2⁰}θx/dt^2$, $d^{2⁰}θy/dt^2$, $d^2 θz/dt^2$). After that, until a new initial setting, only the acceleration-setting portion 302 is updated time after time. Meanwhile, in the velocity-setting portion 304, its setting values are each set to the sum of their initial value and the integration of acceleration values from the acceleration-setting portion 302, and in the position/attitude-setting portion 306, its setting values are each set to the sum of their initial value and the integration of velocity values from the velocity-setting portion 304.

At each time, in the same way as in the three degrees of freedom described previously, a reverse-dynamics analyzing portion 308 analyzes the acceleration-setting values of the acceleration-setting portion 302, the velocity-setting values of the velocity-setting portion 304, and the position/attitude-setting values of the position/attitude-setting portion 306 that are set in this way and input thereto, and based on the results of this analysis, the reverse-dynamics analyzing portion 308 determines instructing values of thrusts for the each rod $RD_i$. In the same way as in the three degrees of freedom described previously, the position/attitude of the driven body S in the six degrees of freedom is controlled.

Next, a way where the first parallel link mechanism 132 controls the position/attitude of the wafer stage WST in the six degrees of freedom will be described below with referring to FIG. 13 to FIG. 16.

Figure 13:
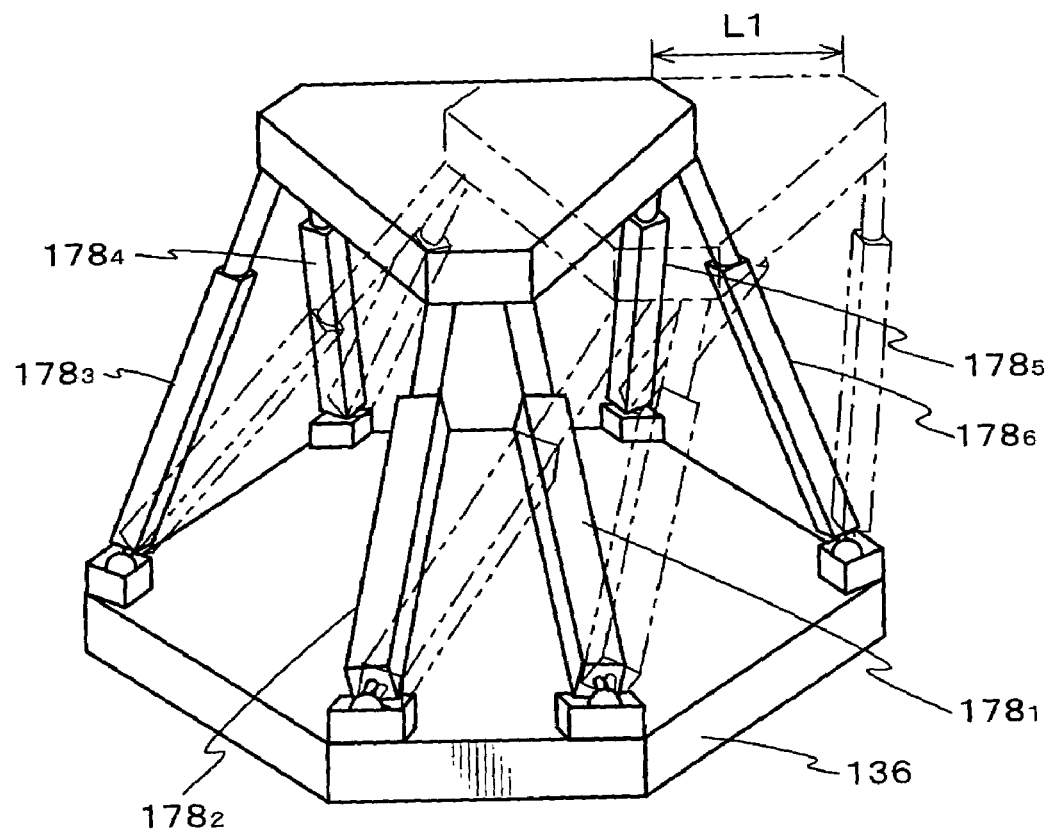
FIG. 13 is a view showing a state that the wafer stage is driven in X-axis direction by the first parallel link mechanism.

The main controller 50 can move the wafer stage WST by a distance L1 in a non-scanning direction, i.e. the X-direction, by controlling the expansion/contraction of the first rods $178_1$ to $178_6$ via the first expansion mechanisms $194_1$ to $194_6$ and, e.g., changing a state of the first rods $178_1$ to $178_6$ shown by solid lines in FIG. 13 to another state shown by virtual lines (two-dot chain lines). In the same way as this, the main controller 50 can move the wafer stage WST in a scanning direction, i.e. the Y-direction, by appropriately controlling the expansions/contractions of the first rods $178_1$ to $178_6$ via the first expansion mechanisms $194_1$ to $194_6$.

Figure 14:
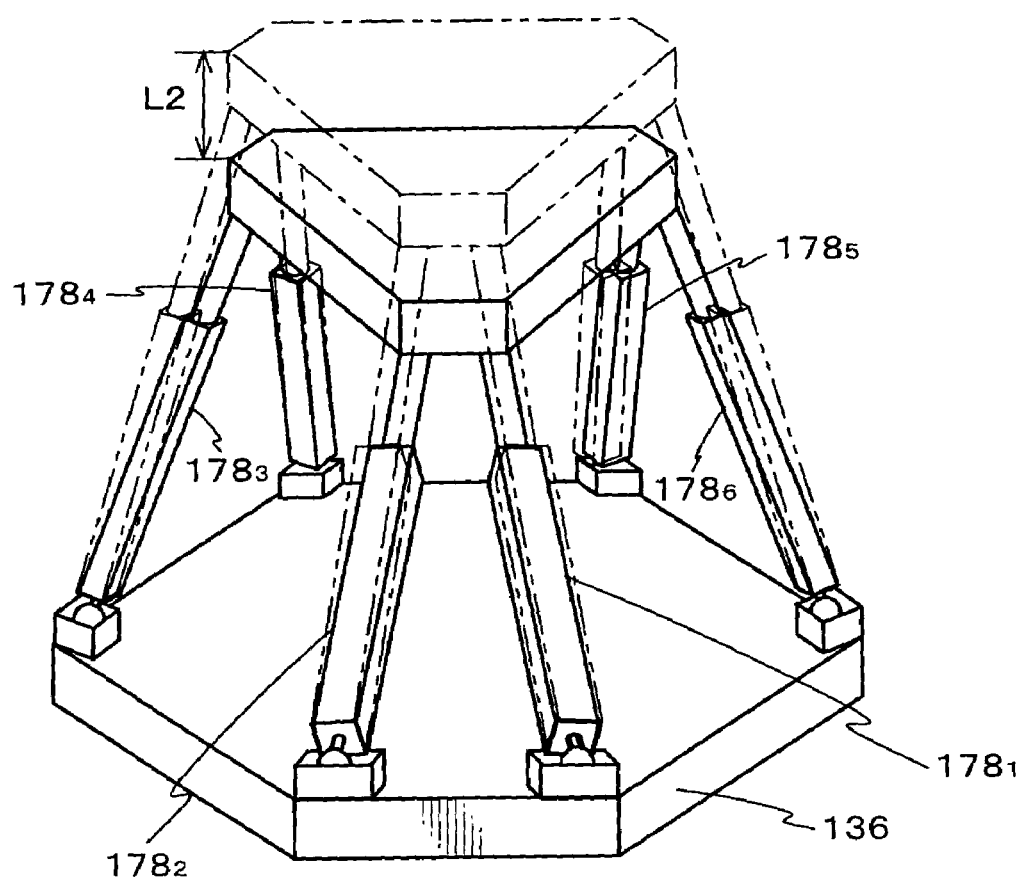
FIG. 14 is a view showing a state that the wafer stage is driven in Z-axis direction by the first parallel link mechanism.

Furthermore, the main controller 50 can move the wafer stage WST by a distance L2 upwards in Z-axis direction by controlling the expansions/contractions of the first rods $178_1$ to $178_6$ via the first expansion mechanisms $194_1$ to $194_6$ and, e.g., changing a state of the first rods $178_1$ to $178_6$ shown by solid lines in FIG. 14 to another state shown by virtual lines (two-dot chain lines). Note that there is no possibility of the interferometer's measurement-beam getting out of the reflection surface due to the up/down movement of the wafer stage because a stroke of movement in Z-axis direction is, e.g., about 100 um in practice.

Figure 15:
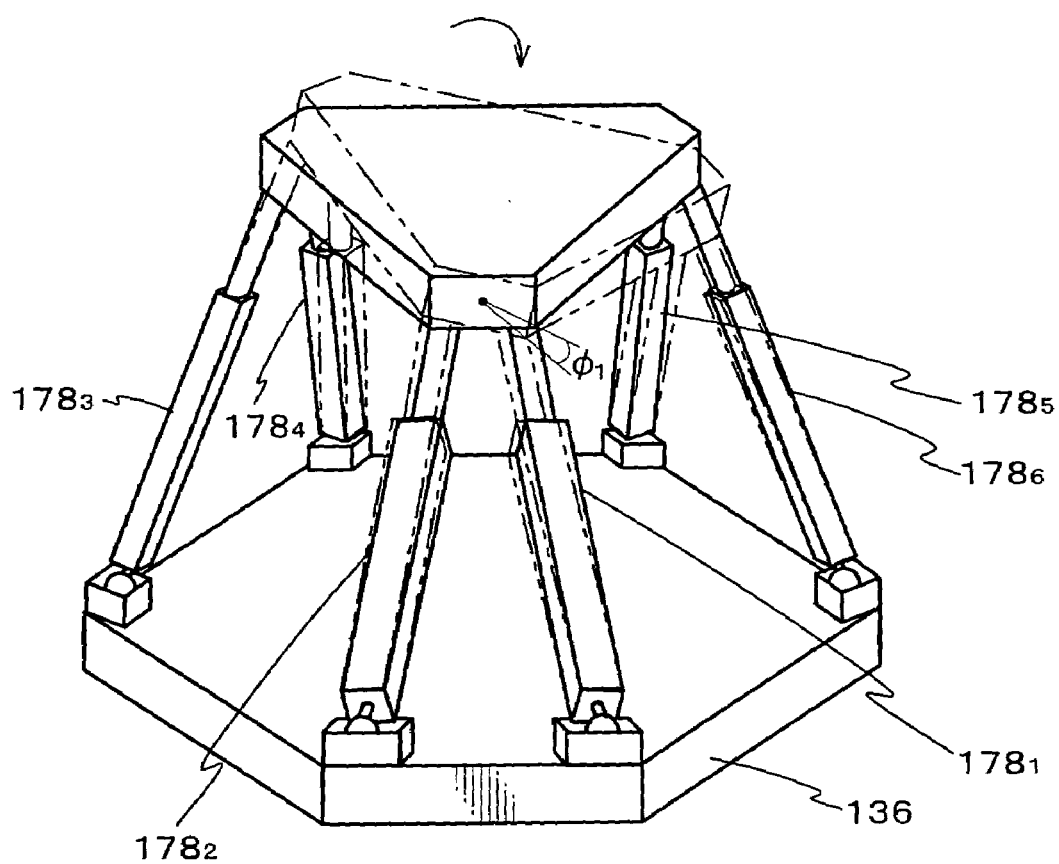
FIG. 15 is a view showing a state that the rolling of the wafer stage is controlled by the first parallel link mechanism.

Moreover, the main controller 50 can rotate the wafer stage WST through a fine angle $φ_1$ about the Y-axis passing through the gravity center of the wafer stage by controlling the expansions/contractions of the first rods $178_1$ to $178_6$ via the first expansion mechanisms $194_1$ to $194_6$ and changing a state of the first rods $178_1$ to $178_6$ shown by solid lines in FIG. 15 to another state shown by virtual lines (two-dot chain lines). Therefore, θy rotation (an amount of rolling) of the wafer stage WST is adjustable. In the same way as this, the main controller 50 can adjust θx rotation (an amount of pitching) of the wafer stage WST by appropriately controlling the expansions/contractions of the first rods $178_1$ to $178_6$ via the first expansion mechanisms $194_1$ to $194_6$.

Figure 16:
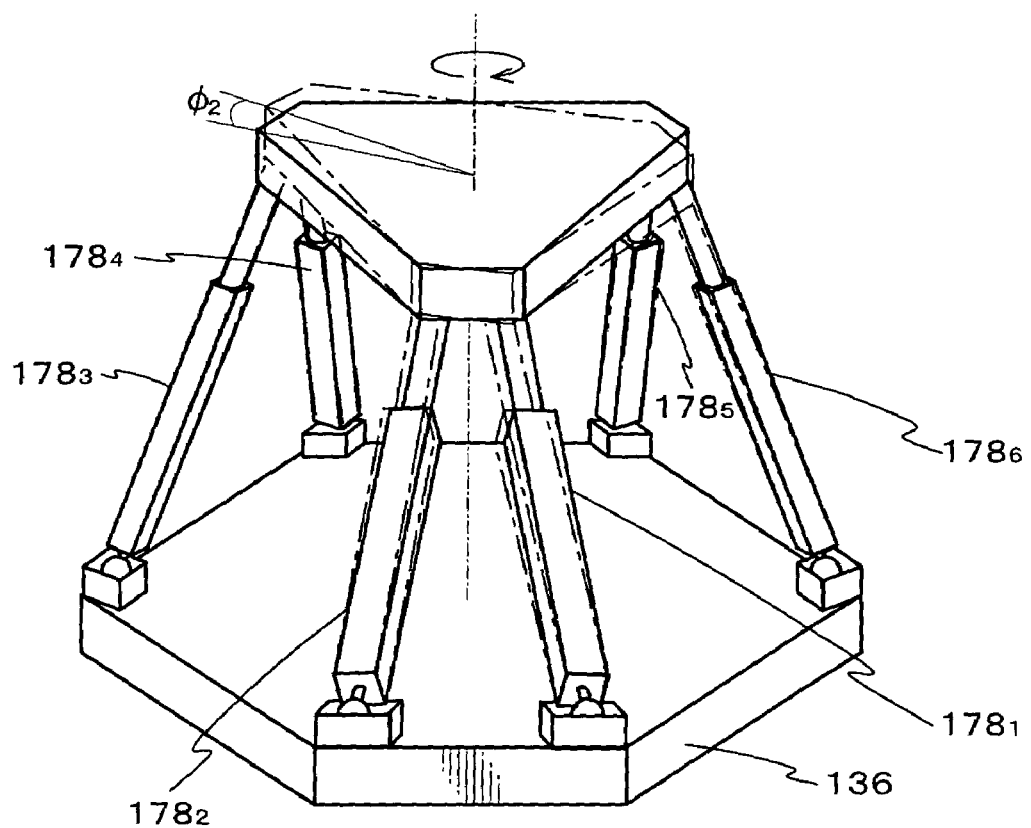
FIG. 16 is a view showing a state that the yawing of the wafer stage is controlled by the first parallel link mechanism.

Also, the main controller 50 can rotate the wafer stage WST through a fine angle $φ_2$ about the Z-axis passing through the gravity center of the wafer stage by controlling the expansions/contractions of the first rods $178_1$ to $178_6$ via the first expansion mechanisms $194_1$ to $194_6$ and, e.g., changing a state of the first rods $178_1$ to $178_6$ shown by solid lines in FIG. 16 to another state shown by virtual lines. Therefore, θz rotation (an amount of yawing) of the wafer stage WST is adjustable.

As described above, in the present embodiment, the position/attitude of the wafer stage WST in the six degrees of freedom can be controlled by the first parallel link mechanism 132.

In the same way as the above, the main controller 50 can control the position/attitude of the reticle stage RST in the six degrees of freedom by appropriately controlling the expansions/contractions of the six second rods $179_1$ to $179_6$ of the second parallel link mechanism 134 via the first expansion mechanisms $195_1$ to $195_6$.

FIG. 17 schematically shows the structure of the control system of the exposure apparatus 130. this control system in FIG. 17 is composed of the main controller 50 and the stage controller 52 as its main portion each of which is a microcomputer or workstation.

Next, the operation of exposure by the exposure apparatus 130 of the present embodiment will be described below with referring to FIG. 17, etc.

First, in the same manner as the first embodiment, after preparation such as reticle alignment and base line measurement using a reticle microscope, an alignment detection system ALG, a reference mark plate FM, and the like (all are not shown), a fine alignment (EGA (enhanced global alignment) etc.) of a wafer W using the alignment detection system ALG is completed, and then the arrangement coordinates of a plurality of shot areas on the wafer are obtained. During such preparations, the main controller 50 moves the wafer stage WST via the stage controller 52 by using the above driving principle and controlling the first expansion mechanisms $194_1$ to $194_6$ composing the first parallel link mechanism 132.

Next, using the above driving principle, on the basis of the positional information, in the degrees of freedom X, Y, θz, of the reticle stage RST reported from the stage unit 52 in real time, the main controller 50 controls the expansions/contractions of the second rods $179_1$ to $179_6$ via the stage controller 52 by using the second expansion mechanisms $195_1$ to $195_6$ composing the second parallel link mechanism 134, moves the reticle stage RST, and positions the reticle R at the scanning start point in the Y direction. In the same way, using the above driving principle, on the basis of the positional information, in the degrees of freedom X, Y, θz, of the wafer stage WST reported from the stage unit 52 in real time, the main controller 50 controls the expansions/contractions of the first rods $178_1$ to $178_6$ via the stage controller 52 by using the first expansion mechanisms $194_1$ to $194_6$ composing the first parallel link mechanism 132, moves the wafer stage WST, and positions a corresponding shot area on the wafer W at the scanning start point in the Y direction.

Then using the above driving principle, on the basis of the positional information, in the degrees of freedom X, Y, θz, of the reticle stage RST and the wafer stage WST reported from the stage unit 52 in real time, the main controller 50 synchronously moves the reticle stage RST and the wafer stage WST in mutually opposite directions at a velocity ratio corresponding to the projection magnification by controlling the first and second parallel link mechanisms 132, 134, and scanning exposure is performed.

On this scanning exposure, the main controller 50 controls the velocities of the six first rods 178 and the six second rods 179, respectively composing the first parallel link mechanism 132 and the second parallel link mechanism 134, as a consequence of the positional control of each stage based on the above driving principle.

By the above operation, one-scan exposure (one shot exposure) of the reticle R is completed.

Next, according to instructions from the main controller 50, the stage controller 52 steps the wafer stage WST by one row of shot areas in the X direction, and scans the wafer stage WST and the reticle stage RST each in an opposite direction to their previous direction, and performs scanning exposure onto other shot areas on the wafer.

During the above scanning exposure, on the basis of the measurement results of focus and leveling in the exposure area on the wafer reported from the stage controller 52 in real time, the main controller 50 calculates such Z, θx, θy of the wafer stage WST as the exposure areas are kept within the range of the focus depth of the projection optical system PL by, calculates acceleration values to realize the position/ attitude given by those values, and gives them to the stage unit 52. By this, on the basis of the acceleration values, the stage controller 52 controls the first expansion mechanisms $194_1$ to $194_6$ composing the first parallel link mechanism 132, controls the expansions/contractions of the first rods $178_1$ to $178_6$, and controls the position/attitude in three degrees of freedom Z, θx, θy of the wafer stage WST and its position/attitude in the degrees of freedom X, Y, θz simultaneously. That is, in this way, the adjustment of the relative position, in three degrees of freedom Z, θx, θy, between the projection optical system and the wafer W (wafer stage WST), i.e. a focus leveling control, is precisely performed to prevent the deterioration of pattern-transferred images due to defocus as much as possible.

Furthermore, during the above scanning exposure, on the basis of the measurement results of focus and leveling in the exposure area on the wafer reported from the stage controller 52 in real time, the main controller 50 calculates Z, θx, θy of the reticle stage RST, calculates acceleration values to realize the position/attitude given by those values, and gives them to the stage unit 52 to keep the position/attitude, in the degrees of freedom Z, θx, θy, of the reticle stage RST at a desirable state. On the basis of the acceleration values, the stage controller 52 controls the second expansion mechanisms $195_1$ to $195_6$ composing the parallel link mechanism 134, controls the expansions/contractions of the second rods $179_1$ to $179_6$, and controls the position/attitude in three degrees of freedom Z, θx, θy of the reticle stage RST and its position/attitude in the degrees of freedom X, Y, θz simultaneously. That is, in this way, the relative position, in three degrees of freedom Z, θx, θy, of the reticle stage RST with respect to the projection optical system PL is adjusted. Therefore, the transfer position deviations, image blurs, etc., of pattern-transferred images due to defocus, etc., are effectively suppressed.

As described above, in the exposure apparatus 130 of the second embodiment, the main controller 50 expands and contracts individually the first rods $178_1$ to $178_6$ by using the first expansion mechanisms $194_1$ to $194_6$ composing the first parallel link mechanism 132 via the stage controller 52, thereby precisely controlling the position/attitude, in the six degrees of freedom (X, Y, Z, θx, θy, θz), of the wafer stage WST with desirable operational-characteristic and high rigidity. Because the wafer stage WST is driven by the first parallel link mechanism 132, such a driver to drive the wafer stage WST as a linear motor and a stage base (wafer base level block) to support the wafer stage WST are unnecessary. Also, it is unnecessary to provide a Z-tilt driving mechanism, etc., on the wafer stage WST. Therefore, it is possible to make the wafer stage WST small and lightweight.

In the exposure apparatus 130 of the present embodiment, the main controller 50 expands and contracts individually the second rods $179_1$ to $179_6$ by using the second expansion mechanisms $195_1$ to $195_6$ composing the second parallel link mechanism 134 via the stage controller 52, thereby precisely controlling the position/attitude, in the six degrees of freedom (X, Y, Z, θx, θy, θz), of the reticle stage RST with desirable operational-characteristics and high rigidity. Because the reticle stage RST is driven by the second parallel link mechanism 134, such a driver to drive the reticle stage WST as a linear motor and a stage base (reticle base level block) to support the reticle stage RST are unnecessary. Also, it is unnecessary to provide a Z-tilt driving mechanism, etc., on the reticle stage RST. Therefore, it is possible to make the reticle stage RST small and lightweight.

Furthermore, in the exposure apparatus 130 of the present embodiment, a supporting mechanism (140, 142, 144) supports the projection optical system PL fixed thereto on the floor surface FD where the exposure apparatus 130 is installed. Therefore, after the projection optical system PL is adjusted to take a desirable position and attitude at the initial adjustment in advance and is fixed in such a state by the supporting mechanism, the main controller 50 controls the position/attitude, in the six degrees of freedom (X, Y, Z, θx, θy, θz), of the wafer stage WST and the reticle stage RST as described above. As its result, the relative position, in six degrees of freedom, of the wafer stage WST (wafer W) with respect to the projection optical system PL and the relative position, in six degrees of freedom, of the reticle stage RST (reticle R) with respect to the projection optical system PL can be controlled. Also, the position/attitude, in six degrees of freedom, of the wafer W are measured with respect to the projection optical system PL, as reference, by the wafer interferometer system ($24Wx_1$, $24Wx_2$, 24Wy) and the focus sensor 73 that are fixed on the lens-barrel level block 144 or the projection optical system PL that are independent from the wafer stage WST and the reticle stage RST regarding vibrations. Therefore, it is possible to perform precise measurements.

In the present embodiment, because the first expansion mechanisms $194_1$ to $194_6$ and the second expansion mechanisms $195_1$ to $195_6$ each comprise an air cylinder and a shaft motor that are arranged mutually in series, the main controller 50 can drive the wafer stage WST and the reticle stage RST coarsely and by larger distances by controlling the air pressure of the air cylinder and also finely by the shaft motor. As a result, the main controller 50 can precisely adjust the positions/attitudes, in six degrees of freedom, of the wafer stage and the reticle stage, and then their relative positions with respect to the projection optical system PL in a short time.

In the present embodiment, in the same manner as the first embodiment, because the first rods $178_1$ to $178_6$ and the second rods $179_1$ to $179_6$ each comprise an air pad to support the mover of the shaft motor with respect to its stator in a non-contact manner, in controlling the expansions/contractions of the first rods $178_1$ to $178_6$ and the second rods $179_1$ to $179_6$ by expansion mechanisms, friction that works as a non-linear component can be avoided. Therefore, the positions/attitudes, in six degrees of freedom, of the wafer stage WST and the reticle stage RST can be more precisely controlled. Note that in this case, a magnetic bearing unit may be used instead of the air pad.

In the exposure apparatus 130 of the present embodiment, in the same manner as the first embodiment, much larger thrust can be generated compared with, e.g. usual linear motor, etc., and it is possible to make it smaller than a hydraulic cylinder, etc. Also, the parallel link mechanism 132, 134 of which each rod comprises an air cylinder and a shaft motor are suitable for the exposure apparatus 130 because making the exposure apparatus small and more lightweight and improving its output at the same time.

In the exposure apparatus 130 of the present embodiment, the main controller 50 statically adjusts the relative position, with respect to the projection optical system PL, of at least one of the wafer stage WST and the reticle stage RST by using air cylinders composing the first and second expansion mechanisms and can suppress vibrations by using shaft motors. In this way, it is possible to adjust the relative position, with respect to the projection optical system PL, of at least one of the wafer stage WST and the reticle stage RST and suppress vibrations caused by the expansion/contraction-drive of the rods.

The main controller 50 can suppress vibrations of low frequency by controlling the air pressure of the air cylinders composing the first and second expansion mechanisms and isolate high frequency vibrations by controlling currents to the shaft motors. Therefore, low frequency vibrations in the wafer base level block 38 and the reticle base level block 12 due to a reaction caused by the drive of each stage can be suppressed and fine vibrations from the floor surface, i.e. high frequency vibrations, can be isolated.

Furthermore, the main controller 50 can isolate high frequency vibrations by controlling currents to the shaft motors, thereby being able to isolate fine vibrations from the floor surface, i.e. high frequency vibrations.

In the exposure apparatus 130 of the present embodiment, a number of devices described above make the wafer stage WST and the reticle stage RST lightweight, improve controllability of their positions and its characteristics of suppressing vibrations of the units and isolating vibrations of the floor, and make it possible to manufacture highly integrated semiconductor devices, which have finer line widths, with high yield. Also, the exposure apparatus of the present embodiment can perform exposure with high resolution with using $F_2$ laser light or an energy beam of shorter wavelength in the atmosphere filled with a gas such as helium.

Incidentally, although the second embodiment described a case where the positions/attitudes, in six degrees of freedom, of the wafer stage WST and the reticle stage RST are controlled by the parallel link mechanisms, the present invention is not limited to this, not to mention. For example, the position/attitude, in six degrees of freedom, of only one of the wafer stage WST and the reticle stage RST may be controlled by the parallel link mechanism while the other is driven in the degrees of freedom X, Y, θz by using a linear motor, a planar motor, etc., and the position/attitude, in the degrees of freedom Z, θx, θy, of an object (wafer or reticle) mounted on the stage is controlled by a Z-leveling mechanism provided on the stage.

In another case, for at least one of the wafer stage WST and the reticle stage RST, the positions/attitudes in at least three degrees of freedom, e.g. X, Y, θz, may be controlled by the parallel link mechanisms comprising three expandable rods. In this case, a driver such as a linear motor, a stage base and the like of at least one of the wafer stage WST and the reticle stage RST are unnecessary. Note that to control the positions/attitudes in six degrees of freedom of the wafer and reticle, it is necessary to provide a mechanism (e.g., a Z-tilt driving mechanism) and the like to drive the other three degrees of freedom (e.g., Z, θx, θy) of the object (wafer or reticle) mounted on the stage.

Incidentally, although the second embodiment described a case where a supporting mechanism (140, 142, 144) supports the projection optical system PL fixed thereto on the floor surface FD, a parallel link mechanism comprising at least three expandable rods may support the projection optical system PL like the first embodiment. In this case, the initial adjustment of the projection optical system PL can be easily performed by controlling the expansion mechanism of each rod. After that, the projection optical system PL can be supported to take a desirable and fixed position/attitude by keeping the length of each rod by its expansion mechanism. Then by controlling the positions/attitudes of both the stages and adjusting the relative positions, in at least three degrees of freedom, of both the stages with respect to the projection optical system PL, the whole adjustment can be satisfactorily performed. In this case, an expansion mechanism comprising an air cylinder like the above expansion mechanisms is preferred. By such an expansion mechanism, the initial position/attitude of the projection optical system PL can be easily adjusted by adjusting the inside pressure of the air cylinder.

Furthermore, although the second embodiment described a case where the base member 136 of the first link mechanism 132 to control the position/attitude of the wafer stage WST and the base member 154 of the second link mechanism 134 to control the position/attitude of the reticle stage RST are separate, these base members may be one member. In this case, if a link mechanism supports the projection optical system PL, the base member of the link mechanism and at least one of the base member 136 and the base member 154 may be one member.

Note that the parallel link mechanisms of the first and second embodiments are examples and that parallel link mechanisms, which the exposure apparatus of the present invention can use, are not limited to those.

The exposure apparatus of the present embodiments is made by assembling various sub-systems comprising elements in the claims of the present patent application while keeping mechanical precision, electric precision, and optical precision. To ensure the precision, after and before the assembly, adjustment to achieve the optical precision is performed to its optical system; adjustment to achieve the mechanical precision is to its mechanical system, and adjustment to achieve the electric precision is to its electric system. A process of assembling various sub-systems into an exposure apparatus includes mechanical connection among the sub-systems, connection of electric circuits, and connection of tubes of air pressure circuits. Needless to say, before the process of assembling various sub-systems into an exposure apparatus, each sub-system should be assembled. After the process of assembling various sub-systems into an exposure apparatus, comprehensive adjustment is performed to ensure various kinds of precision of the whole exposure apparatus. Note that it is preferable to make an exposure apparatus in a clean room where the temperature, the degree of cleanness, and the like are controlled.

Incidentally, although the present embodiments described a case where the present invention is employed in a scanning exposure apparatus of a step-and-scan method, the present invention is not limited to that. The present invention can be suitably employed in a stationary-exposure-type such as an exposure apparatus (stepper) of a step-and-repeat method and also in an exposure apparatus of a step-and-switch method such as a mirror projection aligner.

Incidentally, although the present embodiments described a case where light, of which the wavelength is in the rang of about 120 nm to about 180 nm and belongs to vacuum ultraviolet region, $F_2$ laser light, $Kr_2$ laser light, $Ar_2$ laser, ArF excimer laser light, or the like is used as the exposure illumination light. An ultraviolet emission light (g-line, i-line, etc.) from ultra-high pressure mercury lamp, KrF excimer laser light, harmonic wave from copper vapor laser or YAG laser, or the like may be used.

Furthermore, as a vacuum ultraviolet light, ArF excimer laser light or $F_2$ laser light is used. However, a higher harmonic wave may be used which is obtained with wavelength conversion into ultraviolet by using non-linear optical crystal after amplifying a single wavelength laser light, infrared or visible, emitted from a DFB semiconductor laser device or a fiber laser by a fiber amplifier having, for example, erbium (or erbium and ytterbium) doped.

For example, considering that the oscillation wavelength of a single wavelength laser is in the range of 1.51 to 1.59 um, an eight-time-higher harmonic wave of which the wavelength is in the range of 189 to 199 nm or a ten-time-higher harmonic wave of which the wavelength is in the range of 151 to 159 nm is emitted. Especially, when the oscillation wavelength is in the range of 1.544 to 1.553 um, an eight-time-higher harmonic wave of which the wavelength is in the range of 193 to 194 nm, that is, almost the same as ArF excimer laser light (ultraviolet light) is obtained, and when the oscillation wavelength is in the range of 1.57 to 1.58 um, a ten-time-higher harmonic wave of which the wavelength is in the range of 157 to 158 nm, that is, almost the same as $F_2$ laser light (ultraviolet light) is obtained.

Furthermore, when the oscillation wavelength is in the range of 1.03 to 1.12 um, a seven-time-higher harmonic wave of which the wavelength is in the range of 147 to 160 nm is emitted, and, especially, when the oscillation wavelength is in the range of 1.099 to 1.106 um, a seven-time-higher harmonic wave of which the wavelength is in the range of 157 to 158 nm, that is, almost the same as $F_2$ laser light (ultraviolet light) is obtained. In this case, for example, ytterbium-doped fiber laser can be employed as the single wavelength laser.

Furthermore, the present invention can be applied to an scanning exposure apparatus employing EUV (Extreme Ultraviolet) light, of which the wavelength is in the range of 5 to 50 nm, as an exposure illumination light. In such an exposure apparatus using EUV light, an all-reflection-type optical system and a reflection-type reticle are employed.

Also, the present invention can be applied not only to a light exposure apparatus described above but also to an exposure apparatus using a charged particle beam such as an electron beam.

Moreover, the present invention can be applied not only to micro devices such as semiconductor devices but also to the production of reticles or masks used by a light exposure apparatus, EUV (Extreme Ultraviolet) exposure apparatus, X-ray exposure apparatus and electron beam exposure apparatus, and an exposure apparatus that transfers a circuit pattern onto a glass substrate or silicon wafer. Incidentally, in an exposure apparatus using DUV (far ultraviolet) light or VUV (vacuum ultraviolet) light, a transmission-type reticle is employed in general. And as the substrate of the reticle, quartz glass, quartz glass with fluorine doped, fluorite, magnesium fluoride, or quartz crystal is employed. And an X-ray exposure apparatus or electron beam exposure apparatus of a proximity method employs a transmission-type mask (stencil-mask, membrane-mask), and as the substrate of the mask, silicon wafer or the like is employed.

Note that the present invention can be applied not only to a wafer exposure apparatus used in the production of semiconductor devices but also to an exposure apparatus that transfers a device pattern onto a glass plate and is used in the production of displays such as liquid crystal display devices, an exposure apparatus that transfers a device pattern onto a ceramic plate and is used in the production of thin magnetic heads, and an exposure apparatus used in the production of pick-up devices (CCD, etc.).

In addition, the parallel link mechanism according to the present invention can be applied not only to an exposure apparatus but also preferably to any apparatus of which the miniaturization and lightening, and the improvement of the output are necessary and which needs to precisely control the position/attitude of a body to be driven.

A Device Manufacturing Method

The embodiment of the method of manufacturing a device by using the above exposure apparatus in lithography processes will be described next.

Figure 18:
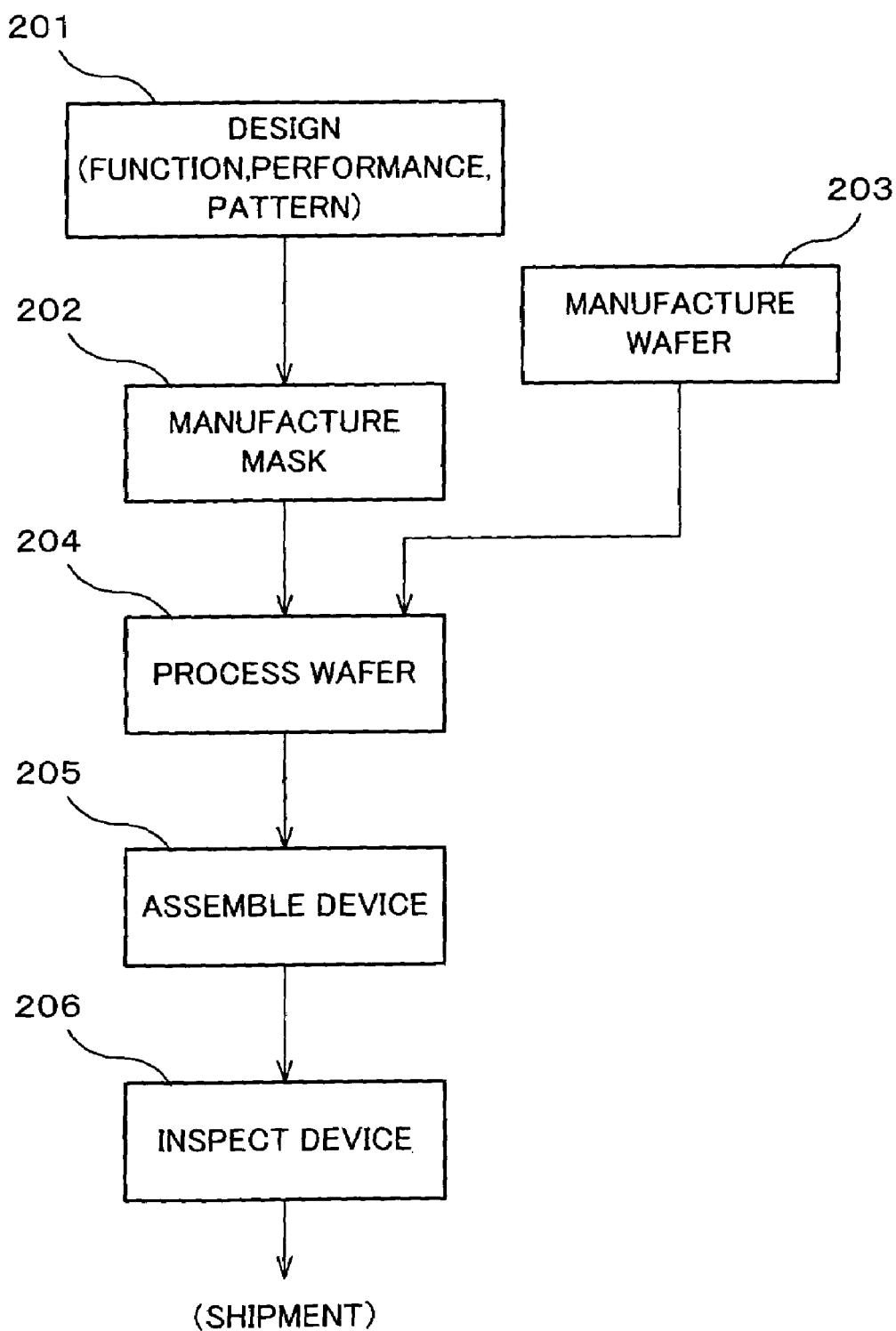
FIG. 18 is a flow chart for explaining a method of manufacturing a device using an exposure apparatus according to the present invention.

FIG. 18 is a flow chart for the manufacture of a device (a semiconductor chip such as IC or LSI, liquid crystal panel, CCD, thin magnetic head, micro machine, or the like) in this embodiment. As shown in FIG. 18, in step 201 (design step), function/performance design for a device (e.g., circuit design for a semiconductor device) is performed to perform pattern design to implement the function. In step 202 (mask manufacturing step), a mask on which the designed circuit pattern is formed is manufactured. In step 203 (wafer manufacturing step), a wafer is manufacturing by using a silicon material or the like.

In step 204 (wafer processing step), an actual circuit and the like are formed on the wafer by lithography or the like using the mask and wafer prepared in steps 201 to 203, as will be described later. In step 205 (device assembly step), a device is assembled by using the wafer processed in step 204. Step 205 includes processes such as dicing, bonding, and packaging (chip encapsulation).

Finally, in step 206 (inspection step), a test on the operation of the device, durability test, and the like are performed. After these steps, the device is completed and shipped out.

Figure 19:
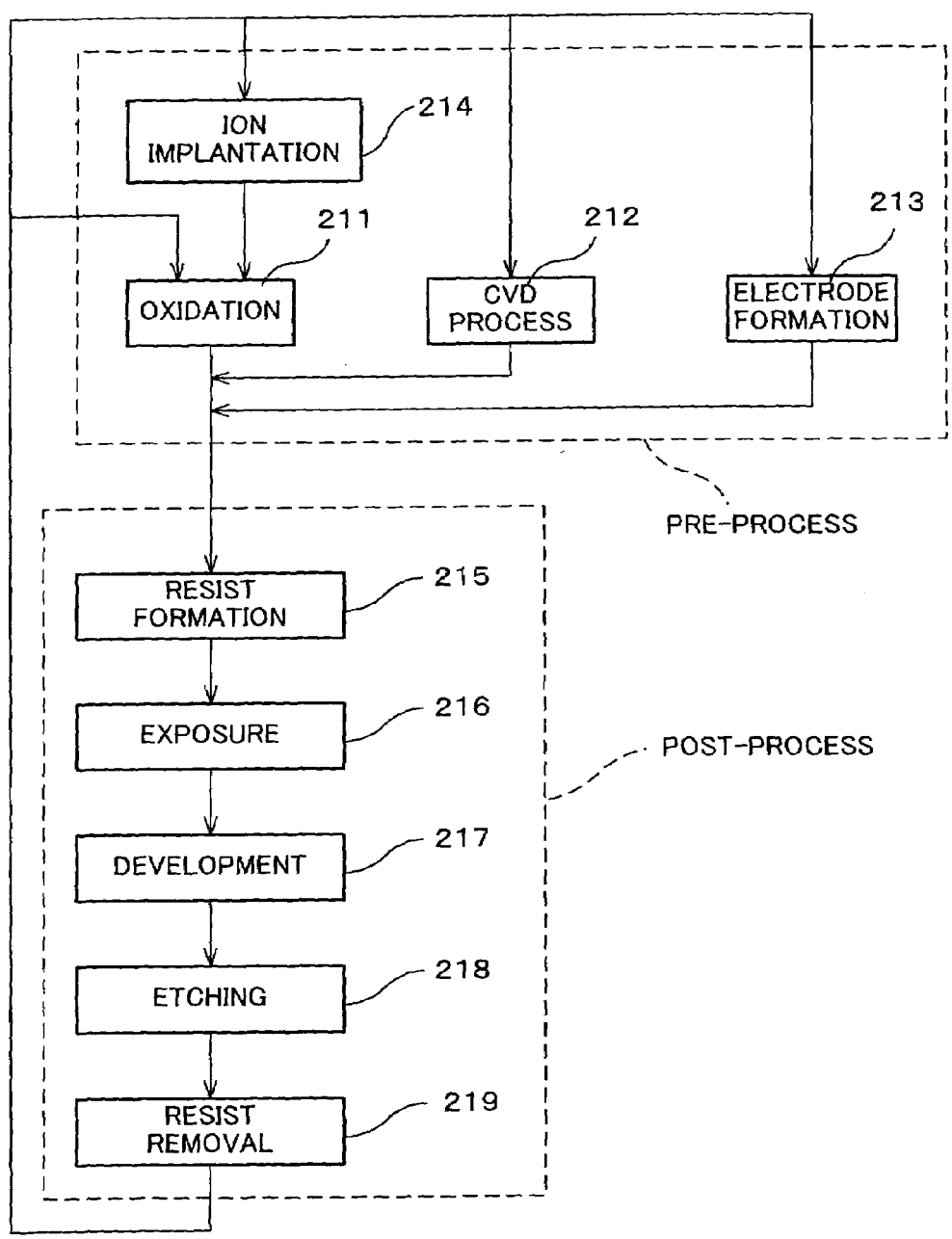
FIG. 19 is a flow chart showing the process of the wafer process step (step 204) of FIG. 18.

FIG. 19 is a flow chart showing a detailed example of step 204 described above in manufacturing the semiconductor device. Referring to FIG. 19, in step 211 (oxidation step), the surface of the wafer is oxidized. In step 212 (CVD step), an insulating film is formed on the wafer surface. In step 213 (electrode formation step), an electrode is formed on the wafer by vapor deposition. In step 214 (ion implantation step), ions are implanted into the wafer. Steps 211 to 214 described above constitute a pre-process for each step in the wafer process and are selectively executed in accordance with the processing required in each step.

When the above pre-process is completed in each step in the wafer process, a post-process is executed as follows. In this post-process, first of all, in step 215 (resist formation step), the wafer is coated with a photosensitive agent. In step 216, the circuit pattern on the mask is transferred onto the wafer by the above exposure apparatus and method. In step 217 (developing step), the exposed wafer is developed. In step 218 (etching step), an exposed member on a portion other than a portion where the resist is left is removed by etching. In step 219 (resist removing step), the unnecessary resist after the etching is removed.

By repeatedly performing these pre-process and post-process, a multiple-layer circuit pattern is formed on each shot-area of the wafer.

According to the method of manufacturing a device of the present embodiment, because exposure is performed by using an exposure apparatus 10 or 130 of the above embodiments in the exposure process (step 216) and exposure precision is improved, a highly integrated device is manufactured with high yield.

INDUSTRIAL APPLICABILITY

As has been described above, because the parallel link mechanism according to the present invention can realize the miniaturization and lightening, it is suitably applicable to an exposure apparatus. In addition, the exposure apparatus according to the present invention is suitable to precisely form a fine pattern composed of multi-layers on a substrate such as a wafer by transferring each layer. Furthermore, the method of manufacturing a device according to the present invention is suitable for manufacturing a device having a fine pattern.

What is claimed is:

1. An exposure apparatus that transfers a predetermined pattern onto a substrate, the exposure apparatus comprising:
    a projection system located between the predetermined pattern and the substrate to project the predetermined pattern to the substrate, the projection system being a reflection type projection system;
    a sensor coupled to the projection system and configured to detect a surface of the substrate;
    a first parallel link mechanism configured to support the projection system such that its attitude is controllable; and
    a controller configured to control the first parallel link mechanism to adjust an attitude of the projection system in accordance with a condition of a surface on which the exposure apparatus is disposed.

2. An exposure apparatus according to claim 1, further comprising:
    a substrate stage that holds the substrate, and
    a second parallel link mechanism that controls position/attitude, in at least three degrees of freedom, of the substrate stage.

3. An exposure apparatus according to claim 2, wherein the second parallel link mechanism comprises a first base member, at least three expandable first rods that link the first base member and the substrate stage, and first expansion mechanisms that are arranged in the respective first rods and expand/contract the respective first rods.

4. An exposure apparatus according to claim 3, wherein the second parallel link mechanism comprises six of the first rods and controls position/attitude, in six degrees of freedom, of the substrate stage by expansion/contraction of each first rod.

5. An exposure apparatus that transfers a predetermined pattern onto a substrate, the exposure apparatus comprising:
    an exposure main portion that transfers the pattern; and
    a parallel link mechanism that supports the exposure main portion such that its attitude is controllable, the parallel link mechanism comprising an air cylinder configured to move the exposure main portion coarsely and an electromagnetic linear motor configured to move the exposure main portion finely.

6. An exposure apparatus according to claim 5, wherein the exposure main portion further comprises a projection optical system that projects the pattern onto the substrate.

7. An exposure apparatus that transfers a predetermined pattern of a mask onto a substrate, the exposure apparatus comprising:
    a projection system located between the mask and the substrate and adapted to project the predetermined pattern to the substrate;
    a mask stage adapted to hold the mask;
    a support mechanism that supports the projection system; and
    a parallel link mechanism comprising three rods adapted to control a relative position, in at least three degrees of freedom, of the mask stage, the parallel link mechanism linking the mask stage and a base member different from the support mechanism.

8. An exposure apparatus according to claim 7, wherein the parallel link mechanism comprises at least three expandable rods that link the base member and the mask stage, and expansion mechanisms that are arranged in the respective rods and expand/contract the respective rods.

9. An exposure apparatus according to claim 8, wherein the parallel link mechanism comprises six of the rods and controls position/attitude, in six degrees of freedom, of the mask stage by expansion/contraction of each rod.

10. An exposure apparatus according to claim 7, wherein the parallel link mechanism comprises an air cylinder and an electromagnetic linear motor that are arranged in parallel or in series with each other.

11. An exposure apparatus according to claim 10, wherein the parallel link mechanism further comprises a bearing unit that supports a mover of the electromagnetic linear motor with respect to its stator in non-contact manner.

12. An exposure apparatus according to claim 11, wherein the bearing unit is a gas static pressure bearing unit.

13. An exposure apparatus according to claim 12, wherein the gas static pressure bearing unit comprises a differential exhaust mechanism.

14. An exposure apparatus according to claim 11, wherein the bearing unit is a magnetic bearing unit.

15. An exposure apparatus according to claim 10, the exposure apparatus further comprising:
    a substrate stage that holds the substrate; and
    a controller to statically adjust a position of at least one of the mask stage and the substrate stage by use of the air cylinder and suppress vibrations by use of the electromagnetic linear motor.

16. An exposure apparatus according to claim 5, further comprising:
    a controller to insulate high-frequency vibrations by controlling an electric current supplied to the electromagnetic linear motor.

17. An exposure apparatus according to claim 6, further comprising:
    a supporting mechanism that supports the projection optical system to be in a fixed state on a floor surface where the exposure main portion is mounted.

18. An exposure apparatus according to claim 5, wherein the exposure main portion comprises a mask stage that holds a mask on which the pattern is formed, and the parallel link mechanism controls relative position, in three degrees of freedom, of the mask stage.

19. An exposure apparatus according to claim 18, wherein the parallel link mechanism comprises a base member, at least three expandable rods that link the base member and the mask stage, and expansion mechanisms that are arranged in the respective rods and expand/contract the respective rods.

20. An exposure apparatus according to claim 19, wherein the parallel link mechanism comprises six of the rods and controls position/attitude, in six degrees of freedom, of the mask stage by expansion/contraction of each rod.

21. An exposure apparatus according to claim 5, wherein the exposure main portion comprises a substrate stage that holds the substrate and a first stage base that supports the substrate stage so as to be movable, and the parallel link mechanism controls relative position, in three degrees of freedom, of the first stage base.

22. An exposure apparatus according to claim 21, wherein the parallel link mechanism comprises a first base member, at least three expandable first rods that link the first base member and the first stage base, and first expansion mechanisms that are arranged in the respective first rods and expand/contract the respective first rods.

23. An exposure apparatus according to claim 1, further comprising:
a position detector that is fixed on the projection system and detects positional relationship, in six degrees of freedom, between the substrate and the projection system.

24. An exposure apparatus according to claim 5, wherein the exposure main portion comprises a mask stage that holds a mask, on which the pattern is formed, and a second stage base that supports the mask stage so as to be movable, and the parallel link mechanism also controls position/attitude, in three degrees of freedom, of the second stage base.

25. An exposure apparatus according to claim 24, wherein the parallel link mechanism comprises a second base member, at least three expandable second rods that link the second base member and the second stage base, and second expansion mechanisms that are arranged in the respective second rods and expand/contract the respective second rods.

26. An exposure apparatus according to claim 24, further comprising:
a controller to statically adjust a position of the first stage base by use of the air cylinder and suppress vibrations by use of the electromagnetic linear motor.

27. An exposure apparatus according to claim 5, further comprising:
a controller to suppress low-frequency vibrations by controlling air-pressure of the air cylinder and insulate high-frequency vibrations by controlling an electric current of the electromagnetic linear motor.

28. An exposure apparatus according to claim 21, wherein a plurality of stages are mounted on the first stage base.

29. An exposure apparatus according to claim 2, further comprising:
a mask stage that holds a mask, on which the pattern is formed;
a stage base that supports the mask stage so as to be movable; and
a third parallel link mechanism that controls position/attitude, in three degrees of freedom, of the stage base.

30. An exposure apparatus according to claim 5, further comprising:
a chamber that houses at least one part of the exposure main portion to be sealed from the outside atmosphere and so as for its attitude to be allowed to change.

31. An exposure apparatus according to claim 30, further comprising:
a vacuum exhaust system and a gas supply system to purge non-active gas into the chamber.

32. A method of making an exposure apparatus to transfer a pattern of a mask onto a substrate, comprising the steps of:
providing a mask stage adapted to hold the mask;
providing a projection optical system adapted to project a pattern of the mask onto a substrate;
providing a substrate stage adapted to hold the substrate;
providing a first parallel link mechanism that supports the projection optical system such that an attitude of the projection optical system is controllable; and
providing a second parallel link mechanism that supports at least one of the mask stage and the substrate stage such that relative position, in at least three degrees of freedom, of at least one of the mask stage and the substrate stage with respect to the projection optical system is controllable, the second parallel link mechanism being isolated from the first parallel link mechanism.

33. A method of making an exposure apparatus to transfer a pattern of a mask onto a substrate, comprising the steps of:
providing a mask stage adapted to hold the mask;
providing a projection optical system adapted to project a pattern of the mask onto a substrate;
providing a substrate stage adapted to hold the substrate;
providing a first parallel link mechanism that supports the substrate stage, the first parallel link mechanism being connected to a first base member; and
providing a second parallel link mechanism that supports the mask stage, the second parallel link mechanism being connected to a second base member different from the first base member, the second base member being larger than the first base member.

34. A method of manufacturing a device with a lithography process, wherein in the lithography process, exposure is performed using an exposure apparatus according to claim 1.

35. An exposure apparatus according to claim 1, wherein the projection system optically projects the predetermined pattern.

36. A method according to claim 33, wherein the first parallel link mechanism supports the substrate stage via a substrate stage base that supports the substrate stage to be movable, and the second parallel link mechanism supports the mask stage via a mask stage base that supports the mask stage to be movable.

37. A method according to claim 32, wherein the projection optical system is a reflection type projection optical system.

38. A method according to claim 33, wherein the projection optical system is a reflection type projection optical system.

39. An exposure apparatus that transfers a predetermined pattern onto a substrate, the exposure apparatus comprising:
a projection system located between the predetermined pattern and the substrate to project the predetermined pattern to the substrate;
a sensor coupled to the projection system and configured to detect a surface of the substrate;
a first parallel link mechanism comprising a plurality of rods configured to support the projection system such that an attitude of the projection system is controllable, the rods connected to an outer portion of the projection system; and a controller configured to control the first parallel link mechanism to adjust an attitude of the projection system in accordance with a condition of a surface on which the exposure apparatus is disposed.

40. An exposure apparatus according to claim 39, wherein the parallel link mechanism supports the projection system from a floor side.

41. An exposure apparatus according to claim 39, wherein the three rods extend in non-parallel directions.

42. An exposure apparatus according to claim 1, wherein the projection system comprises a flange disposed above the sensor.

43. An exposure apparatus according to claim 1, wherein the sensor comprises an alignment sensor.

44. An exposure apparatus according to claim 1, wherein the sensor comprises an autofocus sensor.

45. An exposure apparatus according to claim 39, wherein the projection system comprises a flange disposed above the sensor.

46. An exposure apparatus according to claim 39, wherein the sensor comprises an alignment sensor.

47. An exposure apparatus according to claim 39, wherein the sensor comprises an autofocus sensor.

48. An exposure apparatus according to claim 1, wherein the first parallel link mechanism comprises three rods configured to support the projection system.

49. An exposure apparatus according to claim 39, wherein the first parallel link mechanism comprises three rods configured to support the projection system.

50. An exposure apparatus according to claim 1, wherein the controller is configured to control the first parallel link mechanism in accordance with a profile of a floor on which the exposure apparatus is disposed.

51. An exposure apparatus according to claim 1, wherein the controller is configured to control the first parallel link mechanism in accordance with a deformation of a floor on which the exposure apparatus is disposed.

52. An exposure apparatus according to claim 39, wherein the controller is configured to control the first parallel link mechanism in accordance with a profile of a floor on which the exposure apparatus is disposed.

53. An exposure apparatus according to claim 39, wherein the controller is configured to control the first parallel link mechanism in accordance with a deformation of a floor on which the exposure apparatus is disposed.

* * * * *